US009292584B1

(12) United States Patent
Sharangpani

(10) Patent No.: US 9,292,584 B1
(45) Date of Patent: *Mar. 22, 2016

(54) EFFICIENT DATA COMMUNICATION BASED ON LOSSLESS REDUCTION OF DATA BY DERIVING DATA FROM PRIME DATA ELEMENTS RESIDENT IN A CONTENT-ASSOCIATIVE SIEVE

(71) Applicant: Ascava, Inc., Los Altos Hills, CA (US)

(72) Inventor: Harshvardhan Sharangpani, Los Altos Hills, CA (US)

(73) Assignee: ASCAVA, INC., Los Altos Hills, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/685,191

(22) Filed: Apr. 13, 2015

Related U.S. Application Data

(60) Provisional application No. 62/097,070, filed on Dec. 27, 2014.

(51) Int. Cl.
*H03M 7/30* (2006.01)
*G06F 17/30* (2006.01)

(52) U.S. Cl.
CPC .... *G06F 17/30569* (2013.01); *G06F 17/30374* (2013.01); *G06F 17/30873* (2013.01)

(58) Field of Classification Search
CPC .................. G06F 17/30569; G06F 17/30374; G06F 17/30873; G06F 11/1451; G06F 11/1453; G06F 11/1461; G06F 17/30303; G06F 17/30578; G06F 17/30581; G06F 2201/84; G06F 3/0617; G06F 3/065; G06F 3/0683; G06F 17/30153; G06F 8/427; G06F 9/4453; H03M 7/30; H03M 7/40
USPC ............ 341/87, 51, 50, 67, 65, 106; 711/162; 709/213; 707/640, 697
See application file for complete search history.

(56) References Cited

U.S. PATENT DOCUMENTS

| | | | | |
|---|---|---|---|---|
| 7,885,988 B2 * | 2/2011 | Bashyam | ................ | H03M 7/30 707/812 |
| 8,522,125 B1 * | 8/2013 | Feng | ................... | H03M 13/293 714/801 |
| 8,694,703 B2 * | 4/2014 | Hans | ..................... | G06F 3/0613 707/797 |
| 8,868,505 B1 * | 10/2014 | Jayanthi | ................. | G06F 11/00 707/640 |
| 2013/0339471 A1 * | 12/2013 | Bhargava | .......... | G06F 17/30581 709/213 |
| 2013/0339643 A1 * | 12/2013 | Tekade | .............. | G06F 17/30581 711/162 |

* cited by examiner

*Primary Examiner* — Jean B Jeanglaude
(74) *Attorney, Agent, or Firm* — Park, Vaughan, Fleming & Dowler LLP; Laxman Sahasrabuddhe

(57) ABSTRACT

Data communication techniques and systems that are based on lossless data reduction on large and extremely large datasets and that provide high rates of data ingestion and data retrieval are described. Some embodiments can generate a losslessly reduced representation of a data chunk, wherein the losslessly reduced representation includes a reference to one or more prime data elements stored in a prime data store, and optionally a description of a reconstitution program which, when applied to the one or more prime data elements results in the data chunk. The losslessly reduced representation of the data chunk can then be communicated to another computer over a network.

25 Claims, 37 Drawing Sheets

FIG. 1D : Sample Specification for Format of the Reduced Output Data

| Field name | Size | Description | Encodings |
|---|---|---|---|
| Record type | 3 bits | | 0: Prime Data Element<br>1: Derivative with Single element reconstitution (RP inline)<br>2: Derivative with Single element reconstitution (RP in prime data store)<br>3: Derivative with Single element reconstitution (RP in RP store)<br>4: Derivative with Multi element reconstitution (RP inline)<br>5: Derivative with Multi element reconstitution (RP in prime data store)<br>6: Derivative with Multi element reconstitution (RP in RP store)<br>7: Reserved<br><br>Note: RP = Reconstitution Program |
| Reference size | 3 bits | Size of reference in bytes to Prime Data Element or Reconstitution Program | Encoded as (size-1). 0=1 byte, 1=2 bytes,…7=8 bytes |
| Extra element count | 2 bits | For *Multi element Reconstitution* only: Number of extra elements | Encoded as (count-1). 0=1 element… 3=4 elements |
| Element reference(s) | (Reference size) | References for default Prime Data Element and any extra Prime Data Elements | Element reference |
| Reconstitution Program reference | (Reference size) | For *Reconstitution Program* in *Prime Data Store* or *Reconstitution Program store* only. Reference to Reconstitution Program. | Reconstitution Program reference |
| Reconstitution Program (RP) | Variable | For *Reconstitution Program inline* only: Reconstitution program | See FIG. 7A |

Example 1: Duplicate of Prime Data Element:
| Record type:0 | Reference size: 5 (6 bytes) | Element Reference: 6 bytes |

Example 2: Single Prime Data Element reconstitution, RP inline (13 bytes):
| Record type:1 | Reference size: 5 (6 bytes) | Element Reference: 6 bytes | Reconstitution_Program: 13 bytes of data |

Example 3: Multi Prime Data Element Reconstitution, 2 Prime Data Elements, RP in Element Store:
| Record type:5 | Reference size: 5 (6 bytes) | Element Reference: 6 bytes | Element Reference: 6 bytes | RP Reference: 6 bytes |

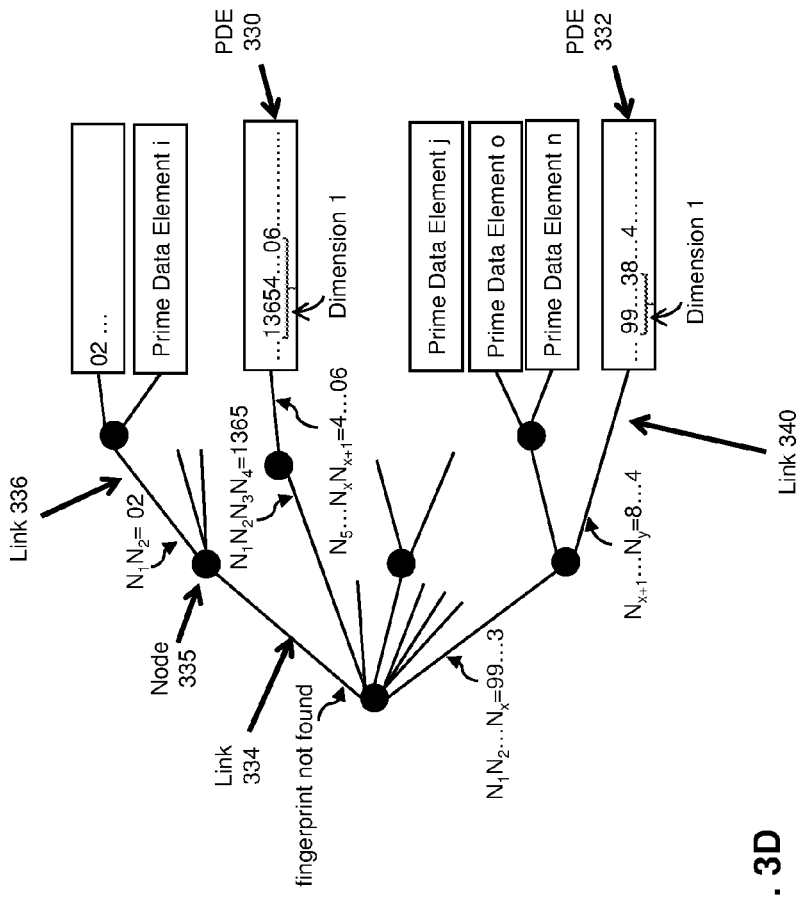
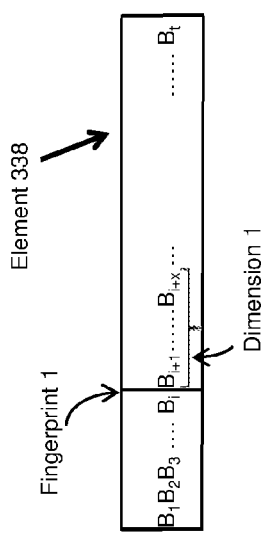
FIG. 3D

FIG. 3F

| Path Info | | | |
|---|---|---|---|
| Number Of Children | N | | |
| Child ID | Number of differentiating bytes | Differentiating byte values | Reference to child node |
| 0 | 6 | abef12d6743a | node 27 |
| 1 | 2 | dcfa | node 16 |
| ... | ... | ... | ... |
| N | 4 | 83231929 | node 4198 |

FIG. 3G

| Path Info | Number Of Children N | | | | |
|---|---|---|---|---|---|
| Child ID | Number of differentiating bytes | Differentiating byte values | Reference to Prime Data Element | Count of Duplicates & Derivatives | Other Metadata for Prime Data Element |
| 0 | 1 | f7 | elem 76 | 4 | <...> |
| 1 | 0 | -- | elem 4718 | 7 | <...> |
| ... | ... | ... | ... | ... | ... |
| N | 4 | 654aed21 | elem 786 | 12 | <...> |

FIG. 3H

| Path Info | | | | | | |
|---|---|---|---|---|---|---|
| Number Of Children | N | | | | | |
| Child ID | Number of differentiating bytes | Differentiating byte values | Reference to Prime Data Element | Navigation Lookahead bytes | Count of Duplicates & Derivatives | Other Metadata for Prime Data Element |
| 0 | 1 | f7 | elem 76 | 13476231 | 4 | <...> |
| 1 | 0 | -- | elem 4718 | 00337650 | 7 | <...> |
| ... | ... | ... | ... | 4530988f | ... | ... |
| N | 4 | 654aed21 | elem 786 | ed189721 | 12 | <...> |

*b8ac83d9dc7caf18f2f2e3f783a0ec69774bb50bbe1d3ef1ef8a82436ec43283*
*bc1c0f6a82e19c224b22f9b2*ac83d9619ae5571ad2bbcc15d3e493eef62054b0
5b2dbccce933483a6d3daab3cb19567dedbe33e952a966c49f3297191cf22aa3
1b98b9dcd0fb54a7f761415e*fc5572e8aef212eb21fba09e2aaf9b324cd6ca9b*
*993ef678dbeb51b4a43b294491b0*46093f9c44605fb4ee5cc194bb12c31f954f
5b2ddd65dc4003a55412aa409190d1b91907d693cd33c7109415ec31daa9a378
*2262d3caec40627aae7a544df689255136576b6460fa54eb7321ba8e18c1f211*
360c9eff00feaa95a399dc8528c57a76359b95b445f2762b991269cc431d771c
0f4a7991a466899884b1cbb3a414437134a001321da462897cc3361c0dd8ce33
*d3630fe7434d9a32baa9f914c6ccbb5767f5a96389a0863731ed017919f95b35*
*ece4f3*46093f9d44605f1486e6596dc4313b471261411d08ac8a5111668ae0e3
1e479672707ad2c8b657256563b8*af466e39aa122c717ca0042ffdda90c09244*
*918dac17b6793f5abbdb4326bbdb4326da12cebef5b8*ac83d961889381ed4b02
ec62703f3a6b5da4081519dd55b0e8471ffd7a51dec5d33f22664955d9a26ec4
89ad2e41*d3630fe79c64f5e6916e84d8193b00c9a9e429028ca91bdbf5ad63b1*
*4e1a904884b1cbb364f3cf5a58b7dd5b*cb24796fb97d09f5fad3630fe730c0d3

FIG. 5A

FIG. 7A Example of instruction encodings for operations used by Reconstitution Program

| Operation | Opcode | Operands |
|---|---|---|
| insert | 0 | original offset, insert length, insert data ('length' bytes) |
| delete | 1 | original offset, length |
| replace | 2 | original offset, replace data (1 byte) |
| bulk replace | 3 | original offset, length, replace data ('length' bytes) |
| append | 4 | length, append data ('length' bytes) |
| multiply | 5 | original offset, product length, multiplier length, multiplier value |
| add | 6 | original offset, sum length, addend length, addend value |
| extension opcode | 7 | see extension operation table |

| Extension operation | Opcode | Scope | Operations and operands |
|---|---|---|---|
| arithmetic | 0 | single PDE | operation, original offset, operation length, operator length, operator |
| multi-element replace (replace with data from a 2nd element) | 1 | multiple PDEs | 2nd element handle, 2nd element offset, original offset, replace length |
| multi-element insert (insert data from a 2nd element) | 2 | multiple PDEs | 2nd element handle, 2nd element offset, original offset, insert length |
| Call & Execute Prime Reconstitution Program inline (fetch Reconstitution Program from specified address, and execute on single Prime Data Element) | 3 | single PDE | Reference to Called Prime Reconstitution Program |
| Fetch, Modify, & Execute Prime Reconstitution Program (fetch Reconstitution Program from specified address, apply operations in subsequent window to derive new Reconstitution program, and then execute it) | 4 | reconstitution program | Reference to Prime Reconstitution Program, Window |
| reserved | 5-7 | reserved | Reserved |

| Field type | Field size |
|---|---|
| opcode or operation | 3 bits |
| offset | 5 bits |
| length | 5 bits |
| reference | 24 bits |
| handle | 2 bits |

Note: PDE = Prime Data Element

```
bc1c0f6a82e19c224b22f9b2ac83d9619ae5571ad2bbcc15d3e493eef62054b0  : chunk 1
fc29344c742bb3e45c197e6559125553bd07ab2a91e9d3d2a3feddd3ed2d442b6  : chunk 2
993ef678dbeb51b4a43b294491b046093f9d44605fb4ee5cc194bb12c31f954f  : chunk 3
65bc3565a3d9457b656eb3b4a72da8302ec5fb8dc7eeb77c577de08d2b46d3f4  : chunk 4
2262d3caec40627aae7a544df6892551365 76b6460fa54eb7321ba8e18c1f211  : chunk 5
0f4a7991a4668998 84b1d3630fe79c64f5e601321da462897cc3361c0dd8ce33  : chunk 6
1e479672707ad2c8b65725 6563b8af466e39aa122c717ca0042ffdda90c09244  : chunk 7
918dac17b6793f5abbdb4326bbdb4326da12cebef5b8ac83d961889381ed4b02  : chunk 8
ec62703f3a6b5da4081519dd55b0e8471ffd7a51dec5d33f22664955d9a26ec4  : chunk 9
89ad2e3ad3630fe79c64f5e6916e84d8193b00c9a9e429028ca91bdbf5ad63b1  : chunk 10
~~~~~~~~~~~~~~~~ 42 million chunks in between ~~~~~~~~~~~~~~~~~~ ec62703f3a6b5da4081519dd55b0e8471ffd7a51dec5d33f22664955d9a26ec4  : chunk 42,000,011
bc1c0f6a82790ce19c224b22f9b2ac83d9619ae5571ad2bbec152054b0aeb712  : chunk 42,000,012
67b289ad2e41d3630fe79c64f5e6916e84d8193b00c9a9e429028ca91bdbf5ad  : chunk 42,000,013
0f4a7991a4668998 84b1d3630fe79c64f5e6916e84d8193b00c9a9e429028ca9  : chunk 42,000,014
```

FIG. 8B

| element:chunk: | MSBs of Name | :elements with *first*, *second* & *third* dimensions of Name highlighted |
|---|---|---|
| 1 : 2 | :12553b1e9d197e | :fc29344c742bb3e45c197e655912553bd07ab2a91e9d3d2a3feddd3ed2d442b6 : |
| 2 : 3 | :46093f44460b4a4 | :993ef678dbeb51b4a43b294491b046093f9d44605fb4ee5cc194b12c31f954f : |
| 3 : 5 | :544df63657<u>7aae</u> | :2262d3caec40627<u>aae</u>7a544df68925513576b6460fa54eb7321ba8e18c1f211 : |
| 4 : 4 | :6eb3b42ec565a3 | :65bc3565a3d9457b656eb3b4a72da8302ec5fb8dc7eeb77c577de08d2b46d3f4 : |
| 5 : 9 | :703f3a19dd6b5d | :ec62703f3a6b5da4081519dd55b0e8471ffd7a51decbd33f22664955d9a26ec4 : |
| 6 : 8 | :ac83d98893432<u>6</u> | :918dac17b6793f5abbdb432<u>6</u>bbdb4326da12cebef5b8ac83d961889381ed4b02 : |
| 7 : 1 | :ac83d9cc1582e1 | :bc1c0f6a82e19c224b22f9b2ac83d9619ae5571ad2bbcc15d3e493eef62054b0 : |
| 8 : 7 | :af466e717c7ad2 | :1e479672707<u>ad</u>2c8b6572565563b8af466e39aa122c717ca0042ffdda90c09244 : |
| 9 : 6 | :d3630fa462899<u>8</u> | :0f4a7991a466899<u>8</u>84b1d3630fe79c64f5e601321da462897cc3361c0dd8ce33 : |
| 10 : 10 | :d3630fe69189<u>ad</u> | :89<u>ad</u>2e3<u>ad</u>d3630fe79c64f5e6916e84d8193b00c9a9e429028ca91bdbf5ad63b1 : |

FIG. 8C

| Element | :chunk: | MSBs of Name : elements with first, second & third dimensions of Name highlighted |
|---|---|---|
| 1 | 2 | :12553b1e9d197e:fc29344c742bb3e45c197e655912553bd07ab2a91e9c3d2a3fedd3ed2d442b6 : |
| 2 | 3 | :46093f4460b4a4:993ef678dbeb51b4a43b294491b046093f9d44605fb4ee5cc194bb12c31f954f : |
| ... | ... | Numerous elements installed |
| 13,143 | 5 | :544df636577aae:2262d3caec4062aae7a544df6892551365766460fa54eb7321ba8e18c1f211 : |
| 13,144 | 4 | :6eb3b42ec565a3:65bc3565a3d9457b656eb3b4a72da8302ec5fb8dc7eeb77c577de08c2b46d3f4 : |
| ... | ... | Numerous elements installed |
| 24,789 | 9 | :703f3a19dd6b5d:ec62703f3a0b5da40815l9cd55b0e8471ffd7a51dec5d33f22664955c9a26ec4 : |
| ... | ... | Numerous elements installed |
| 187,125 | 8 | :ac83d988934326:918cac17b6793f5abbdb4326bbdb4326da12cebef5b8ac83d961889381ed4b02 : |
| 187,126 | 1 | :ac83d9cc1582e1:bc1c0f6a82e19c224b22f9b2ac83d9619ae5571ad2bbcc15d3e493eef62054b0 : |
| ... | ... | Numerous elements installed |
| 1,247,565 | 7 | :af466e717c7ad2:1e479672707ad2c8b657256563b8af466e39aa122c717ca0042ffdda90c09244 : |
| ... | ... | Numerous elements installed |
| 9,299,997 | 6 | :d3630fa4628998:0f4a7991a466899884b1d3630fe79c64f5e601321da462897cc3361c0dd8ce33 : |
| 9,299,998 | 10 | :d3630fe69189ad:89ad2e3ad3630fe79c64f5e6916e84d8193b00c9a9e429028ca91bdbf5ad63b1 : |
| ... | ... | . |
| 16,000,010 | | . . . . . . element 16,000,010 |

FIG. 8D

Chunk 42,000,011:

ec62703f3a6h5da408151*9dd*55b0e8471ffc7a51dec5c33f22664955d9a26ec4

Chunk 42,000,012:

bc1c0f6a82790ce19c224b22f9b2ac83d9619ae5571ad2bbec152054b0aeb783

Derive vs element 187,125:

918dac17b6793f5abbdb4326da12cebef5b8ac83d961889381ed4b02~~~~~~~~~~~~~~~~~~~~~~~
bc1c0f6a790c82e19c224b22f9b2~~~~~~~~~~~~~ac83d9619ae5571ad2bbec152054b0aeb783
<replace 14 bytes at original offset 0, bc1c0f6a790c82e19c224b22f9b2>
<delete 8 bytes at original offset14>
<replace 6 bytes at original offset 18, 9ae5571ad2bb>
<insert 8 bytes at original offset 24, ec152054b0aeb783>

Derive vs element 187,126:

bc1c0f6a_82~~~~~e19c224b22f9b2ac83d9619ae5571ad2bbcc15c3e493eef620054b0
bc1c0f6a82790ce19c224b22f9b2ac83d9619ae5571ad2bbec15~~~~~~~~~~~~~2054b0aeb712
<insert 2 bytes at original offset 4, 790c>
<replace 1 byte at original offset 22, ec>
<delete 5 bytes at original offset 24>
<append 3 bytes at end of accumulated bytes, aeb783>

FIG. 8E

Chunk 42,000,013:

```
67b289ad2e3ad3630fe79c64f5e6916e84d8193b00c9a9e429028ca91bdbf5ad
```

Derive vs element 9,299,998:

```
~~~89ad2e3ad3630fe79c64f5e6916e84d8193b00c9a9e429028ca91bdbf5ad63b1
67b289ad2e3ad3630fe79c64f5e6916e84d8193b00c9a9e429028ca91bdbf5ad
     <insert 2 bytes at original offset 0, 67b2>
```

Chunk 42,000,014:

```
0f4a7991a466899884b1d3630fe79c64f5e6916e84d8193b00c9a9e429028ca9
```

Derive vs elements 9,299,997 and 9,299,998:

```
0f4a7991a466899884b1d3630fe79c64f5e60132lda462897cc3361c0dd8ce33
           89ad2e3ad3630fe79c64f5e6916e84d8193b00c9a9e429028ca91bdbf5ad63b1

0f4a7991a466899884b1d3630fe79c64f5e6916e84d8193b00c9a9e429028ca9

(start with element 9,299,997)
<multi-element insert, element 9,299,998, original offset 13,
       2nd element offset 7, length 19>
```

```
b8ac83d9dc7caf18f2f2e3f783a0ec69774bb50bbe1d3ef1ef8a82436ec43283
bc1c0f6a82e19c224b22f9b2ac83d9619ae5571ad2bbcc15d3e493eef62054b0
5b2dbcce933483a6d3daab3cb19567dedbe33e952a966c49f3297191cf22aa3
1b98b9dcd0fb54a7f76l415efc5572e8aef212eb21fba09e2aaf9b324cd6ca9b
993ef678dbeb51b4a43b294491b0360c9eff00feaa95a399dc8528c57a76359b
95b445f2762b991269cc431d771c0f4a7991a466899884b1cbb3a41437134a0
01321da462897cc3361c0dd8ce33d3630fe7434d9a32baa9f914c6ccbb5767f5
A96389a0863731ed017919f95b35ece4f3ac83d961889381ed4b02ec62703f3a
6b5da4081519dd55b0e8471fffd7a51dec5d33f2264955d9a26ec489ad2e41d3
630fe79c64f5e6916e84d8193b00c9a9e429028ca91bdbf5ad63b14e1a904884
B1cbb364f3cf5a58b7dd5bac83d96188a7b6781a02ec62709fecf32b654003f7
fd3d6a5a2f9deda4b3c4f11c80a11bafbd4307da64d487653a21e4
```

FIG. 9A

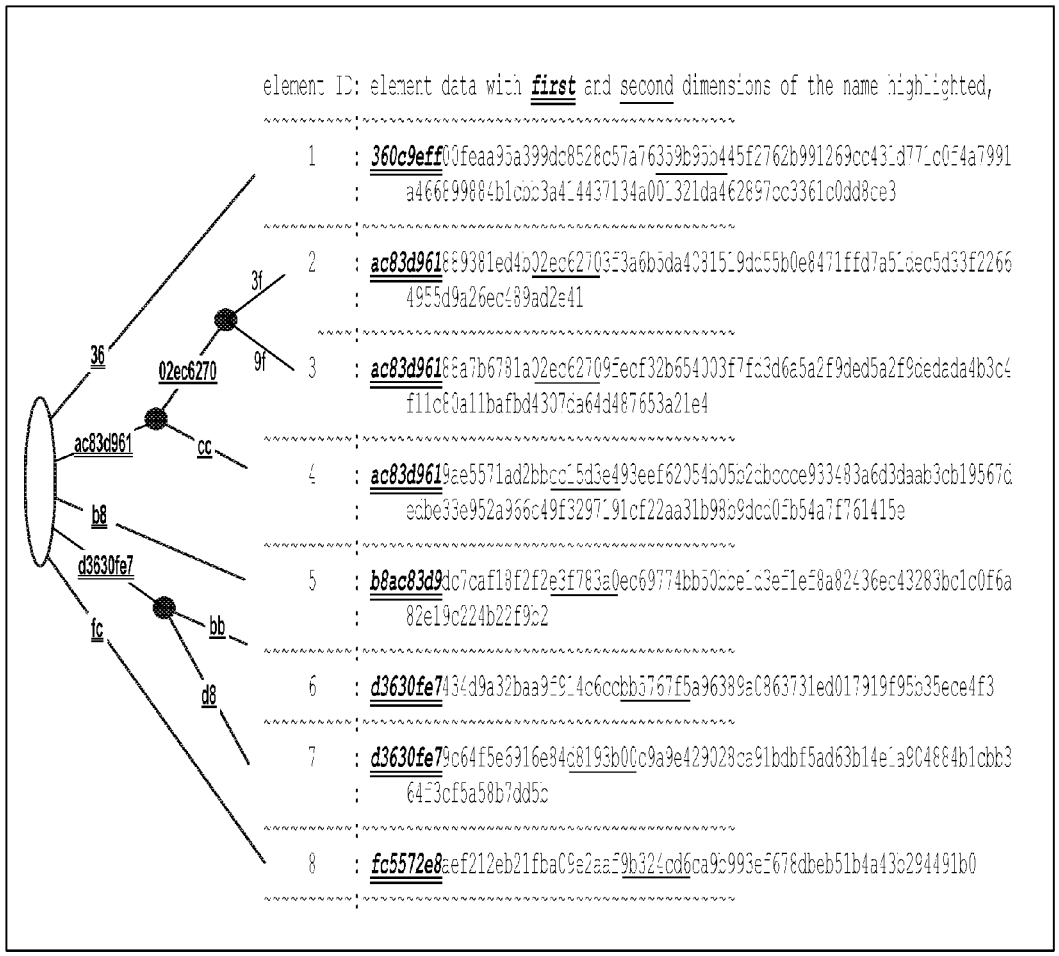
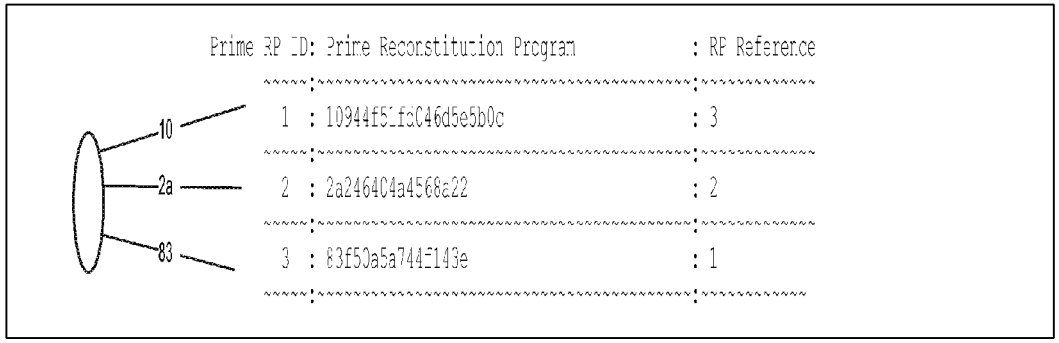
FIG. 9B

55-byte candidate element: ac83d96198a7b6781a02ec62707aec132b654076231a03f76a5a2f3ded5a2f9dedada4b3c4f11c80a11bafbd4307da64d487653a21e4

```
replace @13, 7a;           : 010 001101 0111 1010
delete  @19, 4 bytes;      : 0C1 010011 000100
insert  @19, 5 bytes, 76231a03f76a;  : 000 010011 000101 0111 0101 0010 0111 0301 1010 03C0 0011 1111 0111 0010 1010
```
RP

Encoded Reconstitution Program RP: 46bd14c4098aea4e3407eed4

12-byte RP
46bd14c4098aea4e3407eed4
inserted into RP Store

```
Prime RP ID: Prime Reconstitution Program   : RP Reference
         1  : 10944f51fd046d5e5b0c          : 3
         2  : 2a246404a4568a22              : 2
         3  : 46bd14c4098aea4e3407eed4      : 4
         4  : 83f50a5a744f143e              : 1
```

12-byte RP
46bd14c4098aea4e3407eed4
searched in RP Store

```
Prime RP ID: Prime Reconstitution Program   : RP Reference
         1  : 10944f51fd046d5e5b0c          : 3
         2  : 2a246404a4568a22              : 2
         3  : 46bd14c4098aea4e3407eed4      : 4
         4  : 7a0e73da80                    : 6
         5  : 83f50a5a744f143e              : 1
         6  : 90a7f84ba5bf031c6029fe12e96fc0c718 : 5
```

Reconstitution Program:

```
<insert 2 bytes at original offset 4, 790c>
<replace 1 byte at original offset 22, ec>
<delete 5 bytes at original offset 24>
<append 3 bytes at end of accumulated bytes, aeb783>
```

Element 187,126:

```
bc1c0f6a82e19c224b22f9b2ac83d9619ae5571ad2bbcc15d3e493eef62054b0
```

Execution of the Reconstitution Program:

```
<insert 2 bytes at original offset 4, 790c>
→ bc1c0f6a790c82e19c224b22f9b2ac83d9619ae5571ad2bbcc15d3e493eef62054b0

<replace 1 byte at original offset 22, ec>
→ bc1c0f6a790c82e19c224b22f9b2ac83d9619ae5571ad2bbec15d3e493eef62054b0

<delete 5 bytes at original offset 24>
→ bc1c0f6a790c82e19c224b22f9b2ac83d9619ae5571ad2bbec15d3e493eef62054b0

<append 3 bytes at end of accumulated bytes, aeb783>
→ bc1c0f6a790c82e19c224b22f9b2ac83d9619ae5571ad2bbec152054b0aeb783
```

Chunk 42,000,012:

```
bc1c0f6a790c82e19c224b22f9b2ac83d9619ae5571ad2bbec152054b0aeb783
```

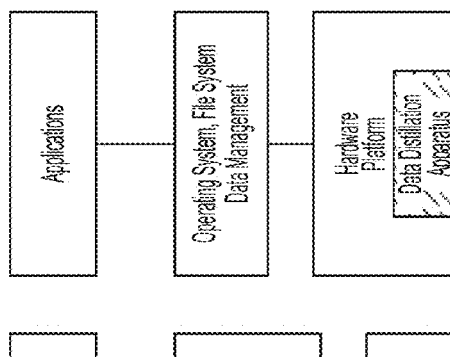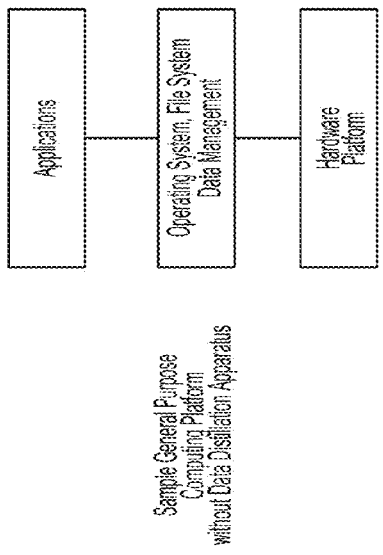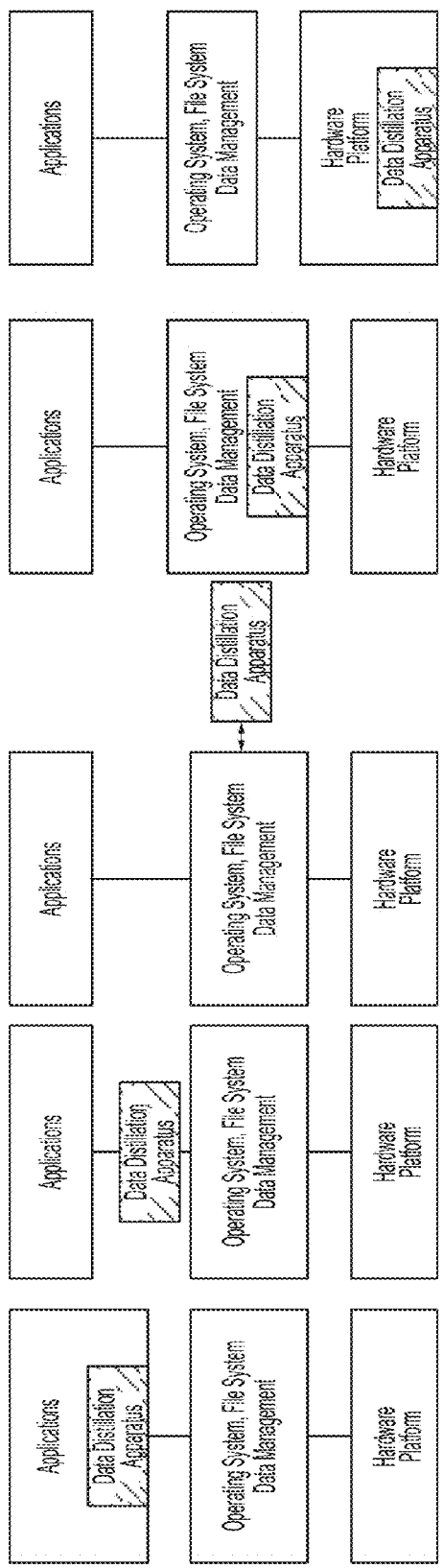
FIG. 11A FIG. 11B FIG. 11C FIG. 11D FIG. 11E FIG. 11F

EFFICIENT DATA COMMUNICATION BASED ON LOSSLESS REDUCTION OF DATA BY DERIVING DATA FROM PRIME DATA ELEMENTS RESIDENT IN A CONTENT-ASSOCIATIVE SIEVE

RELATED APPLICATION

This application claims benefit of U.S. Provisional Application Ser. No. 62/097,070, by the same inventor, filed on 27 Dec. 2014, the contents of which are herein incorporated by reference in their entirety for all purposes.

The subject matter of this application is related to the subject matter in a co-pending non-provisional application by the same inventor, entitled "LOSSLESS REDUCTION OF DATA BY DERIVING DATA FROM PRIME DATA ELEMENTS RESIDENT IN A CONTENT-ASSOCIATIVE SIEVE," filed on the same day as the instant application, having Ser. No. 14/685,199.

BACKGROUND

1. Technical Field

This disclosure relates to data storage, retrieval, and communication. More specifically, this disclosure relates to efficient data communication based on lossless reduction of data using a content-associative sieve.

2. Related Art

The modern information age is marked by the creation, capture, and analysis of enormous amounts of data. New data is generated from diverse sources, examples of which include purchase transaction records, corporate and government records and communications, email, social media posts, digital pictures and videos, machine logs, signals from embedded devices, digital sensors, cellular phone global positioning satellites, space satellites, scientific computing, and the grand challenge sciences. Data is generated in diverse formats, and much of it is unstructured and unsuited for entry into traditional databases. Businesses, governments, and individuals generate data at an unprecedented rate and struggle to store, analyze, and communicate this data. Tens of billions of dollars are spent annually on purchases of storage systems to hold the accumulating data. Similarly large amounts are spent on computer systems to process the data.

In most modern computer and storage systems, data is accommodated and deployed across multiple tiers of storage, organized as a storage hierarchy. The data that is needed to be accessed often and quickly is placed in the fastest albeit most expensive tier, while the bulk of the data (including copies for backup) is preferably stored in the densest and cheapest storage medium. The fastest and most expensive tier of data storage is the computer system's volatile random access memory or RAM, residing in close proximity to the microprocessor core, and offering the lowest latency and the highest bandwidth for random access of data. Progressively denser and cheaper but slower tiers (with progressively higher latency and lower bandwidth of random access) include non-volatile solid state memory or flash storage, hard disk drives (HDDs), and finally tape drives.

In order to more effectively store and process the growing data, the computer industry continues to make improvements to the density and speed of the data storage medium and to the processing power of computers. However, the increase in the volume of data far outstrips the improvement in capacity and density of the computing and data storage systems. Statistics from the data storage industry in 2014 reveal that new data created and captured in the past couple of years comprises a majority of the data ever captured in the world. The amount of data created in the world to date is estimated to exceed multiple zettabytes (a zettabyte is $10^{21}$ bytes). The massive increase in the data places great demands on data storage, computing, and communication systems that must store, process, and communicate this data reliably. This motivates the increased use of lossless data reduction or compression techniques to compact the data so that it can be stored at reduced cost, and likewise processed and communicated efficiently.

A variety of lossless data reduction or compression techniques have emerged and evolved over the years. These techniques examine the data to look for some form of redundancy in the data and exploit that redundancy to realize a reduction of the data footprint without any loss of information. For a given technique that looks to exploit a specific form of redundancy in the data, the degree of data reduction achieved depends upon how frequently that specific form of redundancy is found in the data. It is desirable that a data reduction technique be able to flexibly discover and exploit any available redundancy in the data. Since data originates from a wide variety of sources and environments and in a variety of formats, there is great interest in the development and adoption of universal lossless data reduction techniques to handle this diverse data. A universal data reduction technique is one which requires no prior knowledge of the input data other than the alphabet; hence, it can be applied generally to any and all data without needing to know beforehand the structure and statistical distribution characteristics of the data.

Goodness metrics that can be used to compare different implementations of data compression techniques include the degree of data reduction achieved on the target datasets, the efficiency with which the compression or reduction is achieved, and the efficiency with which the data is decompressed and retrieved for further use. The efficiency metrics assess the performance and cost-effectiveness of the solution. Performance metrics include the throughput or ingest rate at which new data can be consumed and reduced, the latency or time required to reduce the input data, the throughput or rate at which the data can be decompressed and retrieved, and the latency or time required to decompress and retrieve the data. Cost metrics include the cost of any dedicated hardware components required, such as the microprocessor cores or the microprocessor utilization (central processing unit utilization), the amount of dedicated scratch memory and memory bandwidth, as well as the number of accesses and bandwidth required from the various tiers of storage that hold the data. Note that reducing the footprint of the data while simultaneously providing efficient and speedy compression as well as decompression and retrieval has the benefit not only of reducing the overall cost to store and communicate the data but also of efficiently enabling subsequent processing of the data.

Many of the universal data compression techniques currently being used in the industry derive from the Lempel-Ziv compression method developed in 1977 by Abraham Lempel and Jacob Ziv—see e.g., Jacob Ziv and Abraham Lempel, "A Universal Algorithm for Sequential Data Compression," *IEEE transactions on information theory*, Vol. IT-23, No. 3, May 1977. This method became the basis for enabling efficient data transmission via the Internet. The Lempel-Ziv methods (named LZ77, LZ78 and their variants) reduce the data footprint by replacing repeated occurrences of a string with a reference to a previous occurrence seen within a sliding window of a sequentially presented input data stream. On consuming a fresh string from a given block of data from the input data stream, these techniques search through all strings previously seen within the current and previous blocks up to the length of the window. If the fresh string is a duplicate, it is replaced by a backward reference to the original string. If the number of bytes eliminated by the duplicate string is larger than the number of bytes required for the backward reference, a reduction of the data has been achieved. To search through all strings seen in the window, and to provide maximal string matching, implementations of these techniques employ a variety of schemes, including iterative scanning and building a temporary bookkeeping structure that contains a dictionary of all the strings seen in the window. Upon consuming new bytes of input to assemble a fresh string, these techniques either scan through all the bytes in the existing window, or make references to the dictionary of strings (followed by some computation) to decide whether a duplicate has been found and to replace it with a backward reference (or, alternatively, to decide whether an addition needs to be made to the dictionary).

The Lempel-Ziv compression method is often accompanied by a second optimization applied to the data, in which source symbols are dynamically re-encoded based upon their frequency or probability of occurrence in the data block being compressed, often employing a variable-width encoding scheme so that shorter length codes are used for the more frequent symbols, thus leading to a reduction of the data. For example, see David A. Huffman, "A Method for the Construction of Minimum-Redundancy Codes," *Proceedings of the IRE—Institute of Radio Engineers*, September 1952, pp. 1098-1101. This technique is referred to as Huffman re-encoding, and typically needs a first pass through the data to compute the frequencies and a second pass to actually encode the data. Several variations along this theme are also in use.

One example that uses these techniques is a scheme known as "Deflate" which combines the Lempel-Ziv LZ77 compression method with Huffman re-encoding. Deflate provides a compressed stream data format specification that specifies a method for representing a sequence of bytes as a (usually shorter) sequence of bits, and a method for packing the latter bit sequences into bytes. The Deflate scheme was originally designed by Phillip W. Katz of PKWARE, Inc. for the PKZIP archiving utility. See e.g., "String searcher, and compressor using same," Phillip W. Katz, U.S. Pat. No. 5,051,745, Sep. 24, 1991. U.S. Pat. No. 5,051,745 describes a method for searching a vector of symbols (the window) for a predetermined target string (the input string). The solution employs a pointer array with a pointer to each of the symbols in the window, and uses a method of hashing to filter the possible locations in the window that are required to be searched for an identical copy of the input string. This is followed by scanning and string matching at those locations.

The Deflate scheme is implemented in the zlib library for data compression. Zlib is a software library that is a key component of several software platforms such as Linux, Mac OS X, iOS, and a variety of gaming consoles. The zlib library provides Deflate compression and decompression code for use by zip (file archiving), gzip (single file compression), png (Portable Network Graphics format for losslessly compressed images), and many other applications. Zlib is now widely used for data transmission and storage. Most HTTP transactions by servers and browsers compress and decompress the data using zlib. Similar implementations are increasingly being used by data storage systems.

A paper entitled "High Performance ZLIB Compression on Intel® Architecture Processors," that was published by Intel Corp. in April 2014 characterizes the compression and performance of an optimized version of the zlib library running on a contemporary Intel processor (Core I7 4770 processor, 3.4 GHz, 8 MB cache) and operating upon the Calgary corpus of data. The Deflate format used in zlib sets the minimum string length for matching to be 3 characters, the maximum length of the match to be 256 characters, and the size of the window to be 32 kilobytes. The implementation provides controls for 9 levels of optimization, with level 9 providing the highest compression but using the most computation and performing the most exhaustive matching of strings, and level 1 being the fastest level and employing greedy string matching. The paper reports a compression ratio of 51% using the zlib level 1 (fastest level) using a single-threaded processor and spending an average of 17.66 clocks/byte of input data. At a clock frequency of 3.4 GHz, this implies an ingest rate of 192 MB/sec while using up a single microprocessor core. The report also describes how the performance rapidly drops to an ingest rate of 38 MB/sec (average of 88.1 clocks/byte) using optimization level 6 for a modest gain in compression, and to an ingest rate of 16 MB/sec (average of 209.5 clocks/byte) using optimization level 9.

Existing data compression solutions typically operate at ingest rates ranging from 10 MB/sec to 200 MB/sec using a single processor core on contemporary microprocessors. To further boost the ingest rate, multiple cores are employed, or the window size is reduced. Even further improvements to the ingest rate are achieved using custom hardware accelerators, albeit at increased cost.

Existing data compression methods described above are effective at exploiting fine-grained redundancy at the level of short strings and symbols in a local window typically the size of a single message or file or perhaps a few files. These methods have serious limitations and drawbacks when they are used in applications that operate on large or extremely large datasets and that require high rates of data ingestion and data retrieval.

One important limitation is that practical implementations of these methods can exploit redundancy efficiently only within a local window. While these implementations can accept arbitrarily long input streams of data, efficiency dictates that a limit be placed on the size of the window across which fine-grained redundancy is to be discovered. These methods are highly compute-intensive and need frequent and speedy access to all the data in the window. String matching and lookups of the various bookkeeping structures are triggered upon consuming each fresh byte (or few bytes) of input data that creates a fresh input string. In order to achieve desired ingest rates, the window and associated machinery for string matching must reside mostly in the processor cache subsystem, which in practice places a constraint on the window size.

For example, to achieve an ingest rate of 200 MB/sec on a single processor core, the available time budget on average per ingested byte (inclusive of all data accesses and compute) is 5 ns., which means 17 clocks using a contemporary processor with operating frequency of 3.4 GHz. This budget accommodates accesses to on-chip caches (which take a handful of cycles) followed by some string matching. Current processors have on-chip caches of several megabytes of capacity. An access to main memory takes over 200 cycles (~70 ns.), so larger windows residing mostly in memory will further slow the ingest rate. Also, as the window size increases, and the distance to a duplicate string increases, so does the cost to specify the length of backward references, thus encouraging only longer strings to be searched across the wider scope for duplication.

On most contemporary data storage systems, the footprint of the data stored across the various tiers of the storage hierarchy is several orders of magnitude larger than the memory capacity in the system. For example, while a system could provide hundreds of gigabytes of memory, the data footprint of the active data residing in flash storage could be in the tens of terabytes, and the total data in the storage system could be in the range of hundreds of terabytes to multiple petabytes. Also, the achievable throughput of data accesses to subsequent tiers of storage drops by an order of magnitude or more for each successive tier. When the sliding window gets so large that it can no longer fit in memory, these techniques get throttled by the significantly lower bandwidth and higher latency of random IO (Input or Output operations) access to the next levels of data storage.

For example, consider a file or a page of 4 kilobytes of incoming data that can be assembled from existing data by making references to, say, 100 strings of average length of 40 bytes that already exist in the data and are spread across a 256 terabyte footprint. Each reference would cost 6 bytes to specify its address and 1 byte for string length while promising to save 40 bytes. Although the page described in this example can be compressed by more than fivefold, the ingest rate for this page would be limited by the 100 or more IO accesses to the storage system needed to fetch and verify the 100 duplicate strings (even if one could perfectly and cheaply predict where these strings reside). A storage system that offers 250,000 random IO accesses/sec (which means bandwidth of 1 GB/sec of random accesses to pages of 4 KB) could compress only 2,500 such pages of 4 KB size per second for an ingest rate of a mere 10 MB/sec while using up all the bandwidth of the storage system, rendering it unavailable as a storage system.

Implementations of conventional compression methods with large window sizes of the order of terabytes or petabytes will be starved by the reduced bandwidth of data access to the storage system, and would be unacceptably slow. Hence, practical implementations of these techniques efficiently discover and exploit redundancy only if it exists locally, on window sizes that fit in the processor cache or system memory. If redundant data is separated either spatially or temporally from incoming data by multiple terabytes, petabytes, or exabytes, these implementations will be unable to discover the redundancy at acceptable speeds, being limited by storage access bandwidth.

Another limitation of conventional methods is that they are not suited for random access of data. Blocks of data spanning the entire window that was compressed need to be decompressed before any chunk within any block can be accessed. This places a practical limit on the size of the window. Yet another limitation of conventional methods (and, in particular, Lempel-Ziv based methods) is that they search for redundancy only along one dimension—that of replacing identical strings by backward references. A limitation of the Huffman re-encoding scheme is that it needs two passes through the data, to calculate frequencies and then re-encode. This becomes slow on larger blocks.

Data compression methods that detect long duplicate strings across a global store of data often use a combination of digital fingerprinting and hashing schemes. This compression process is referred to as data deduplication. The most basic technique of data deduplication breaks up files into fixed-sized blocks and looks for duplicate blocks across the data repository. If a copy of a file is created, each block in the first file will have a duplicate in the second file and the duplicate can be replaced with a reference to the original block. To speed up matching of potentially duplicate blocks, a method of hashing is employed. A hash function is a function that converts a string into a numeric value, called its hash value. If two strings are equal, their hash values are also equal. Hash functions map multiple strings to a given hash value, whereby long strings can be reduced to a hash value of much shorter length. Matching of the hash values will be much faster than matching of two long strings; hence, matching of the hash values is done first, to filter possible strings that might be duplicates. If the hash value of the input string or block matches a hash value of strings or blocks that exist in the repository, the input string can then be compared with each string in the repository that has the same hash value to confirm the existence of the duplicate.

Breaking up a file into fixed-sized blocks is simple and convenient, and fixed-sized blocks are highly desirable in a high-performance storage system. However, this technique has limitations in the amount of redundancy it can uncover, which means that these techniques have low levels of compression. For example, if a copy of a first file is made to create a second file, and if even a single byte of data is inserted into the second file, the alignment of all downstream blocks will change, the hash value of each new block will be computed afresh, and the data deduplication method will no longer find all the duplicates.

To address this limitation in data deduplication methods, the industry has adopted the use of fingerprinting to synchronize and align data streams at locations of matching content. This latter scheme leads to variable-sized blocks based on the fingerprints. Michael Rabin showed how randomly chosen irreducible polynomials can be used to fingerprint a bit-string—see e.g., Michael O. Rabin, "Fingerprinting by Random Polynomials," *Center for Research in Computing Technology*, Harvard University, TR-15-81, 1981. In this scheme, a randomly chosen prime number p is used to fingerprint a long character-string by computing the residue of that string viewed as a large integer modulo p. This scheme requires performing integer arithmetic on k-bit integers, where $k=\log_2$ (p). Alternatively, a random irreducible prime polynomial of order k can be used, and the fingerprint is then the polynomial representation of the data modulo the prime polynomial.

This method of fingerprinting is used in data deduplication systems to identify suitable locations at which to establish chunk boundaries, so that the system can look for duplicates of these chunks in a global repository. Chunk boundaries can be set upon finding fingerprints of specific values. As an example of such usage, a fingerprint can be calculated for each and every 48-byte string in the input data (starting at the first byte of the input and then at every successive byte thereafter), by employing a polynomial of order 32 or lower. One can then examine the lower 13 bits of the 32-bit fingerprint, and set a breakpoint whenever the value of those 13 bits is a pre-specified value (e.g., the value 1). For random data, the likelihood of the 13 bits having that particular value would be 1 in $2^{13}$, so that such a breakpoint is likely to be encountered approximately once every 8 KB, leading to variable-sized chunks of average size 8 KB. The breakpoints or chunk boundaries will effectively be aligned to fingerprints that depend upon the content of the data. When no fingerprint is found for a long stretch, a breakpoint can be forced at some pre-specified threshold, so that the system is certain to create chunks that are shorter than a pre-specified size for the repository. See e.g., Athicha Muthitacharoen, Benjie Chen, and David Mazières, "A Low-bandwidth Network File System," SOSP '01, Proceedings of the eighteenth ACM symposium on Operating Systems Principles, Oct. 21, 2001, pp. 174-187.

The Rabin-Karp string matching technique developed by Michael Rabin and Richard Karp provided further improvements to the efficiency of fingerprinting and string matching (see e.g., Michael O. Rabin and R. Karp, "Efficient Randomized Pattern-Matching Algorithms," *IBM Jour. of Res. and Dev.*, vol. 31, 1987, pp. 249-260). Note that a fingerprinting method that examines an m byte substring for its fingerprint can evaluate the fingerprinting polynomial function in O(m) time. Since this method would need to be applied on the substring starting at every byte of the, say, n byte input stream, the total effort required to perform fingerprinting on the entire data stream would be O(n×m). Rabin-Karp identified a hash function referred to as a Rolling Hash on which it is possible to compute the hash value of the next substring from the previous one by doing only a constant number of operations, independently of the length of the substring. Hence, after shifting one byte to the right, the computation of the fingerprint on the new m byte string can be done incrementally. This reduces the effort to compute the fingerprint to O(1), and the total effort for fingerprinting the entire data stream to O(n), linear with the size of the data. This greatly speeds up computation and identification of the fingerprints.

Typical data access and computational requirements for the above-described data deduplication methods can be described as follows. For a given input, once fingerprinting is completed to create a chunk, and after the hash value for the chunk is computed, these methods first need one set of accesses to memory and subsequent tiers of storage to search and look up the global hash table that keeps the hash values of all chunks in the repository. This would typically need a first IO access to storage. Upon a match in the hash table, this is followed by a second set of storage IOs (typically one, but could be more than one depending upon how many chunks with the same hash value exist in the repository) to fetch the actual data chunks bearing the same hash value. Lastly, byte-by-byte matching is performed to compare the input chunk to the fetched potentially matching chunks to confirm and identify the duplicate. This is followed by a third storage IO access (to the metadata space) for replacing the new duplicate block with a reference to the original. If there is no match in the global hash table (or if no duplicate is found), the system needs one IO to enter the new block into the repository and another IO to update the global hash table to enter in the new hash value. Thus, for large datasets (where the metadata and global hash table do not fit in memory, and hence need a storage IO to access them) such systems could need an average of three IOs per input chunk. Further improvements are possible by employing a variety of filters so that misses in the global hash table can often be detected without requiring the first storage IO to access the global hash table, thus reducing the number of IOs needed to process some of the chunks down to two.

A storage system that offers 250,000 random IO accesses/sec (which means bandwidth of 1 GB/sec of random accesses to pages of 4 KB) could ingest and deduplicate about 83,333 (250,000 divided by 3 IOs per input chunk) input chunks of average size 4 KB per second, enabling an ingest rate of 333 MB/sec while using up all the bandwidth of the storage system. If only half of the bandwidth of the storage system is used (so that the other half is available for accesses to the stored data), such a deduplication system could still deliver ingest rates of 166 MB/sec. These ingest rates (which are limited by I/O bandwidth) are achievable provided that sufficient processing power is available in the system. Thus, given sufficient processing power, data deduplication systems are able to find large duplicates of data across the global scope of the data with an economy of IOs and deliver data reduction at ingest rates in the hundreds of megabytes per second on contemporary storage systems.

Based on the above description, it should be clear that, while these deduplication methods are effective at finding duplicates of long strings across a global scope, they are effective mainly at finding large duplicates. If there are variations or modifications to the data at a finer grain, the available redundancy will not be found using this method. This greatly reduces the breadth of datasets across which these methods are useful. These methods have found use in certain data storage systems and applications, e.g., regular backup of data, where the new data being backed up has only a few files modified and the rest are all duplicates of the files that were saved in the previous backup. Likewise, data deduplication based systems are often deployed in environments where multiple exact copies of the data or code are made, such as in virtualized environments in datacenters. However, as data evolves and is modified more generally or at a finer grain, data deduplication based techniques lose their effectiveness.

Some approaches (usually employed in data backup applications) do not perform the actual byte-by-byte comparison between the input data and the string whose hash value matches that of the input. Such solutions rely on the low probability of a collision using strong hash functions like the SHA-1. However, due to the finite non-zero probability of a collision (where multiple different strings could map to the same hash value), such methods cannot be considered to provide lossless data reduction, and would not, therefore, meet the high data-integrity requirements of primary storage and communication.

Some approaches combine multiple existing data compression techniques. Typically, in such a setup, the global data deduplication methods are applied to the data first. Subsequently, on the deduplicated dataset, and employing a small window, the Lempel-Ziv string compression methods combined with Huffman re-encoding are applied to achieve further data reduction.

However, in spite of employing all hitherto-known techniques, there continues to be a gap of several orders of magnitude between the needs of the growing and accumulating data and what the world economy can affordably accommodate using the best available modern storage systems. Given the extraordinary requirements of storage capacity demanded by the growing data, there continues to be a need for improved ways to further reduce the footprint of the data. There continues to be a need to develop methods that address the limitations of existing techniques, or that exploit available redundancy in the data along dimensions that have not been addressed by existing techniques. At the same time, it continues to be important to be able to efficiently access and retrieve the data at an acceptable speed and at an acceptable cost of processing.

In summary, there continues to be a long-felt need for lossless data reduction solutions that can exploit redundancy across large and extremely large datasets and provide high rates of data ingestion and data retrieval.

SUMMARY

Embodiments described herein feature techniques and systems that can perform efficient data communication based on lossless data reduction on large and extremely large datasets while providing high rates of data ingestion and data retrieval, and that do not suffer from the drawbacks and limitations of existing data compression systems.

Specifically, some embodiments can identify one or more prime data elements based on a data chunk, wherein said identifying comprises using contents of the data chunk to navigate through a data structure that organizes prime data elements based on the contents of the prime data elements. Next, the embodiments can determine a reconstitution program based on the data chunk and the identified one or more prime data elements such that the data chunk can be reconstituted by applying the reconstitution program to the one or more prime data elements. The embodiments can then generate a losslessly reduced representation of the data chunk, wherein the losslessly reduced representation includes a reference to each prime data element in the identified one or more prime data elements and a description of the reconstitution program. Next, the losslessly reduced representation of the data chunk can be sent (e.g., over one or more communication channels and/or networks) to another computer. The other computer can then install the data structure that organizes the prime data elements based on their contents (e.g., the other computer can receive the data structure via one or more communication channels and/or networks and install the data structure upon receipt), and generate the data chunk based on the losslessly reduced representation of the data chunk.

BRIEF DESCRIPTION OF THE FIGURES

FIG. 1D presents an example of a format and a specification describing the structure of the Reduced Output Data in accordance with some embodiments described herein.

FIGS. 3A, 3B, 3C, 3D, and 3E illustrate different data organization systems that may be used to organize Prime Data Elements based on their Name in accordance with some embodiments described herein.

FIG. 3F presents a self-describing tree node data structure in accordance with some embodiments described herein.

FIG. 3G presents a self-describing leaf node data structure in accordance with some embodiments described herein.

FIG. 3H presents a self-describing leaf node data structure that includes the Navigation Lookahead field in accordance with some embodiments described herein.

FIGS. 5A-5C illustrate an actual example of how data can be organized using embodiments described herein.

FIG. 7A provides an example of the transformations that could be specified in the Reconstitution Program in accordance with some embodiments described herein.

FIG. 7B shows examples of the results of Candidate Elements being derived from Prime Data Elements in accordance with some embodiments described herein.

FIGS. 8A-8E illustrate how data reduction can be performed by factorizing input data into fixed sized elements and organizing the elements in a tree data structure that was described in reference to FIGS. 3D and 3E in accordance with some embodiments described herein.

FIGS. 9A-9C illustrate an example of the Data Distillation™ scheme based on the system shown in FIG. 1C in accordance with some embodiments described herein.

FIG. 10A provides an example of how transformations specified in the Reconstitution Program are applied to a Prime Data Element to yield a Derivative Element in accordance with some embodiments described herein.

FIG. 11A-11G illustrate systems that include a Data Distillation™ mechanism (which can be implemented using software, hardware, or a combination thereof) in accordance with some embodiments described herein.

DETAILED DESCRIPTION

Figure 1A:
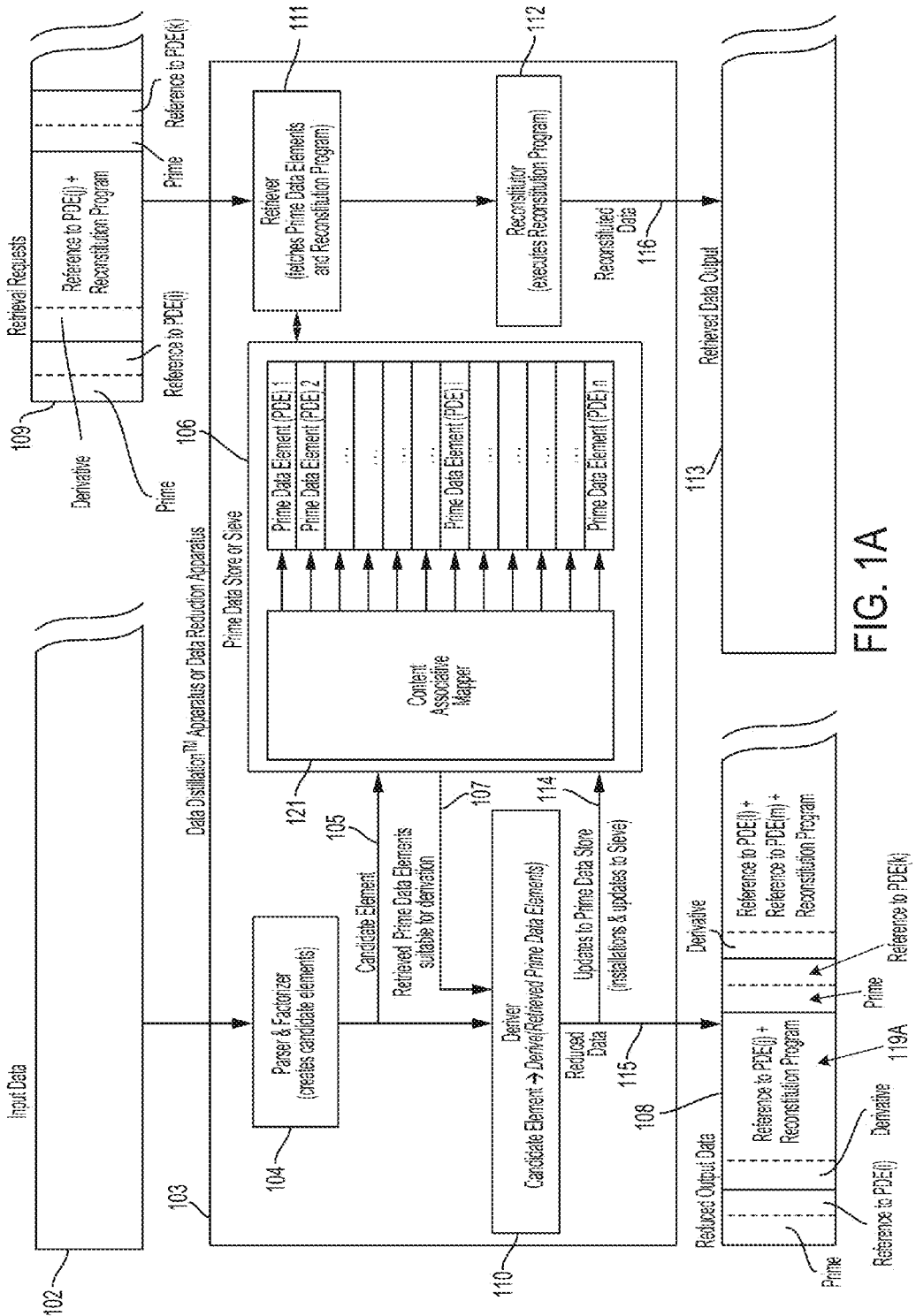
FIG. 1A illustrates methods and apparatuses for data reduction that factorize input data into elements and derive these from Prime Data Elements resident in a Prime Data Store in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein. In this disclosure, when a phrase uses the term "and/or" with a set of entities, the phrase covers all possible combinations of the set of entities unless specified otherwise. For example, the phrase "X, Y, and/or Z" covers the following seven combinations: "X only," "Y only," "Z only," "X and Y, but not Z," "X and Z, but not Y," "Y and Z, but not X," and "X, Y, and Z."

Efficient Lossless Reduction of Data Using a Content-Associative Sieve

In some embodiments described herein, data is organized and stored to efficiently uncover and exploit redundancy globally across the entire dataset. An input data stream is broken up into constituent pieces or chunks called elements, and redundancy among the elements is detected and exploited at a grain finer than the element itself, thus reducing the overall footprint of stored data. A set of elements called Prime Data Elements are identified and used as common and shared building blocks for the dataset, and stored in a structure referred to as the Prime Data Store or Sieve. A Prime Data Element is simply a sequence of bits, bytes, or digits of a certain size. Prime Data Elements can be either fixed-sized or variable-sized, depending upon the implementation. Other constituent elements of the input data are derived from Prime Data Elements and are referred to as Derivative Elements. Thus, input data is factorized into Prime Data Elements and Derivative Elements. The Prime Data Store orders and organizes the Prime Data Elements so that the Prime Data Store can be searched and accessed in a content-associative manner. Given some input content, with some restrictions, the Prime Data Store can be queried to retrieve Prime Data Elements containing that content. Given an input element, the Prime Data Store can be searched, using the value of the element, or the values of certain fields in the element, to quickly provide either one or a small set of Prime Data Elements from which the input element can be derived with minimal storage required to specify the derivation. In some embodiments, the elements in the Prime Data Store are organized in tree form. A Derivative Element is derived from a Prime Data Element by performing transformations on it, such transformations being specified in a Reconstitution Program, which describes how to generate the Derivative Element from one or more Prime Data Elements. A Distance Threshold specifies a limit on the size of the stored footprint of a Derivative Element. This threshold effectively specifies the maximum allowable distance of Derivative Elements from Prime Data Elements, and also places a limit on the size of the Reconstitution Program that can be used to generate a Derivative Element. Retrieval of derivative data is accomplished by executing the Reconstitution Program on the one or more Prime Data Elements specified by the derivation.

In this disclosure, the above-described universal lossless data reduction technique may be referred to as a Data Distillation™ process. It performs a function similar to distillation in chemistry—separating a mixture into its constituent elements. The Prime Data Store is also referred to as the Sieve or the Data Distillation™ Sieve.

The universal lossless data reduction technique described in this disclosure receives an input data stream and converts it into the combination of a reduced output data stream and a Prime Data Store, such that the sum of the footprints of the reduced output data stream and the Prime Data Store is usually smaller than the footprint of the input data stream. In this disclosure, the following terms are used interchangeably: "reduced output data stream," "reduced data stream," "Reduced Data," "distilled data stream," and "Distilled Data."

FIG. 1A illustrates methods and apparatuses for data reduction that factorize input data into elements and derive these from Prime Data Elements resident in a Prime Data Store in accordance with some embodiments described herein. This figure illustrates an overall block diagram of the data reduction or Data Distillation™ methods and apparatuses and provides an overview of the functional components, structures, and operations. The components and/or operations illustrated in FIG. 1A may be realized using software, hardware, or a combination thereof.

A sequence of bytes is received from an input data stream and presented as Input Data 102 to Data Reduction Apparatus 103, also referred to as the Data Distillation™ Apparatus. Parser & Factorizer 104 parses the incoming data and breaks it into chunks or candidate elements. The Factorizer decides where in the input stream to insert breaks to slice up the stream into candidate elements. Once two consecutive breaks in the data have been identified, a Candidate Element 105 is created by the Parser and Factorizer and presented to Prime Data Store 106, also referred to as the Data Distillation™ Sieve.

Data Distillation™ Sieve or Prime Data Store 106 contains all the Prime Data Elements, and orders and organizes them based upon their value or content. The Sieve provides support for two kinds of access. First, each of the Prime Data Elements can be directly accessed via a reference to the location where the Prime Data Element resides in the Sieve. Second, elements can be accessed in a content-associative manner by using content-associative mapper 121, which could be implemented in software, hardware, or a combination thereof. This second form of access to the Sieve is an important feature that is used by the disclosed embodiments either to identify a Prime Data Element that exactly matches a Candidate Element 105, or to identify Prime Data Elements from which the candidate element can be derived. Specifically, given a candidate element, e.g., Candidate Element 105, the Prime Data Store 106 can be searched (based upon the value of the Candidate Element 105, or based upon the value of certain fields in the Candidate Element 105), to quickly provide one or a small set of Prime Data Elements 107 from which the candidate element can be derived with minimal storage needed to specify the derivation.

The Sieve or Prime Data Store 106 can be initialized with a set of Prime Data Elements whose values are spread across the data space. Alternatively, the Sieve can start out empty, and Prime Data Elements can be added to it dynamically as data is ingested, in accordance with the Data Distillation™ process described herein in reference to FIGS. 1A-C and FIG. 2.

Deriver 110 receives the Candidate Element 105 and the retrieved Prime Data Elements suitable for derivation 107 (which are content associatively retrieved from the Prime Data Store 106), determines whether or not the Candidate Element 105 can be derived from one or more of these Prime Data Elements, generates Reduced Data 115, and provides updates 114 to the Prime Data Store. If the candidate element is a duplicate of a retrieved Prime Data Element, the Deriver places into the Reduced Output Data 108 a reference (or pointer) to the Prime Data Element located in the Prime Data Store, and also an indicator that this is a Prime Data Element. If no duplicate is found, the Deriver expresses the candidate element as the result of one or more transformations performed on one or more retrieved Prime Data Elements, where the sequence of transformations is collectively referred to as the Reconstitution Program, e.g., Reconstitution Program 119A. Each derivation may require its own unique program to be constructed by the Deriver. The Reconstitution Program specifies transformations such as insertions, deletions, replacements, arithmetic, and logical operations that can be applied to the Prime Data Elements. Provided the footprint of the Derivative Element (calculated as the size of the Reconstitution Program plus the size of the references to the required Prime Data Elements) is within a certain specified Distance Threshold with respect to the candidate element (to enable data reduction), the candidate element is reformulated and replaced by the combination of the Reconstitution Program and references to the relevant Prime Data Element (or elements). If the threshold is exceeded, or if no suitable Prime Data Element was retrieved from the Prime Data Store, the Prime Data Store may be instructed to install the candidate as a fresh Prime Data Element. In this case, the Deriver places into the reduced output data a reference to the newly added Prime Data Element, and also an indicator that this is a Prime Data Element.

A request for Retrieval of data (e.g., Retrieval Requests 109) can be in the form of either a reference to a location in the Prime Data Store containing a Prime Data Element, or in the case of a derivative, a combination of such a reference to a Prime Data Element and an associated Reconstitution Program (or in the case of a derivative based on multiple Prime Data Elements, a combination of the references to multiple Prime Data Elements and an associated Reconstitution Program). Using the one or more references to Prime Data Elements in the Prime Data Store, Retriever 111 can access the Prime Data Store to fetch the one or more Prime Data Elements and provide the one or more Prime Data Elements as well as the Reconstitution Program to Reconstitutor 112, which executes the transformations (specified in the Reconstitution Program) on the one or more Prime Data Elements to generate the Reconstituted Data 116 (which is the data that was requested) and deliver it to the Retrieved Data Output 113 in response to the data retrieval request.

Figure 1B:
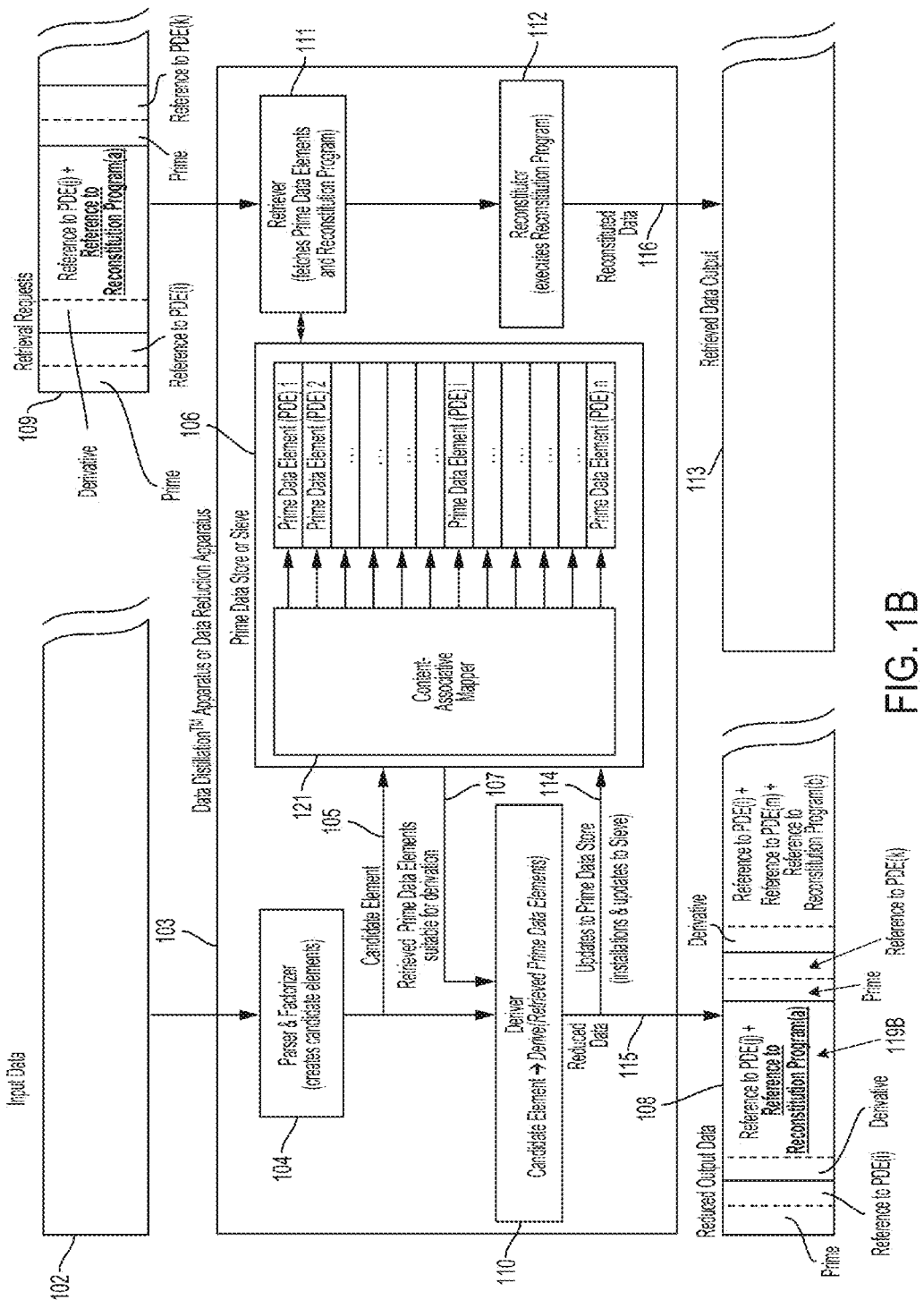
FIGS. 1B and 1C illustrate variations of the methods and apparatuses illustrated in FIG. 1A in accordance with some embodiments described herein.
Figure 1C:
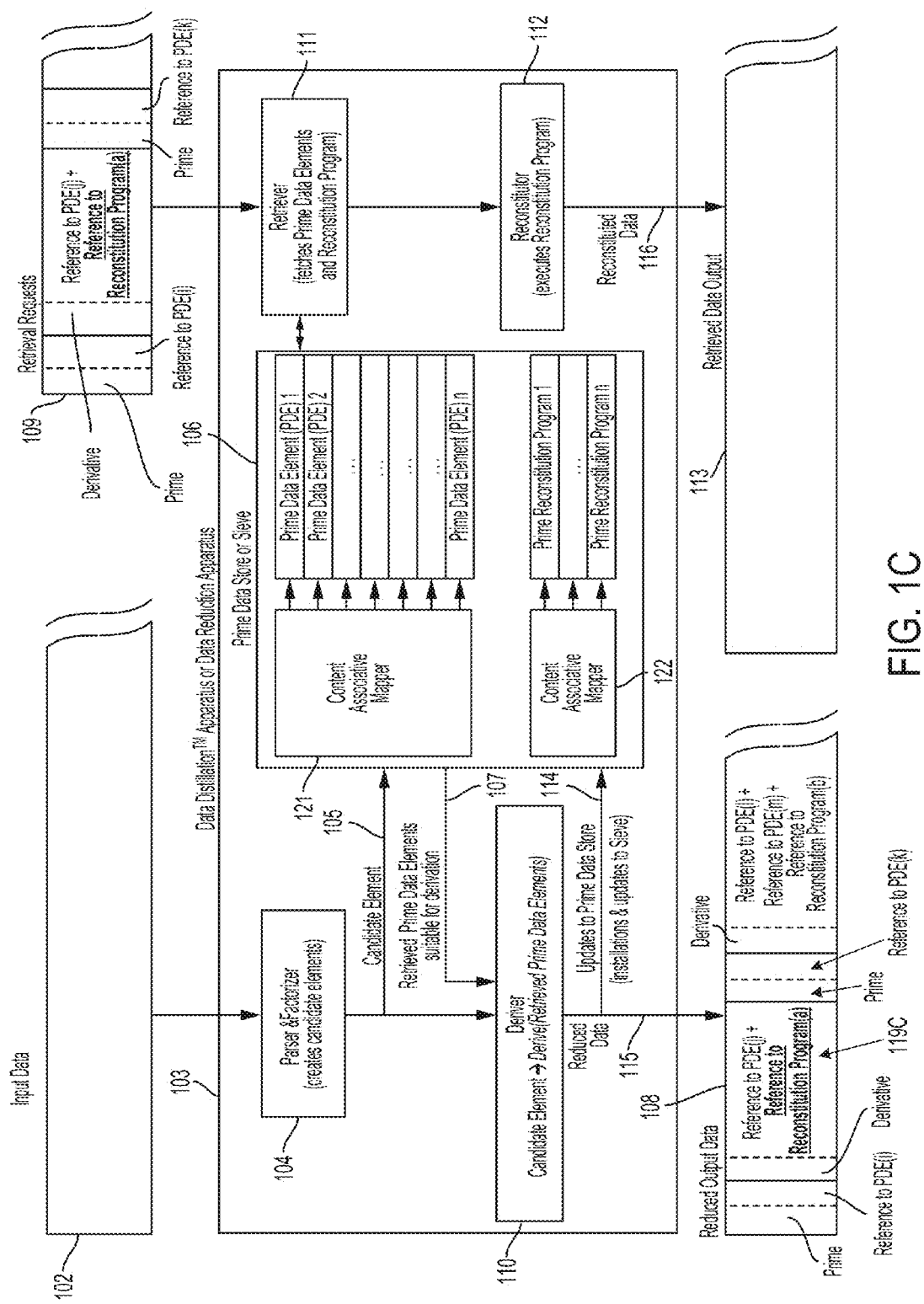

FIGS. 1B and 1C illustrate variations of the methods and apparatuses illustrated in FIG. 1A in accordance with some embodiments described herein. In FIG. 1B, Reconstitution Programs may be stored in the Prime Data Store along with the Prime Data Elements. A reference or pointer 119B to the Reconstitution Program is provided in Reduced Output Data 108 instead of providing the Reconstitution Program 119A itself. Further data reduction is achieved if the Reconstitution Program is shared by other derivatives, and if the reference or pointer to the Reconstitution Program (plus any metadata that is required to distinguish between a Reconstitution Program and a reference to a Reconstitution Program) requires less storage space than the Reconstitution Program itself.

In FIG. 1B, Reconstitution Programs may be stored in the Prime Data Store along with the Prime Data Elements, and treated and accessed just like Prime Data Elements, thereby allowing content-associative search and retrieval of the Reconstitution Programs from the Prime Data Store. During the derivation process to create a Derivative Element, once Deriver 110 determines the Reconstitution Program needed for the derivation, it can then determine whether or not this candidate Reconstitution Program is already present in the Prime Data Store, or whether this candidate Reconstitution Program can be derived from another entry that already exists in the Prime Data Store. If the candidate Reconstitution Program is already present in the Prime Data Store, then Deriver 110 can determine the reference to the pre-existing entry and include the reference in Reduced Output Data 108. If the candidate Reconstitution Program can be derived from an existing entry already resident in the Prime Data Store, the Deriver can deliver a reformulation of the candidate Reconstitution Program to the output, i.e., the Deriver places into the output a reference to the entry that pre-exists in the Prime Data Store along with an incremental Reconstitution Program that derives the candidate Reconstitution Program from the pre-existing entry. If the candidate Reconstitution Program is neither present in the Prime Data Store nor derivable from entries in the Prime Data Store, then Deriver 110 can add the Reconstitution Program to the Prime Data Store (the operation that adds a Reconstitution Program to the store may return the reference to the newly added entry), and include the reference to the Reconstitution Program in Reduced Output Data 108.

FIG. 1C presents a variation of the methods and apparatuses illustrated in FIG. 1B in accordance with some embodiments described herein. Specifically, the mechanism in FIG. 1C that is used to store and query Reconstitution Programs is similar to the mechanism that is used to store and query Prime Data Elements, but the Reconstitution Programs are maintained in a structure separate from that containing the Prime Data Elements. Entries in such a structure are referred to as Prime Reconstitution Programs. Recall that Prime Data Store 106 included content-associative mapper 121 that supported fast content-associative lookup operations. The embodiment illustrated in FIG. 1C includes content-associative mapper 122 which is similar to content-associative mapper 121. In FIG. 1C, content-associative mapper 122 and content-associative mapper 121 have been shown to be part of the Prime Data Store or Sieve 106. In other embodiments, content-associative mapper 122 and the Reconstitution Programs may be stored separately from the Prime Data Store or Sieve 106.

The foregoing descriptions of methods and apparatuses for data reduction that factorize input data into elements and derive these from Prime Data Elements resident in a Prime Data Store have been presented only for purposes of illustration and description. They are not intended to be exhaustive or to limit the present invention to the forms disclosed. Accordingly, many modifications and variations will be apparent to practitioners skilled in the art.

FIG. 1D presents an example of a format and a specification describing the structure of the Reduced Output Data 119A in FIG. 1A of the method and apparatus for the Data Distillation™ process in accordance with some embodiments described herein. Since the Data Distillation™ process factorizes input data into Prime Data Elements and Derivative Elements, the format identifies these elements and describes the various components of these elements in the Reduced Output Data. The self-describing format identifies each record in the Reduced Output Data, indicates whether it is a Prime Data Element or a Derivative Element, and delineates the various components, namely, references to one or more Prime Data Elements installed in the Sieve, in-lined Reconstitution Programs (RPs), a reference to a Reconstitution Program installed in the Prime Data Store (as in 119B of FIG. 1B), or a reference to a Reconstitution Program stored in a Reconstitution Program (RP) Store (as in 119C of FIG. 1C). The Reduced Output Data is stored in the data storage system using this format. Data in this format is consumed by the Data Retriever 111, so that the various components of the data can be fetched and subsequently reconstituted.

Figure 2:
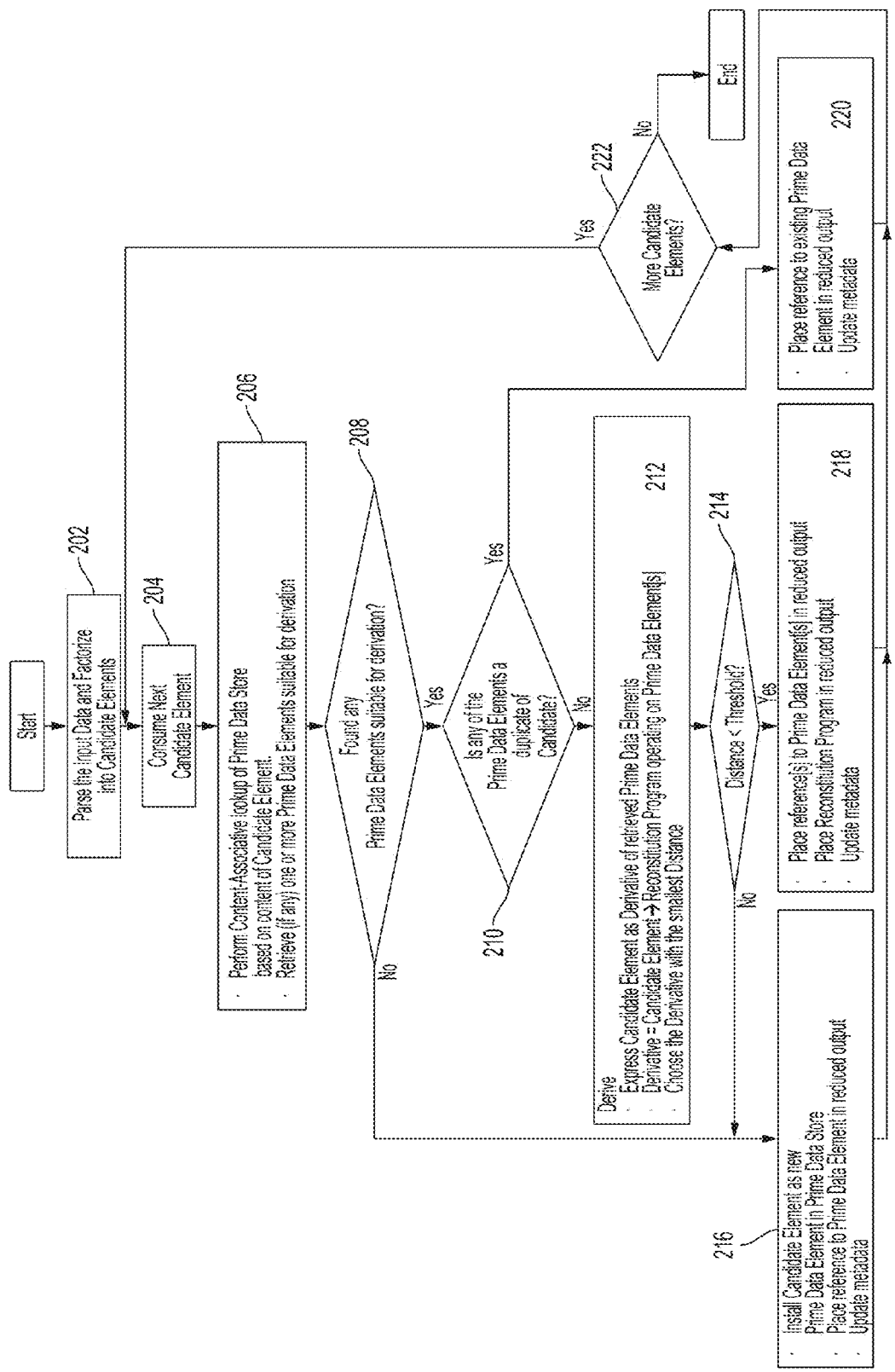
FIG. 2 illustrates a process for data reduction by factorizing input data into elements and deriving these elements from Prime Data Elements residing in a Prime Data Store in accordance with some embodiments described herein.

FIG. 2 illustrates a process for data reduction by factorizing input data into elements and deriving these elements from Prime Data Elements residing in a Prime Data Store in accordance with some embodiments described herein. As input data arrives, it can be parsed and factorized or broken up into a series of candidate elements (operation 202). The next candidate element is consumed from the input (operation 204), and a content-associative lookup of the Prime Data Store is performed based on the content of the candidate element to see if there are any suitable elements from which the candidate element can be derived (operation 206). If the Prime Data Store does not find any such elements ("No" branch of operation 208), the candidate element will be allocated and entered into the Sieve as a new Prime Data Element, and the entry in the reduced output created for the candidate element will be a reference to the newly created Prime Data Element (operation 216). If the content-associative lookup of the Prime Data Store does yield one or more suitable elements from which the candidate may potentially be derived ("Yes" branch of operation 208), analysis and computation is performed on the retrieved Prime Data Elements to derive the candidate element from them. Note that in some embodiments only metadata for the suitable Prime Data Elements is fetched first and analysis is performed on the metadata, with the suitable Prime Data Elements being subsequently fetched only if deemed useful (in these embodiments the metadata for a Prime Data Element provides some information about the content of the Prime Data Element, thereby allowing the system to quickly rule out matches or assess derivability based on the metadata). In other embodiments, the Prime Data Store retrieves the Prime Data Elements directly (i.e., without first retrieving the metadata to analyze the metadata before retrieving the Prime Data Element) so analysis and computation are performed on the retrieved Prime Data Elements.

A first check is performed to see if the candidate is a duplicate of any of these elements (operation 210). This check can be sped up using any suitable hashing technique. If the candidate is identical to a Prime Data Element retrieved from the Prime Data Store ("Yes" branch of operation 210), the entry in the reduced output created for the candidate element is replaced by a reference to this Prime Data Element and an indication that this entry is a Prime Data Element (operation 220). If no duplicate is found ("No" branch of operation 210), the entries retrieved from the Prime Data Store based on the candidate element are regarded as entries from which the candidate element is potentially derivable. The following is an important, novel, and non-obvious feature of the Prime Data Store: when a duplicate is not found in the Prime Data Store, the Prime Data Store can return Prime Data Elements that, although not identical to the candidate element, are elements from which the candidate element may potentially be derived by applying one or more transformations to the Prime Data Element(s). The process can then perform analysis and computation to derive the candidate element from either the most suitable Prime Data Element or a set of suitable Prime Data Elements (operation 212). In some embodiments, the derivation expresses the candidate element as the result of transformations performed on the one or more Prime Data Elements, such transformations being collectively referred to as the Reconstitution Program. Each derivation may require its own unique program to be constructed. In addition to constructing the Reconstitution Program, the process can also compute a distance metric that generally indicates a level of storage resources and/or computational resources that are required to store the reformulation of the candidate element and to reconstitute the candidate element from the reformulation. In some embodiments, the footprint of the Derivative Element is used as a measure of the distance of the candidate from the Prime Data Element(s)—specifically, a Distance metric can be defined as the sum of the size of the Reconstitution Program plus the size of the references to the one or more Prime Data Elements involved in the derivation. The derivation with the shortest Distance can be chosen. The Distance for this derivation is compared with a Distance Threshold (operation 214), and if the Distance does not exceed the Distance Threshold, the derivation is accepted ("Yes" branch of operation 214). In order to yield data reduction, the Distance Threshold must always be less than the size of the candidate element. For example, the Distance Threshold may be set to 50% of the size of the candidate element, so that a derivative will only be accepted if its footprint is less than or equal to half the footprint of the candidate element, thereby ensuring a reduction of 2× or greater for each candidate element for which a suitable derivation exists. The Distance Threshold can be a predetermined percentage or fraction, either based on user-specified input or chosen by the system. The Distance Threshold may be determined by the system based on static or dynamic parameters of the system. Once the derivation is accepted, the candidate element is reformulated and replaced by the combination of the Reconstitution Program and references to the one or more Prime Data Elements. The entry in the reduced output created for the candidate element is replaced by the derivation, i.e., it is replaced by an indication that this is a derivative element, along with the Reconstitution Program plus references to the one or more Prime Data Elements involved in the derivation (operation 218). On the other hand, if the Distance for the best derivation exceeds the Distance Threshold ("No" branch of operation 214), none of the possible derivatives will be accepted. In that case, the candidate element may be allocated and entered into the Sieve as a new Prime Data Element, and the entry in the reduced output created for the candidate element will be a reference to the newly created Prime Data Element along with an indication that this is a Prime Data Element (operation 216).

Finally, the process can check if there are any additional candidate elements (operation 222), and return to operation 204 if there are more candidate elements ("Yes" branch of operation 222), or terminate the process if there are no more candidate elements ("No" branch of operation 222).

A variety of methods can be employed to perform operation 202 in FIG. 2, i.e., to parse the incoming data and break it into candidate elements. The factorization algorithm needs to decide where in the byte stream to insert breaks to slice up the stream into candidate elements. Possible techniques include (but are not limited to) breaking up the stream into fixed-sized blocks (such as pages of 4096 bytes), or applying a method of fingerprinting (such as techniques that apply random prime polynomials to substrings of the input stream) to locate in the data stream suitable fingerprints that become the boundaries of elements (this technique could lead to variable-sized elements), or parsing of the input to detect headers or some pre-declared structure and delineating elements based on this structure. Once two consecutive breaks in the data have been identified, a candidate element is created (the candidate element is the data that is located between the two consecutive breaks) and presented to the Prime Data Store for content-associative lookup. If variable-sized elements are created, the length of the candidate element needs to be specified and carried as metadata along with the candidate element.

One important function of the Prime Data Store is to provide content-associative lookup based upon a candidate element presented to it, and to quickly provide one or a small set of Prime Data Elements from which a candidate element can be derived with minimal storage needed to specify the derivation. This is a difficult problem given a large dataset. Given terabytes of data, even with kilobyte-sized elements, there are billions of elements to search and choose from. The problem is even more severe on larger datasets. It becomes important to organize and order the elements using a suitable technique and then detect similarities and derivability within that organization of the elements, to be able to quickly provide a small set of suitable Prime Data Elements.

The entries in the Sieve could be ordered based upon the value of each element (i.e., Prime Data Element), so that all entries could be arranged by value in ascending or descending order. Alternatively, they could be ordered along a principal axis that is based upon the value of certain fields in the element, followed by subordinate axes that use the rest of the content of the element. In this context, a field is a set of contiguous bytes from the content of the element. Fields could be located by applying a method of fingerprinting to the contents of the element so that the location of a fingerprint identifies the location of a field. Alternatively, certain fixed offsets inside the content of the element could be chosen to locate a field. Other methods could also be employed to locate a field, including, but not limited to, parsing the element to detect certain declared structure, and locating fields within that structure.

In yet another form of organization, certain fields or combinations of fields within the element could be considered as dimensions, so that a concatenation of these dimensions followed by the rest of the content of each element could be used to order and organize the data elements. In general, the correspondence or mapping between fields and dimensions can be arbitrarily complex. For example, in some embodiments exactly one field may map to exactly one dimension. In other embodiments, a combination of multiple fields, e.g., F1, F2, and F3, may map to a dimension. The combining of fields may be achieved either by concatenating the two fields or by applying any other suitable function to them. The important requirement is that the arrangement of fields, dimensions, and the rest of the content of an element that is used to organize elements must enable all Prime Data Elements to be uniquely identified by their content and ordered in the Sieve.

In some embodiments, the contents of an element can be represented as an expression as follows: Element=Head.*sig1.*sig2.* . . . sigI.* . . . sigN.*Tail, where "Head" is a sequence of bytes comprising the leading bytes of the element, "Tail" is a sequence of bytes comprising the concluding bytes of the element, and "sig1", "sig2", "sigI", and "sigN" are various signatures or sequences of bytes of certain lengths within the body of the content of the element that characterize the element. The expression ".*" between the various signatures is the wildcard expression, i.e., it is the regular expression notation that allows any number of intervening bytes of any value other than the signature that follows the expression ".*". In some embodiments, the N-tuple (sig1, sig2, . . . sigI, . . . sigN) is referred to as the Skeletal Data Structure or the Skeleton of the element, and can be regarded as a reduced and essential subset of the element. In other embodiments, the (N+2)-tuple (Head, sig1, sig2, . . . sigI, . . . sigN, Tail) is referred to as the Skeletal Data Structure or the Skeleton of the element.

A method of fingerprinting can be applied to the content of the element to determine the locations of the various components (or signatures) of the Skeletal Data Structure within the content of the element. Alternatively, certain fixed offsets inside the content of the element could be chosen to locate a component. Other methods could also be employed to locate a component of the Skeletal Data Structure, including, but not limited to, parsing the element to detect certain declared structure, and locating components within that structure. Prime Data Elements can be ordered in the Sieve based on their Skeletal Data Structure. In other words, the various components of the Skeletal Data Structure of the element can be considered as Dimensions, so that a concatenation of these dimensions followed by the rest of the content of each element could be used to order and organize the Prime Data Elements in the Sieve.

Some embodiments factorize the input data into candidate elements, where the size of each candidate element is substantially larger than the size of a reference needed to access all such elements in the global dataset. One observation about data that is broken into such data chunks (and that is being accessed in a content-associative fashion) is that the actual data is very sparse with respect to the total possible values that the data chunk can specify. For example, consider a 1 zettabyte dataset. One needs about 70 bits to address every byte in the dataset. At a chunk size of 128 bytes (1024 bits), there are approximately $2^{63}$ chunks in the 1 zettabyte dataset, so that one needs 63 bits (fewer than 8 bytes) to address all of the chunks. Note that an element or chunk of 1024 bits could have one of $2^{1024}$ possible values, while the number of actual values of the given chunks in the dataset is at most $2^{63}$ (if all the chunks are distinct). This indicates that the actual data is extremely sparse with respect to the number of values that can be reached or named by the content of an element. This enables use of a tree structure, which is well-suited for organizing very sparse data in a manner that enables efficient content-based lookups, allows new elements to be efficiently added to the tree structure, and is cost-effective in terms of the incremental storage needed for the tree structure itself. Although there are only $2^{63}$ distinct chunks in the 1 zettabyte dataset, thus requiring only 63 differentiating bits of information to tell them apart, the relevant differentiating bits might be spread across the entire 1024 bits of the element and occur at different locations for each element. Therefore, to fully differentiate all the elements, it is insufficient to examine only a fixed 63 bits from the content, but rather the entire content of the element needs to participate in the sorting of the elements, especially in a solution that provides true content-associative access to any and every element in the dataset. In the Data Distillation™ framework, it is desirable to be able to detect derivability within the framework used to order and organize the data. Keeping all of the above in mind, a tree structure based upon the content (which progressively differentiates the data as more of the content is examined) is a suitable organization to order and differentiate all the elements in the factorized dataset. Such a structure provides numerous intermediate levels of subtrees which can be treated as groupings of derivable elements or groupings of elements with similar properties of derivability. Such a structure can be hierarchically augmented with metadata characterizing each subtree or with metadata characterizing each element of data. Such a structure can effectively communicate the composition of the entire data it contains, including the density, proximity, and distribution of actual values in the data.

Some embodiments organize the Prime Data Elements in the Sieve in tree form. Each Prime Data Element has a distinct "Name" which is constructed from the entire content of the Prime Data Element. This Name is designed to be sufficient to uniquely identify the Prime Data Element and to differentiate it with respect to all other elements in the tree. There are several ways in which the Name can be constructed from the content of the Prime Data Element. The Name may be simply comprised of all the bytes of the Prime Data Element, with these bytes appearing in the Name in the same order as they exist in the Prime Data Element. In another embodiment, certain fields or combinations of fields referred to as Dimensions (where fields and dimensions are as described earlier) are used to form the leading bytes of the Name, with the rest of the content of the Prime Data Element forming the rest of the Name, so that the entire content of the Prime Data Element is participating to create the complete and unique Name of the element. In yet another embodiment, the fields of the Skeletal Data Structure of the element are chosen as Dimensions (where fields and dimensions are as described earlier), and are used to form the leading bytes of the Name, with the rest of the content of the Prime Data Element forming the rest of the Name, so that the entire content of the Prime Data Element is participating to create the complete and unique Name of the element.

The Name of each Prime Data Element is used to order and organize the Prime Data Elements in the tree. For most practical datasets, even those that are very large in size (such as a 1 zettabyte dataset, comprised of $2^{58}$ elements of, say, 4 KB size), it is expected that a small subset of the bytes of the Name will often serve to sort and order the majority of the Prime Data Elements in the tree.

FIGS. 3A, 3B, 3C, 3D, and 3E illustrate different data organization systems that may be used to organize Prime Data Elements based on their Name in accordance with some embodiments described herein.

Figure 3A:
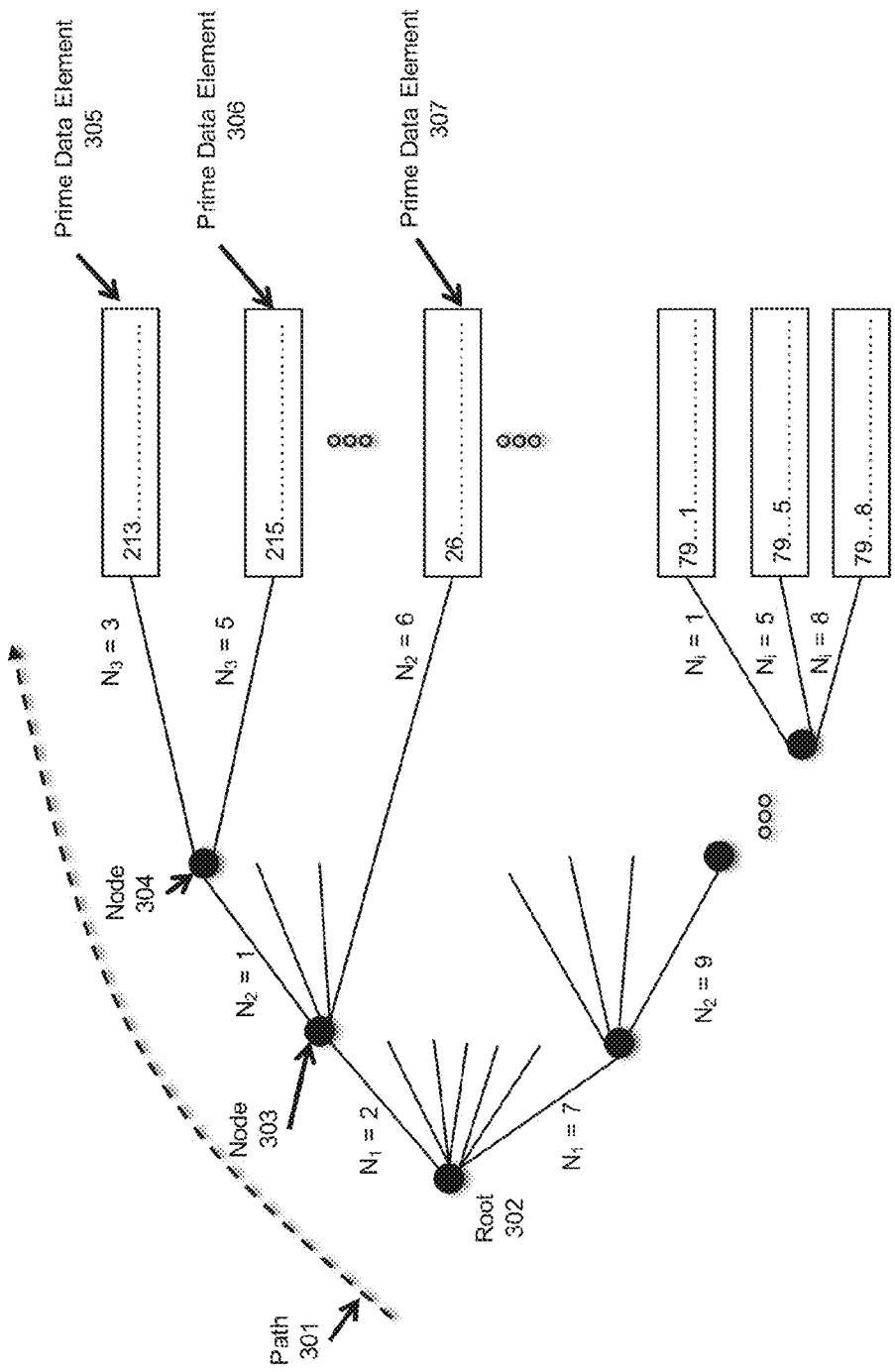

FIG. 3A shows a trie data structure in which Prime Data Elements are organized into progressively smaller groups based on the values of successive bytes from the Name of each Prime Data Element. In the example shown in FIG. 3A, each Prime Data Element has a distinct Name which is constructed from the entire content of the Prime Data Element, and this Name is simply comprised of all the bytes of the Prime Data Element, with these bytes appearing in the Name in the same order as they exist in the Prime Data Element. The root node of the trie represents all the Prime Data Elements. Other nodes of the trie represent subsets or groups of Prime Data Elements. Starting at the root node or $1^{st}$ level of the trie (labelled as Root 302 in FIG. 3A), Prime Data Elements are grouped into subtrees based upon the value of the most significant byte of their Name (labelled as N1 in FIG. 3A). All Prime Data Elements with the same value in the most significant byte of their Name will be grouped together into a common subtree, and a link denoted by that value will exist from the root node to a node representing that subtree. For example, in FIG. 3A, Node 303 represents a subtree or group of Prime Data Elements that each have the same value 2 in their most significant byte N1 of their respective Names. In FIG. 3A, this group includes Prime Data Elements 305, 306, and 307.

At the second level of the trie, the second most significant byte of the Name of each Prime Data Element is used to further divide each group of the Prime Data Elements into smaller subgroups. For example, in FIG. 3A, the group of Prime Data Elements represented by Node 303 is further subdivided into subgroups using the second most significant byte N2. Node 304 represents the subgroup of Prime Data Elements which have the value 2 in their most significant byte N1, and also the value 1 in their second most significant byte N2 of their respective Names. This subgroup includes Prime Data Elements 305 and 306.

The process of subdivision continues at each level of the trie creating links from a parent node to each child node, where a child node represents a subset of the Prime Data Elements represented by the parent node. This process continues until there are only individual Prime Data Elements at the leaves of the trie. A leaf node represents a group of leaves. In FIG. 3A, Node 304 is a leaf node. The group of Prime Data Elements represented by Node 304 comprises Prime Data Elements 305 and 306. In FIG. 3A, this group is further subdivided into individual Prime Data Elements 305 and 306 using the third most significant byte of their Names. The value of N3=3 leads to Prime Data Elements 305, while the value N3=5 leads to Prime Data Element 306. In this example, out of their complete Names, only 3 significant bytes are sufficient to fully identify Prime Data Elements 305 and 306. Likewise, only two significant bytes from the Name are sufficient to identify Prime Data Element 307.

This example illustrates how, in the given mix of Prime Data Elements, only a subset of the bytes of the Name serves to identify Prime Data Elements in the tree, and the entire Name is not needed to arrive at a unique Prime Data Element. Also, Prime Data Elements or groups of Prime Data Elements might each require a different number of significant bytes to be able to uniquely identify them. Thus, the depth of the trie from the root node to a Prime Data Element could vary from one Prime Data Element to another. Furthermore, in the trie, each node might have a different number of links descending to subtrees below.

In such a trie, each node has a name comprised of the sequence of bytes that specifies how to reach this node. For example, the name for Node 304 is "21". Also, the subset of bytes from the Name of the element that uniquely identifies the element in the current distribution of elements in the tree is the "Path" to this Prime Data Element from the root node. For example, in FIG. 3A, Path 301 with a value of 213 identifies Prime Data Elements 305.

The trie structure described here may create deep trees (i.e., trees that have many levels) since every differentiating byte of the Name of an element in the tree adds one level of depth to the trie.

Note that the tree data structures in FIGS. 3A-3E have been drawn from left to right. Therefore, as we move from the left side of the figure to the right side of the figure, we move from higher levels of the tree to lower levels of the tree. Below a given node (i.e., toward the right of a given node in FIGS. 3A-3E), for any child selected by a certain value of the differentiating byte from the Name, all elements resident in the subtrees below that child will have the same value in that corresponding byte in the Name of the element.

We now describe a method for content-associative lookup of the trie structure, given an input candidate element. This method involves navigation of the trie structure using the Name of the candidate element, followed by subsequent analysis and screening to decide what to return as the result of the overall content-associative lookup. In other words, the trie navigation process returns a first outcome, and then analysis and screening is performed on that outcome to determine the result of the overall content-associative lookup.

To begin the trie navigation process, the value of the most significant byte from the Name of the candidate element will be used to select a link (denoted by that value) from the root node to a subsequent node representing a subtree of Prime Data Elements with that same value in the most significant byte of their Names. Proceeding from this node, the second byte from the Name of the candidate element is examined and the link denoted by that value is selected, thus advancing one level deeper (or lower) into the trie and selecting a smaller subgroup of Prime Data Elements that now share with the candidate element at least two significant bytes from their Names. This process continues until a single Prime Data Element is reached or until none of the links match the value of the corresponding byte from the Name of the candidate element. Under either of these conditions, the tree navigation process terminates. If a single Prime Data Element is reached, it may be returned as the outcome of the trie navigation process. If not, one alternative is to report a "miss". Another alternative is to return multiple Prime Data Elements that are in the subtree that is rooted at the node where the navigation terminated.

Once the trie navigation process has terminated, other criteria and requirements may be used to analyze and screen the outcome of the trie navigation process to determine what should be returned as the result of the content-associative lookup. For example, when either a single Prime Data Element or multiple Prime Data Elements are returned by the trie navigation process, there could be an additional requirement that they share a certain minimum number of bytes with the Name of the candidate element before qualifying to be returned as the result of the content-associative lookup (otherwise the content-associative lookup returns a miss). Another example of a screening requirement could be that, if the trie navigation process terminates without reaching a single Prime Data Element so that multiple Prime Data elements (rooted at the node where the trie navigation terminated) are returned as the outcome of the trie navigation process, then these multiple Prime Data Elements will qualify to be returned as the result of the overall content-associative lookup only if the number of these elements is fewer than a certain specified limit (otherwise the content-associative lookup returns a miss). Combinations of multiple requirements may be employed to determine the result of the content-associative lookup. In this manner, the lookup process will either report a "miss" or return a single Prime Data Element, or if not a single Prime Data Element, then a set of Prime Data Elements that are likely to be good starting points for deriving the candidate element.

FIGS. 3B-3E described below relate to variations and modifications to the tree data structure illustrated in FIG. 3A. Although these variations provide improvements and advantages over the trie data structure illustrated in FIG. 3A, the process for navigating the data structure is similar to the process described above in reference to FIG. 3A. That is, after the tree navigation for the tree data structures shown in FIGS.

3B-3E terminates, and subsequent analysis and screening is performed to determine the result of the overall content-associative lookup, the overall process either returns a miss, a single Prime Data Element, or a set of Prime Data Elements that are likely to be good starting points for deriving the candidate element.

Figure 3B:
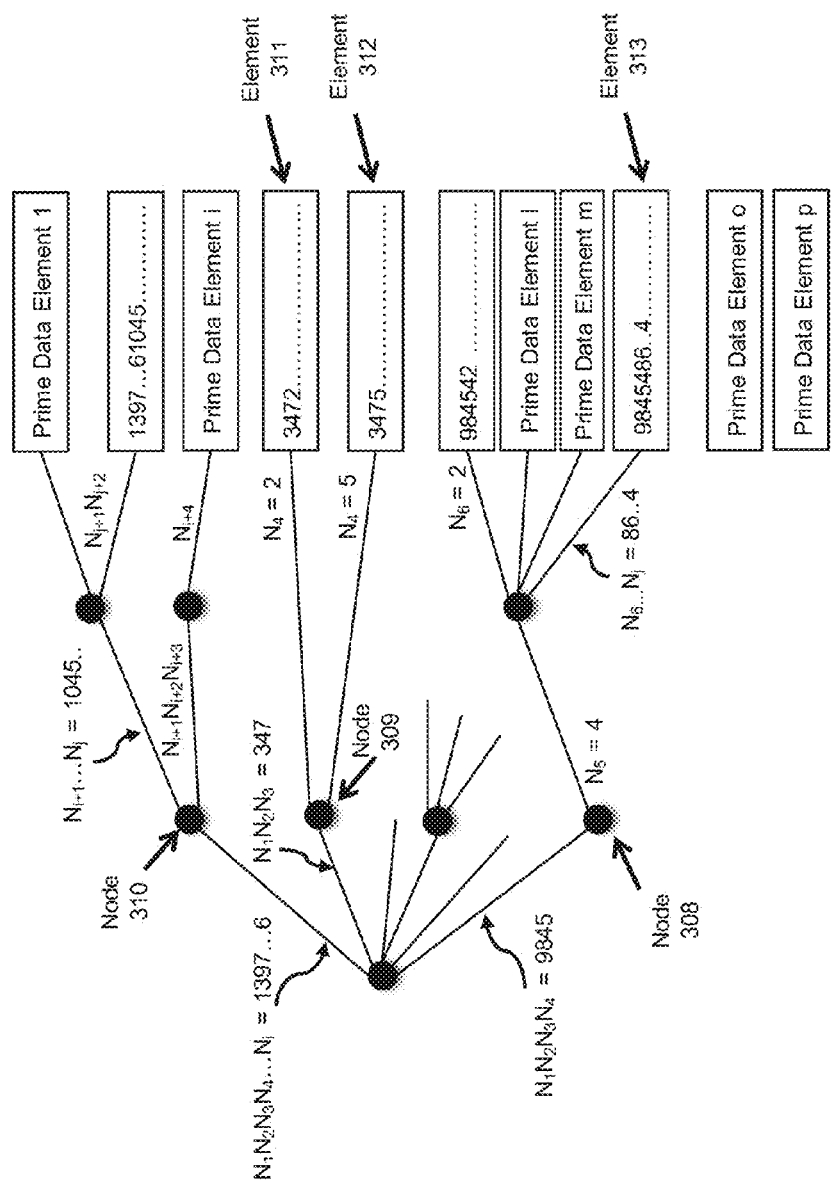

FIG. 3B illustrates another data organization system that may be used to organize Prime Data Elements based on their Name. In the example shown in FIG. 3B, each Prime Data Element has a distinct Name, which is constructed from the entire content of the Prime Data Element, and this Name is simply comprised of all the bytes of the Prime Data Element, with these bytes appearing in the Name in the same order as they exist in the Prime Data Element. FIG. 3B shows a more compact structure where a single link employs multiple bytes (rather than the single byte used in the trie in FIG. 3A) from the Name of the Prime Data Elements in the subtree below to create subdivisions or the next level of groupings. The links from parent nodes to child nodes are now denoted by multiple bytes. Further, from any given parent node, each link might employ a different number of bytes to differentiate and identify the subtree associated with that link. For example, in FIG. 3B, the link from the root node to Node 308 is differentiated by using 4 bytes ($N_1N_2N_3N_4$=9845) from the Name, while the link from the root node to Node 309 is differentiated by using 3 bytes ($N_1N_2N_3$=347) from the Name.

Note that, during tree navigation (using content from a given candidate element), upon arriving at any parent node in the tree, the tree navigation process needs to ensure that sufficient bytes from the Name of the candidate element are examined to unambiguously decide which link to choose. To choose a given link, the bytes from the Name of the candidate must match all the bytes that denote the transition to that particular link. Once again, in such a tree, each node of the tree has a name comprised of the sequence of bytes that specifies how to reach this node. For example, the name of node 309 can be "347" because it represents a group of Prime Data Elements (e.g., elements 311 and 312) with the 3 leading bytes of their Names being "347". Upon a lookup of the tree using a candidate element with the leading 3 bytes of the Name being 347, this data pattern causes the tree navigation process to reach node 309 as shown in FIG. 3B. Once again, the subset of bytes from the Name of the element that uniquely identifies the element in the current mix of elements in the tree is the "Path" to this Prime Data Element from the root node. For example, in FIG. 3B, the sequence of bytes 3475 leads to Prime Data Element 312, and uniquely identifies Prime Data Element 312 in the mix of Prime Data Elements shown in that example.

For diverse and sparse data, the tree structure in FIG. 3B can prove more flexible and compact than the trie structure of FIG. 3A.

Figure 3C:
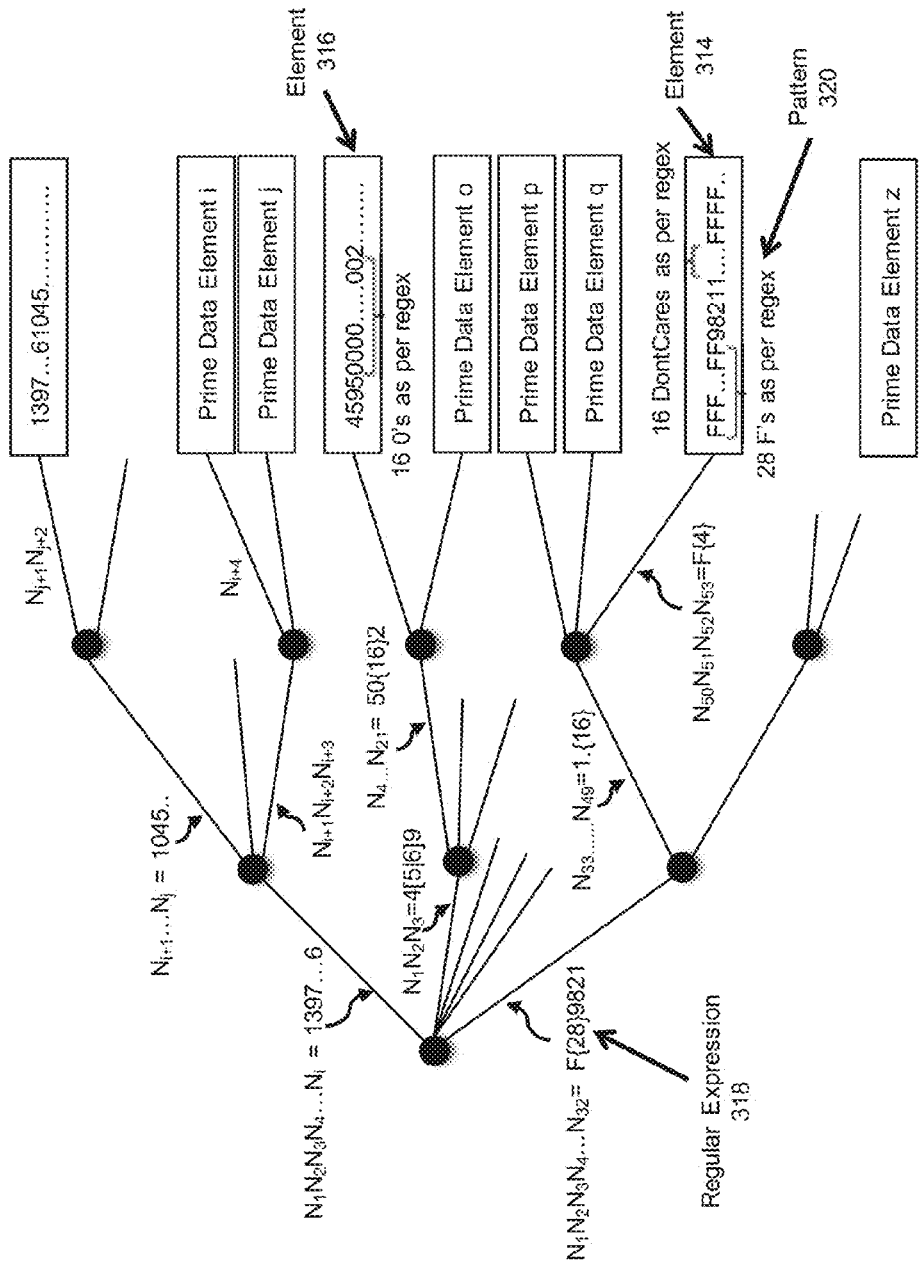

FIG. 3C illustrates another data organization system that may be used to organize Prime Data Elements based on their Name. In the example shown in FIG. 3C, each Prime Data Element has a distinct Name, which is constructed from the entire content of the Prime Data Element, and this Name is simply comprised of all the bytes of the Prime Data Element, with these bytes appearing in the Name in the same order as they exist in the Prime Data Element. FIG. 3C shows another variation (to the organization described in FIG. 3B) that further compacts the tree and groups elements in a subtree by using regular expressions (where necessary and/or useful) to specify the values from the Name of Prime Data Elements that lead to the various links. The use of regular expressions allows an efficient grouping of elements that share the same expression on corresponding bytes under the same subtree; this can then be followed by a more local disambiguation of distinct Prime Data Elements within the subtree. Also, the use of the regular expressions allows a more compact way to describe the values of bytes needed to map the element to any subtree below. This further reduces the number of bytes needed to specify the tree. For example, regular expression 318 specifies a pattern of 28 consecutive "F"s; if this link is followed during tree navigation, we may reach element 314, which includes pattern 320 that has 28 consecutive "F"s as per regular expression 318. Likewise, the path that reaches element 316 has a link or branch that uses a regular expression that specifies a pattern with 16 consecutive "0"s. For such a tree, the tree navigation process needs to detect and execute such regular expressions in order to determine which link to choose.

FIG. 3D illustrates another data organization system that may be used to organize Prime Data Elements based on their Name. In the example shown in FIG. 3D, each Prime Data Element has a distinct Name, which is constructed from the entire content of the Prime Data Element. A method of fingerprinting is applied to each element to identify locations of fields that contain content that evaluates to a chosen fingerprint. A field at the location of the first fingerprint found in the element is treated as a Dimension and a certain number of bytes (say, x bytes, where x is significantly smaller than the number of bytes in the element) from this field are extracted and used as the leading bytes of the Name of the Element, with the rest of the bytes of the Name being comprised of the rest of the bytes of the Prime Data Element and appearing in the same cyclic order as they exist in the Prime Data Element. This Name is used to organize the Prime Data Elements in the tree. In this example, when no fingerprint is detected in an element, the Name is formulated by simply using all the bytes of the element in the order in which they exist in the element. A separate subtree (denoted by an indication that no fingerprints were found) holds and organizes all such elements based upon their Names.

For example, as shown in FIG. 3D, a fingerprinting technique can be applied to Element 338 (which contains t bytes of data viz. $B_1 B_2 B_3 \ldots B_t$) to obtain fingerprint location "Fingerprint 1" at byte $B_{i+1}$ which identifies the field which will be chosen as "Dimension 1." Next, x bytes from the location identified by "Fingerprint 1" can be extracted to form "Dimension 1" and these x bytes can be used as the leading bytes $N_1 N_2 \ldots N_x$ of the Name of each element in FIG. 3D. Subsequently, the rest of the t-x bytes from element 338 (starting from $B_{i+x+1}$, and later wrapping around to $B_1 B_2 B_3 \ldots B_i$) are concatenated and used as the rest of the bytes $N_{x+1} N_{x+2} \ldots N_t$ of the Name. When no fingerprints are found in the element, the Name $N_1 N_2 \ldots N_t$ is simply $B_1 B_2 B_3 \ldots B_t$ from Element 338. Prime Data Elements are sorted and organized in the tree using their Names. For example, Prime Data Element (PDE) 330 is identified and reached after traversing two levels of the tree using the Path 13654 . . . 06, where the bytes 13654 . . . 0 are $N_1 N_2 \ldots N_x$ which are the bytes from Dimension 1. A separate subtree at Node 335, arrived at from the root along link 334 (denoted by an indication that no fingerprints were found) holds and organizes all Prime Data Elements whose content did not evaluate to the chosen fingerprint. Thus, in this organization, some links, e.g., link 336, may organize elements using a Name that is comprised of the bytes of the element appearing in the same order as in the element, while other links, e.g., link 340, may organize elements using a Name that is formulated using fingerprints.

Upon receiving a candidate element, the process applies the same technique described above to determine the Name of the candidate element, and uses this Name to navigate the tree for a content-associative lookup. Thus, the same and consistent treatment is applied to Prime Data Elements (upon their installation into the tree) and candidate elements (upon receiving them from the Parser & Factorizer) in order to create their Names. The tree navigation process uses the Name of the candidate element to navigate the tree. In this embodiment, if no fingerprint is found in the candidate element, the tree navigation process navigates down the subtree that organizes and contains Prime Data Elements whose content did not evaluate to the fingerprint.

Figure 3E:
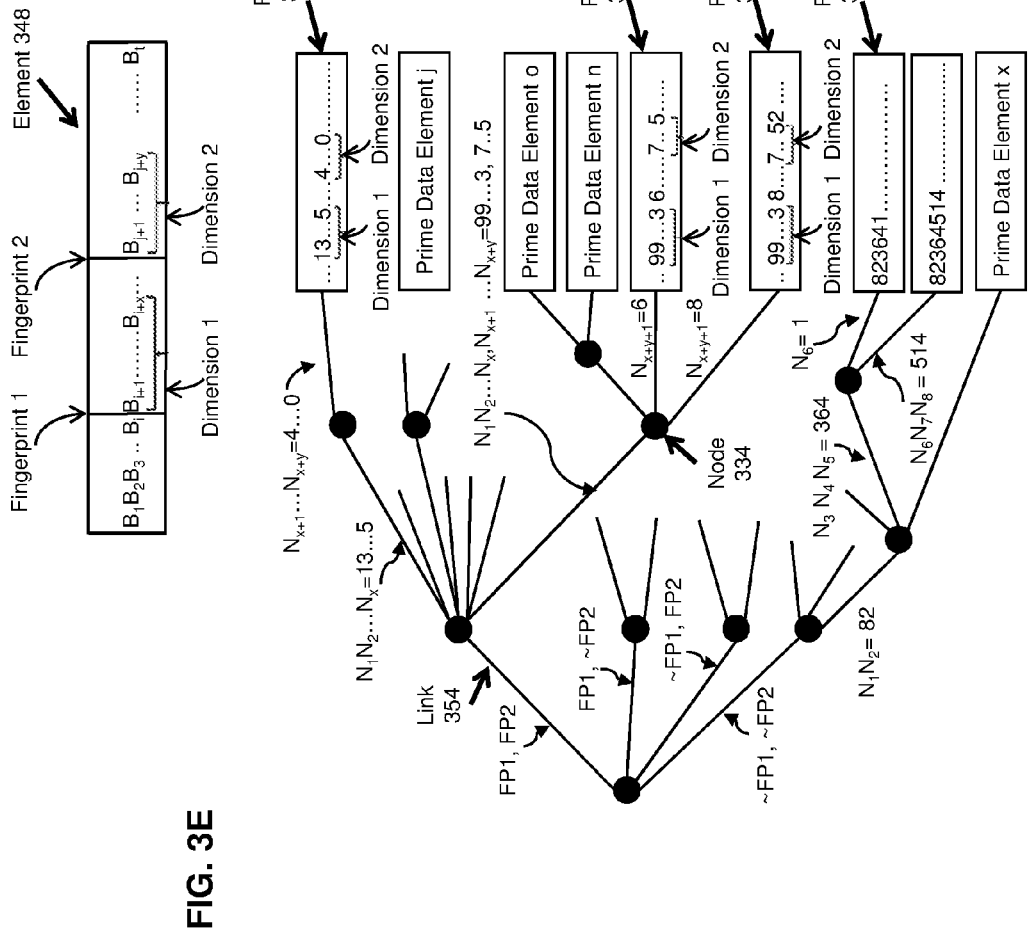

FIG. 3E illustrates another data organization system that may be used to organize Prime Data Elements based on their Name. In the example shown in FIG. 3E, each Prime Data Element has a distinct Name, which is constructed from the entire content of the Prime Data Element. A method of fingerprinting is applied to each element to identify locations of fields that contain content that evaluates to either of two fingerprints. The field at the location of the first occurrence of the first fingerprint (Fingerprint 1 in FIG. 3E) in the element is treated as a first Dimension (Dimension 1), and the field located at the first occurrence of the second fingerprint (Fingerprint 2 in FIG. 3E) is treated as a second Dimension (Dimension 2). The use of fingerprinting to look for two distinct fingerprints on an element leads to four possible scenarios: (1) both fingerprints are found in the element, (2) fingerprint 1 is found but fingerprint 2 is not found, (3) fingerprint 2 is found but fingerprint 1 is not found, and (4) no fingerprints are found. Prime Data Elements can be grouped into 4 subtrees corresponding to each of the scenarios. In FIG. 3E, "FP1" denotes the presence of Fingerprint 1, "FP2" denotes the presence of Fingerprint 2, "~FP1" denotes the absence of Fingerprint 1, and "~FP2" denotes the absence of Fingerprint 2.

For each of the 4 scenarios, the Name of an element is created as follows: (1) When both fingerprints are found, x bytes from the location identified by "Fingerprint 1" can be extracted to form "Dimension 1" and y bytes from the location identified by "Fingerprint 2" can be extracted to form "Dimension 2" and these x+y bytes can be used as the leading bytes $N_1 N_2 \ldots N_{x+y}$ of the Name of each such element in FIG. 3E. Subsequently, the rest of the t−(x+y) bytes from element 348 are extracted in cyclic fashion (starting after the bytes from the first dimension) and concatenated and used as the rest of the bytes $N_{x+y+1} N_{x+y+2} \ldots N_t$ of the Name. (2) When fingerprint 1 is found but not fingerprint 2, x bytes from the location identified by "Fingerprint 1" can be extracted to form the leading dimension, and these x bytes can be used as the leading bytes $N_1 N_2 \ldots N_x$ of the Name of each such element. Subsequently, the rest of the t−x bytes from element 348 (starting from $B_{i+x+1}$, and later wrapping around to $B_1 B_2 B_3 \ldots B_i$) are concatenated and used as the rest of the bytes $N_{x+1} N_{x+2} \ldots N_t$ of the Name. (3) When fingerprint 2 is found but not fingerprint 1, y bytes from the location identified by "Fingerprint 2" can be extracted to form the leading dimension, and these y bytes can be used as the leading bytes $N_1 N_2 \ldots N_y$ of the Name of each such element. Subsequently, the rest of the t−y bytes from element 348 (starting from $B_{j+y+1}$, and later wrapping around to $B_1 B_2 B_3 \ldots B_j$) are concatenated and used as the rest of the bytes $N_{y+1} N_{y+2} \ldots N_t$ of the Name. (4) When no fingerprints are found in the element, the Name $N_1 N_2 \ldots N_t$ is simply $B_1 B_2 B_3 \ldots B_t$ from element 348. Thus, a separate subtree exists for each of these 4 scenarios. The process to extract Name ($N_1 N_2 N_3 \ldots N_t$) for element 348 can be summarized for the four scenarios as follows:

(1) both Fingerprint 1 and Fingerprint 2 found:
$N_1 - N_x \leftarrow B_{i+1} - B_{i+x}$ = x bytes from Dimension 1
$N_{x+1} - N_{x+y} \leftarrow B_{j+1} - B_{j+y}$ = y bytes from Dimension 2
$N_{x+y+1} \ldots N_t$ = Rest of the bytes (from the Candidate Element of size t bytes) = $B_{i+x+1} B_{i+x+2} B_{i+x+3} \ldots B_j B_{j+y+1} B_{j+y+2} B_{j+y+3} \ldots B_t B_1 B_2 B_3 \ldots B_j$ (2) Fingerprint 1 found, Fingerprint 2 not found:
$N_1 - N_x \leftarrow B_{i+1} - B_{i+x}$ = x bytes from Dimension 1
$N_{x+1} \ldots N_t$ = Rest of the bytes (from the Candidate Element of size t bytes) = $B_{i+x+1} B_{i+x+2} B_{i+x+3} \ldots B_t B_1 B_2 B_3 \ldots B_i$ (3) Fingerprint 2 found, Fingerprint 1 not found:
$N_1 - N_y \leftarrow B_{j+y}$ = y bytes from Dimension 2
$N_{y+1} \ldots N_t$ = Rest of the bytes (from the Candidate Element of size t bytes) = $B_{j+y+1} B_{j+y+2} B_{j+y+3} \ldots B_t B_1 B_2 B_3 \ldots B_j$ (4) No fingerprints found:
$N_1 - N_x \leftarrow B_1 - B_t$ Upon receiving a candidate element, the process applies the same technique described above to determine the Name of the candidate element. In this embodiment, the 4 methods of Name construction described above (depending upon whether fingerprint 1 and fingerprint 2 are found or not) are applied to the candidate element just as they were to Prime Data Elements when they were entered into the Sieve. Thus, the same and consistent treatment is applied to Prime Data Elements (upon their installation into the tree) and to candidate elements (upon receiving them from the Parser & Factorizer) in order to create their Names. The tree navigation process uses the Name of the candidate element to navigate the tree for a content-associative lookup.

If the content-associative lookup is successful, it will yield Prime Data Elements that have the same patterns at the locations of the specific dimensions as the candidate element. For example, if both fingerprints are found in the candidate element, the tree navigation process will take it down link 354 of the tree, starting from the root node. If the candidate element has the pattern "99 . . . 3" as 'Dimension 1' and the pattern "7 . . . 5" as 'Dimension 2", the tree navigation process will arrive at Node 334. This reaches a subtree containing two Prime Data Elements (PDE 352 and PDE 353), which are likely targets for the derivation. Additional analysis and screening is performed (by first examining the metadata, and if needed, by subsequently fetching and examining the actual Prime Data Elements) to determine which Prime Data Element is best suited for the derivation.

Thus, embodiments described herein identify a variety of tree structures that can be used in the Sieve. Combinations of such structures or variations thereof could be employed to organize the Prime Data Elements. Some embodiments organize the Prime Data Elements in tree form, wherein the entire content of the element is used as the Name of the element. However, the sequence in which bytes appear in the Name of the element is not necessarily the sequence in which the bytes appear in the element. Certain fields of the element are extracted as dimensions and used to form the leading bytes of the Name, and the rest of the bytes of the element make up the rest of the Name. Using these Names, the elements are ordered in the Sieve in tree form. The leading digits of the Name are used to differentiate the higher branches (or links) of the tree, and the rest of the digits are used to progressively differentiate all branches (or links) of the tree. Each node of the tree could have a different number of links emanating from that node. Also, each link from a node could be differentiated and denoted by a different number of bytes, and the description of these bytes could be accomplished through use of regular expressions and other powerful ways to express their specification. All these features lead to a compact tree structure. At the leaf nodes of the tree reside references to individual Prime Data Elements.

In one embodiment, a method of fingerprinting can be applied to the bytes comprising the Prime Data Element. A number of bytes residing at the location identified by the fingerprint can be used to make up a component of the element Name. One or more components could be combined to provide a dimension. Multiple fingerprints could be used to identify multiple dimensions. These dimensions are concatenated and used as the leading bytes of the Name of the element, with the rest of the bytes of the element comprising the rest of the Name of the element. Since the dimensions are located at positions identified by fingerprints, it increases the likelihood that the Name is being formed from consistent content from each element. Elements that have the same value of content at the fields located by the fingerprint will be grouped together along the same leg of the tree. In this fashion, similar elements will be grouped together in the tree data structure. Elements with no fingerprints found in them can be grouped together in a separate subtree, using an alternative formulation of their Names.

In one embodiment, a method of fingerprinting can be applied to the content of the element to determine the locations of the various components (or signatures) of the Skeletal Data Structure (described earlier) within the content of the element. Alternatively, certain fixed offsets inside the content of the element could be chosen to locate a component. Other methods could also be employed to locate a component of the Skeletal Data Structure of the element, including, but not limited to, parsing the element to detect certain declared structure, and locating components within that structure. The various components of the Skeletal Data Structure of the element can be considered as Dimensions, so that a concatenation of these dimensions followed by the rest of the content of each element is used to create the Name of each element. The Name is used to order and organize the Prime Data Elements in the tree.

In another embodiment, the element is parsed in order to detect certain structure in the element. Certain fields in this structure are identified as dimensions. Multiple such dimensions are concatenated and used as the leading bytes of the Name, with the rest of the bytes of the element comprising the rest of the Name of the element. Since the dimensions are located at positions identified by parsing the element and detecting its structure, it increases the likelihood that the Name is being formed from consistent content from each element. Elements that have the same value of content at the fields located by the parsing will be grouped together along the same leg of the tree. In this fashion, once again, similar elements will be grouped together in the tree data structure.

In some embodiments, each node in the tree data structure contains a self-describing specification. Tree nodes have one or more children. Each child entry contains information on the differentiating bytes on the link to the child, and a reference to the child node. A child node may be a tree node or leaf node. FIG. 3F presents a self-describing tree node data structure in accordance with some embodiments described herein. The tree node data structure shown in FIG. 3F specifies (A) information pertaining to the Path from the root node to this tree node, including all or a subset of the following components: the actual sequence of bytes from the Name to reach this tree node, the number of bytes of the Name consumed to reach this node from the root node, an indication whether this number of bytes consumed is greater than some pre-specified threshold, and other metadata that describes the Path to this node and is useful for the content-associative search of the tree as well as for decisions relating to the construction of the tree, (B) the number of children the node has, and (C) for each child (wherein each child corresponds to a branch of the tree) it specifies (1) Child ID, (2) number of differentiating bytes needed from the succeeding bytes of the Name in order to transition down this link of the tree, (3) the specification for the actual value of the bytes from the Name that take it down this link, and (4) a reference to the child node.

FIG. 3G presents a self-describing leaf node data structure in accordance with some embodiments described herein. Leaf nodes have one or more children. Each child is the link to a Prime Data Element. Each child entry contains information on the differentiating bytes on the link to the Prime Data Element, a reference to the Prime Data Element, count of Duplicates & Derivatives and other metadata about the Prime Data Element. The leaf node data structure shown in FIG. 3G specifies (A) information pertaining to the Path from the root node to this leaf node, including all or a subset of the following components: the actual sequence of bytes from the Name to reach this leaf node, the number of bytes of the Name consumed to reach this node from the root node, an indication whether this number of bytes consumed is greater than some pre-specified threshold, and other metadata that describes the Path to this node and is useful for the content-associative search of the tree as well as for decisions relating to the construction of the tree, (B) the number of children the node has, and (C) for each child (wherein each child corresponds to a Prime Data Element under the leaf node) it specifies (1) Child ID, (2) number of differentiating bytes needed from the succeeding bytes of the Name in order to transition down this link of the tree to a Prime Data Element, (3) the specification for the actual value of the bytes from the Name that take it down this leg, (4) a reference to the Prime Data Element that terminates the tree on this path of the tree, (5) a count of how many duplicates and derivatives are pointing to this Prime Data Element (this is used to ascertain whether an entry can be deleted from the Sieve upon a deletion of data in the storage system), and (6) other metadata for the Prime Data Element including Size of Prime Data Element, etc.

In order to increase the efficiency with which fresh Prime Data Elements get installed into the tree, some embodiments incorporate an additional field into the leaf node data structure for each Prime Data Element that is kept at the leaf node of the tree. Note that when a fresh element has to be inserted into the tree, additional bytes of the Name or content of each of the Prime Data Elements in the subtree in question might be needed in order to decide where in the subtree to insert the fresh element, or whether to trigger a further partitioning of the subtree. The need for these additional bytes could require fetching several of the Prime Data Elements in question in order to extract the relevant differentiating bytes for each of these elements with respect to the fresh element. In order to reduce and optimize (and, in most cases, fully eliminate) the number of IOs needed for this task, the data structure in the leaf node includes a certain number of additional bytes from the Name of each Prime Data Element under that leaf node. These additional bytes are referred to as Navigation Lookahead bytes, and assist in sorting the Prime Data Elements with respect to a fresh incoming element. The Navigation Lookahead bytes for a given Prime Data Element are installed into the leaf node structure upon installation of the Prime Data Element into the Sieve. The number of bytes to be retained for this purpose could be chosen statically or dynamically using a variety of criteria, including the depth of the subtree involved and the density of Prime Data Elements in that subtree. For example, for Prime Data Elements being installed at shallow levels of the tree, the solution may add a longer Navigation Lookahead Field than for Prime Data Elements residing in a very deep tree. Also, when a fresh element is being installed into the Sieve, and if there are already many Prime Data Elements in the existing target subtree (with increased likelihood of an imminent repartitioning), then additional Navigation Lookahead bytes could be retained for the fresh Prime Data Element when it is being installed into the subtree.

FIG. 3H presents the leaf node data structure for a leaf node that includes the Navigation Lookahead field. This data structure specifies (A) information pertaining to the Path from the root node to this leaf node, including all or a subset of the following components: the actual sequence of bytes from the Name to reach this leaf node, the number of bytes of the Name consumed to reach this node from the root node, an indication whether this number of bytes consumed is greater than some pre-specified threshold, and other metadata that describes the Path to this node and is useful for the content-associative search of the tree as well as for decisions relating to the construction of the tree, (B) the number of children the node has, and (C) for each child (wherein each child corresponds to a Prime Data Element under the leaf node) it specifies (1) Child ID, (2) number of differentiating bytes needed from the succeeding bytes of the Name in order to transition down this link of the tree to a Prime Data Element, (3) the specification for the actual value of the bytes that take it down this leg, (4) a reference to the Prime Data Element that terminates the tree on this path of the tree, (5) the Navigation Lookahead fields that specify how many bytes of Navigation Lookahead are retained for the Prime Data Element, as well as the actual values of those bytes, (6) a count of how many duplicates and derivatives are pointing to this Prime Data Element (this is used to ascertain whether an entry can be deleted from the Sieve upon a deletion of data in the storage system), and (7) other metadata for the Prime Data Element including size of Prime Data Element, etc.

The foregoing descriptions of methods and apparatuses for representing and using tree nodes and leaf nodes have been presented only for purposes of illustration and description. They are not intended to be exhaustive or to limit the present invention to the forms disclosed. Accordingly, many modifications and variations will be apparent to practitioners skilled in the art.

Upon being presented a candidate element as input, the tree node and leaf node structures described above can be traversed and a content-associative lookup of the tree can be performed based upon the content of the candidate element. The Name of the candidate element will be constructed from the bytes of the candidate element just as the Name of a Prime Data Element was constructed from the content of the Prime Data Element when it was installed in the Sieve. Given an input candidate element, the method for content-associative lookup of the tree involves navigation of the tree structure using the Name of the candidate element, followed by subsequent analysis and screening to decide what to return as the result of the overall content-associative lookup. In other words, the tree navigation process returns a first outcome, and then analysis and screening is performed on that outcome to determine the result of the overall content-associative lookup.

If there are any Prime Data Elements with the same leading bytes of Name as the candidate, the tree will identify that subset of Prime Data Elements in the form of a subtree of elements denoted by a link. In general, each tree node or leaf node can store information that enables the tree navigation process to determine which outgoing link, if any, is to be selected to navigate to the next lower level in the tree based upon the corresponding bytes of the Name of the input element, and the identity of the node that is reached when the tree is navigated along the selected link. If each node contains this information, then the tree navigation process can recursively navigate down each level in the tree until no matches are found (at which point the tree navigation process can return a set of Prime Data Elements that exists in the subtree rooted at the current node) or a Prime Data Element is reached (at which point the tree navigation process can return the Prime Data Element and any associated metadata).

Once the tree navigation process has terminated, other criteria and requirements may be used to analyze and screen the outcome of the tree navigation process to determine what should be returned as the result of the overall content-associative lookup. First, one could pick the Prime Data Element with the most number of leading bytes from the Name in common with the candidate. Second, when either a single Prime Data Element or multiple Prime Data Elements are returned by the tree navigation process, there could be an additional requirement that they share a certain minimum number of bytes with the Name of the candidate element before qualifying to be returned as the result of the content-associative lookup (otherwise, the content-associative lookup returns a miss). Another example of a screening requirement could be that, if the tree navigation process terminates without reaching a single Prime Data Element so that multiple Prime Data elements (rooted at the node where the tree navigation terminated) are returned as the outcome of the tree navigation process, then these multiple Prime Data Elements will qualify to be returned as the result of the overall content-associative lookup only if the number of these elements is fewer than a certain specified limit such as 4-16 elements (otherwise, the content-associative lookup returns a miss). Combinations of multiple requirements may be employed to determine the result of the content-associative lookup. If multiple candidates still remain, one could examine Navigation Lookahead bytes and also associated metadata to decide which Prime Data Elements are the most suitable. If still unable to narrow the choice down to a single Prime Data Element, one could furnish multiple Prime Data Elements to the Derive function. In this manner, the lookup process will either report a "miss," or return a single Prime Data Element, or if not a single Prime Data Element, then a set of Prime Data Elements that are likely to be good starting points for deriving the candidate element.

The tree needs to be designed for efficient content-associative access. A well-balanced tree will provide a comparable depth of access for much of the data. It is expected that the upper few levels of the tree will often be resident in the processor cache, the next few levels in fast memory, and the subsequent levels in flash storage. For very large datasets, it is possible that one or more levels need to reside in flash storage and even disk.

Figure 4:
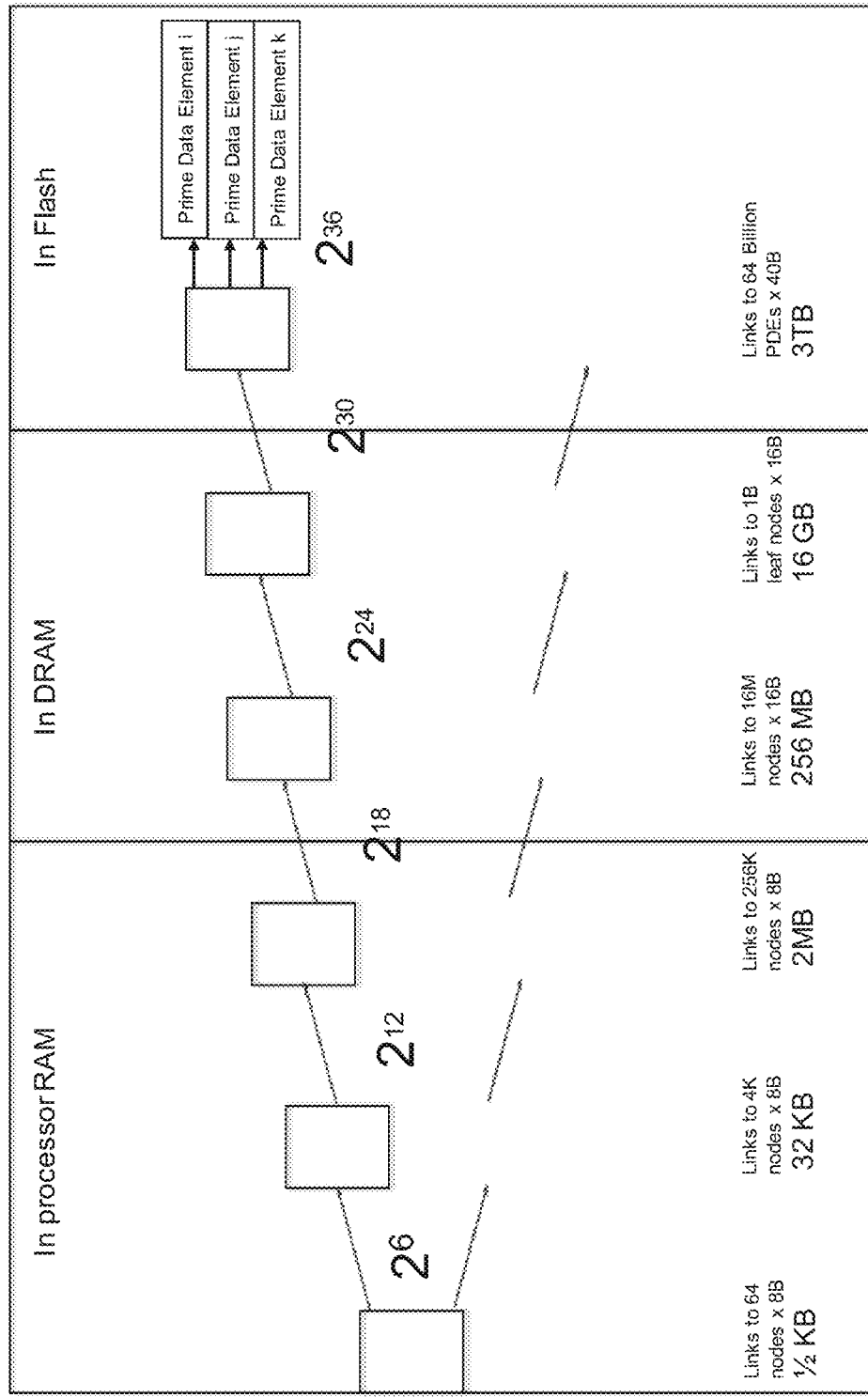
FIG. 4 shows an example of how 256 TB of prime data may be organized in tree form, and presents how the tree may be laid out in memory and storage in accordance with some embodiments described herein.

FIG. 4 shows an example of how 256 TB of prime data may be organized in tree form, and presents how the tree may be laid out in memory and storage in accordance with some embodiments described herein. Assuming an average fanout of 64 (which is $2^6$) children per node, the reference for a Prime Data Element can be accessed by reaching a leaf node data structure (e.g., as described in FIG. 3H) which is resident at (on average) the 6th level of the tree (i.e., after 5 link traversals or hops). So, such a structure at the 6th level of the tree, after 5 hops, will reside alongside another $2^{30}$ such nodes, each with an average of 64 children (these children are the references to the Prime Data Elements), thus accommodating approximately 64 billion Prime Data Elements. At an element size of 4 KB, this accommodates 256 TB of Prime Data Elements.

The tree can be laid out so that the 6 levels of the tree can be traversed as follows: 3 levels residing in on-chip cache (containing approximately four thousand "upper level" tree node data structures specifying transitions for links to approximately 256 K nodes), 2 levels in memory (containing 16 million "middle level" tree node data structures specifying transitions for links to 1 billion leaf nodes approximately), and the 6th level in flash storage (accommodating a billion leaf node data structures). The 1 billion leaf node data structures resident at this 6th level of the tree in flash storage furnish the references for the 64 billion Prime Data Elements (on average 64 elements per leaf node).

In the example shown in FIG. 4, at the 4th and 5th levels, each node devotes on average 16 bytes per element (1 byte for child ID, e.g., a 6-byte reference to the PDE, plus a byte for byte count, plus 8 bytes on average to specify actual transition bytes as well as some metadata). At the 6th level, each leaf node devotes on average 48 bytes per element (1 byte for child ID, 1 byte for byte count, 8 bytes to specify actual transition bytes, 6-byte reference to the Prime Data Element, 1 byte for count of derivatives off this Prime Data Element, 16 bytes of Navigation Lookahead, 2 bytes for size of Prime Data Element, as well as 13 bytes of other metadata), thus the total capacity in flash storage required for the tree (including the references to the Prime Data Elements, and including any metadata) is about 3 Terabytes. The total capacity required for the upper nodes of the tree is a smaller fraction of this size (since there are fewer nodes, and fewer bytes are needed to specify the tighter reference to the children nodes, and less metadata is required per node). In the example, the upper tree nodes devote on average 8 bytes per element (1 byte for child ID, 1 byte for byte count, plus 3-4 bytes on average to specify actual transition bytes, and 2-3 byte reference to the child node). Overall, in this example, a synthetic dataset with 256 TB of prime data is sorted into one billion groups using 3 TB (or 1.17% of 256 TB) of additional apparatus.

In the example shown in FIG. 4, where 256 TB of prime data contains 64 billion Prime Data Elements of 4 KB each, one needs fewer than 5 bytes (or 36 bits) of address to fully differentiate the 64 billion Prime Data Elements. From a content-associative standpoint, if the mix of data is such that an average of 4 bytes of progressive Name are consumed at each of the first 3 levels, and 8 bytes at each of the next 3 levels, a total of 36 bytes (288 bits) of Name (on average) would differentiate all the 64 billion Prime Data Elements. These 36 bytes would be less than 1% of the 4 KB that make up each element. If a Prime Data Element of 4 KB can be identified by 1% (or even 5-10%) of its bytes, then the rest of the bytes (which make up the majority of the bytes) could tolerate perturbations, and a candidate with such perturbations could still reach this Prime Data Element and be considered for derivation from it.

Note that the number of bytes needed on any given link (to differentiate the various subtrees below) will be governed by the actual data in the mix of elements that comprise the dataset. Likewise, the number of links out of a given node will also vary with the data. The self-describing tree node and leaf node data structures will declare the actual number and the values of the bytes needed for each link, as well as the number of links emanating from any node.

Further controls can be placed to limit the amount of cache, memory, and storage devoted at the various levels of the tree, to sort the input into as many differentiated groups as possible, within the allocated budget of incremental storage. To handle situations where there are densities and pockets of data that require very deep subtrees to fully differentiate the elements, such densities could be handled efficiently by grouping a larger set of related elements into a flat group at the $6^{th}$ level of the tree and performing a streamlined search and derivation upon these (by first examining the Navigation Lookahead and metadata to determine the best Prime Data Element, or else (as a fallback) looking only for duplicates rather than the full derivation that is afforded by the method for the rest of the data). This would circumvent the creation of very deep trees.

It is expected that a relatively small fraction of the total bytes from the Name of the element will often be sufficient to identify each Prime Data Element. Studies performed on a variety of real world datasets using the embodiments described herein confirm that a small subset of the bytes of a Prime Data Element serves to order the majority of the elements to enable the solution. Thus, such a solution is efficient in terms of the amount of storage that it requires for its operation.

In terms of accesses needed for the example from FIG. 4, once for every incoming 4 KB chunk of input (or candidate element), the scheme will need the following accesses to query the tree structure and reach a leaf node: three cache references, two memory references, plus a single IO from flash storage to access the leaf node data structure. This single IO from storage would fetch a 4 KB page which would hold information for a group of approximately 64 elements which would include the 48 bytes devoted to the Prime Data Element in question. These 48 bytes would include metadata on the Prime Data Element in question. This would conclude the tree lookup process. Subsequently, the number of IOs needed would depend upon whether the candidate element turns out to be a duplicate, a derivative, or a fresh Prime Data Element to be installed in the Sieve.

A candidate element that is a duplicate of a Prime Data Element will need 1 IO to fetch the Prime Data Element in order to verify the duplicate. Once the duplicate is verified, there will be one more IO to update the metadata in the tree. Hence, ingestion of duplicate elements will need two IOs after the tree lookup, for a total of 3 IOs.

A candidate element that fails the tree lookup and is neither a duplicate nor a derivative requires 1 more IO to store the element as a new Prime Data Element in the Sieve, and another IO to update the metadata in the tree. Thus, ingestion of a candidate element that fails the tree lookup will require 2 IOs after the tree lookup, leading to a total of 3 IOs. However, for candidate elements where the tree lookup process terminates without needing a storage IO, a total of only 2 IOs is needed for ingesting such candidate elements.

A candidate element that is a derivative (but not a duplicate) will first need 1 IO to fetch the Prime Data Element needed to compute the derivation. Since it is expected that most often derivations will be off a single Prime Data Element (rather than multiple), only a single IO will be needed to fetch the Prime Data Element. Subsequent to successful completion of the derivation, 1 more IO will be needed to store the Reconstitution Program and the derivation details in the entry created for the element in storage, and another IO to update the metadata in the tree (such as counts, etc.) to reflect the new derivative. Hence, ingestion of a candidate element that becomes a derivative requires 3 additional IOs after the first tree lookup for a total of 4 IOs.

In summary, to ingest a candidate element and apply the Data Distillation™ method to it (while exploiting redundancy globally across a very large dataset) requires approximately 3 to 4 IOs. Compared to what is needed by traditional data deduplication techniques, this is typically just one more IO per candidate element, in return for which redundancy can be exploited globally across the dataset at a grain that is finer than the element itself.

A storage system that offers 250,000 random IO accesses/sec (which means bandwidth of 1 GB/sec of random accesses to pages of 4 KB) could ingest and perform the Data Distillation™ method on about 62,500 input chunks per second (250,000 divided by 4 IOs per input chunk of average size 4 KB each). This enables an ingest rate of 250 MB/sec while using up all the bandwidth of the storage system. If only half of the bandwidth of the storage system is used (so that the other half is available for accesses to the stored data), such a Data Distillation™ system could still deliver ingest rates of 125 MB/sec. Thus, given sufficient processing power, Data Distillation™ systems are able to exploit redundancy globally across the dataset (at a grain that is finer than the element itself) with an economy of IOs and deliver data reduction at ingest rates in the hundreds of megabytes per second on contemporary storage systems.

Thus, as confirmed by the test results, embodiments described herein achieve the complex task of searching for elements (from which an input element can be derived with minimal storage needed to specify the derivation) from a massive store of data with an economy of IO accesses and with minimal incremental storage needed for the apparatus. This framework thus constructed makes it feasible to find elements suitable for derivation using a smaller percentage of the total bytes of the element, leaving the bulk of the bytes available for perturbation and derivation. An important insight that explains why this scheme works effectively for much data is that the tree provides a wieldy, fine-grained structure that allows one to locate the differentiating and distinguishing bytes that identify elements in the Sieve, and although these bytes are each at different depths and positions in the data, they can be isolated and stored efficiently in the tree structure.

Figure 5B:
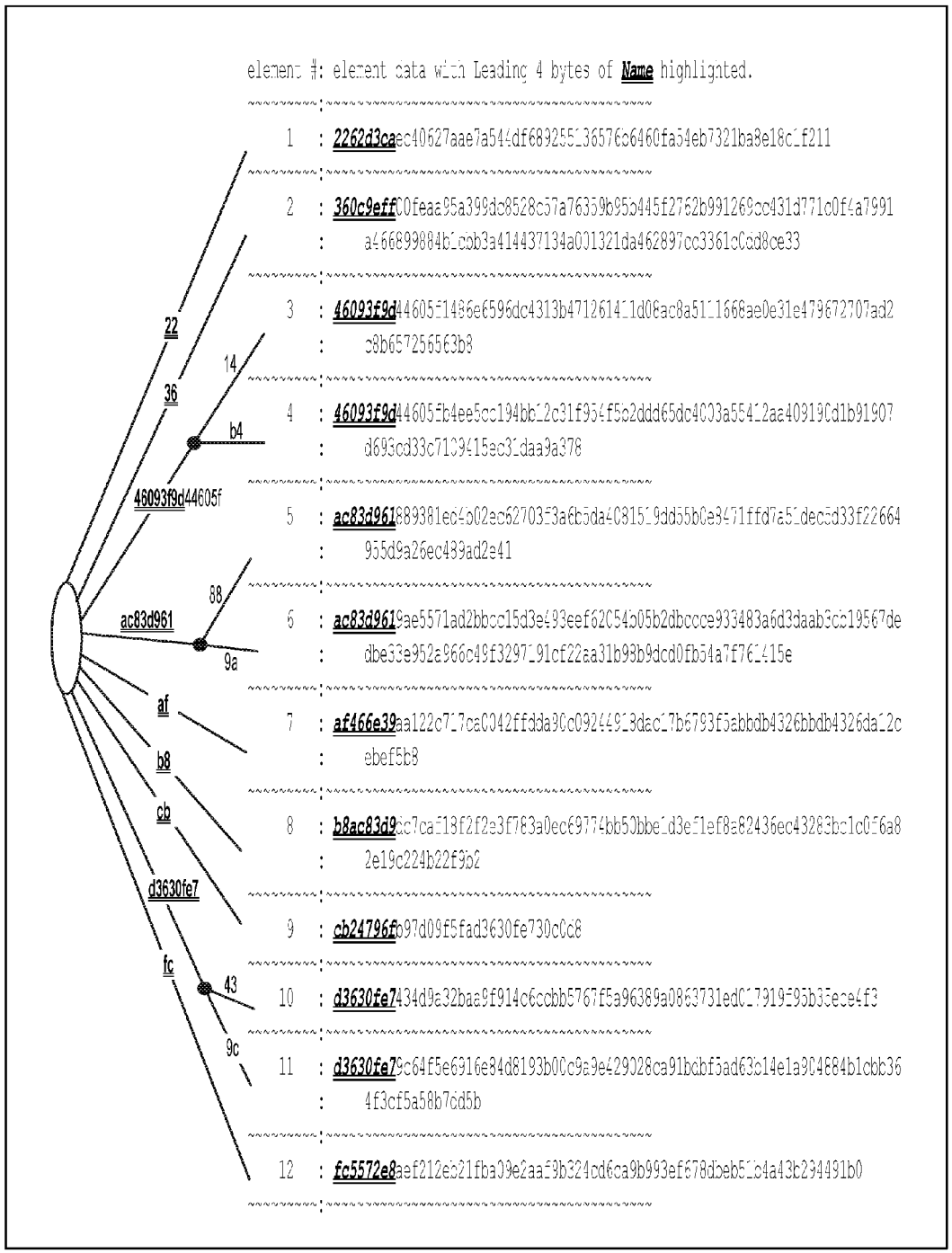
Figure 5C:
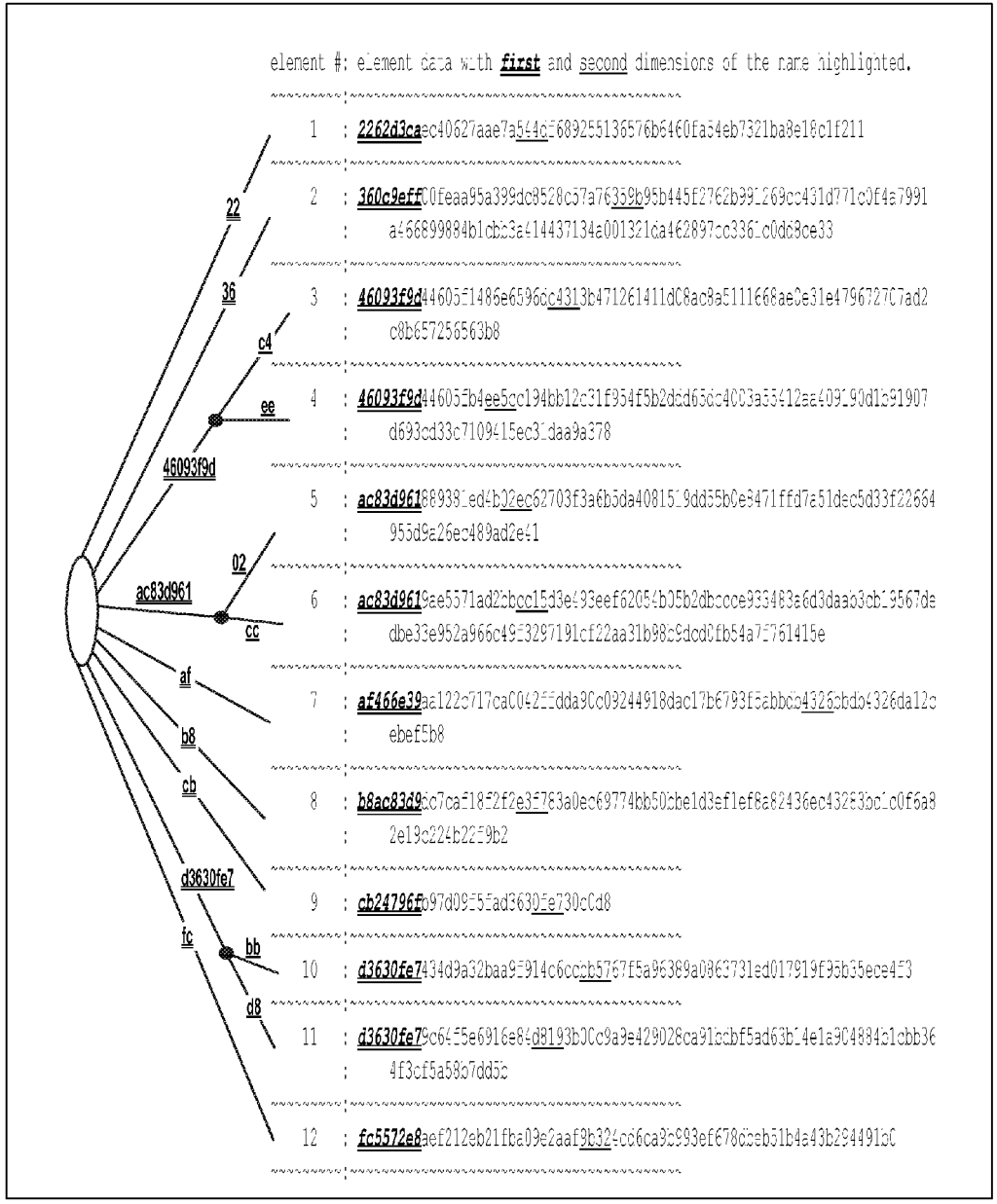

FIGS. 5A-5C illustrate an actual example of how data can be organized using embodiments described herein. FIG. 5A illustrates 512 bytes of input data, and the result of factorization (e.g., the result of performing operation 202 in FIG. 2). In this example fingerprinting is applied to determine breaks in the data, so that consecutive breaks identify candidate elements. Alternating candidate elements have been shown using bold and regular font. For example, the first candidate element is "b8ac83d9dc7caf18f2f2e3f783a0ec69774bb50bbe1d3ef1ef8a82436ec43283 bc1c0f6a82e19c224b22f9b2," and the next candidate element is "ac83d9619ae5571ad2bbcc15d3e493eef62054b0 5b2dbccce933483a6d3daab3cb19567dedbe33e952a966c49 f3297191cf22aa3 1b98b9dcd0fb54a7f761415e," and so forth. The input in FIG. 5A is factorized into 12 variable-sized candidate elements as shown. The leading bytes of each chunk are used to order and organize elements in the Sieve. FIG. 5B illustrates how the 12 candidate elements shown in FIG. 5A can be organized as Prime Data Elements in the Sieve in tree form using their Names, and using a tree structure described in FIG. 3B. Each element has a distinct Name, constructed from the entire content of the element. In this example, since fingerprinting is applied to determine the breaks between the 12 candidate elements, the leading bytes of each candidate element will already be aligned to an anchor fingerprint; hence, the leading bytes of each Name will already have been constructed from a first dimension of content anchored at this fingerprint. The leading bytes of the Name organize the various elements. For example, if the first byte in the Name of the element is equal to "0x22" then the top link is taken to select Prime Data Element #1. Note that various links in FIG. 5B are differentiated using a varying number of bytes as explained in reference to the tree data structure illustrated in FIG. 3B.

FIG. 5C illustrates how the 12 candidate elements shown in FIG. 5A can be organized using a tree data structure described in reference to FIG. 3D. Fingerprinting is further applied to the content of each element to identify a secondary fingerprint within the content of the element. Bytes of content extracted from the location of the first fingerprint (already existing at the boundary of each element) and second fingerprint are concatenated to form the leading bytes of the Name, which are used to organize the elements. In other words, the element Name is constructed as follows: bytes of data from two dimensions or fields (located by an anchor fingerprint and a secondary fingerprint respectively) are concatenated to form the leading bytes of the Name, followed by the rest of the bytes. As a consequence of this choice of construction of the Name, a different sequence of bytes leads to the various Prime Data Elements in FIG. 5C (vs. FIG. 5B). For example, to reach Prime Data Element #4, the tree navigation process first takes the link corresponding to "46093f9d" which are the leading bytes of the field at the first dimension (i.e., the first fingerprint), and then takes the link corresponding to "c4" which is the leading byte of the field located at the second dimension (i.e., the second fingerprint).

Figure 6A:
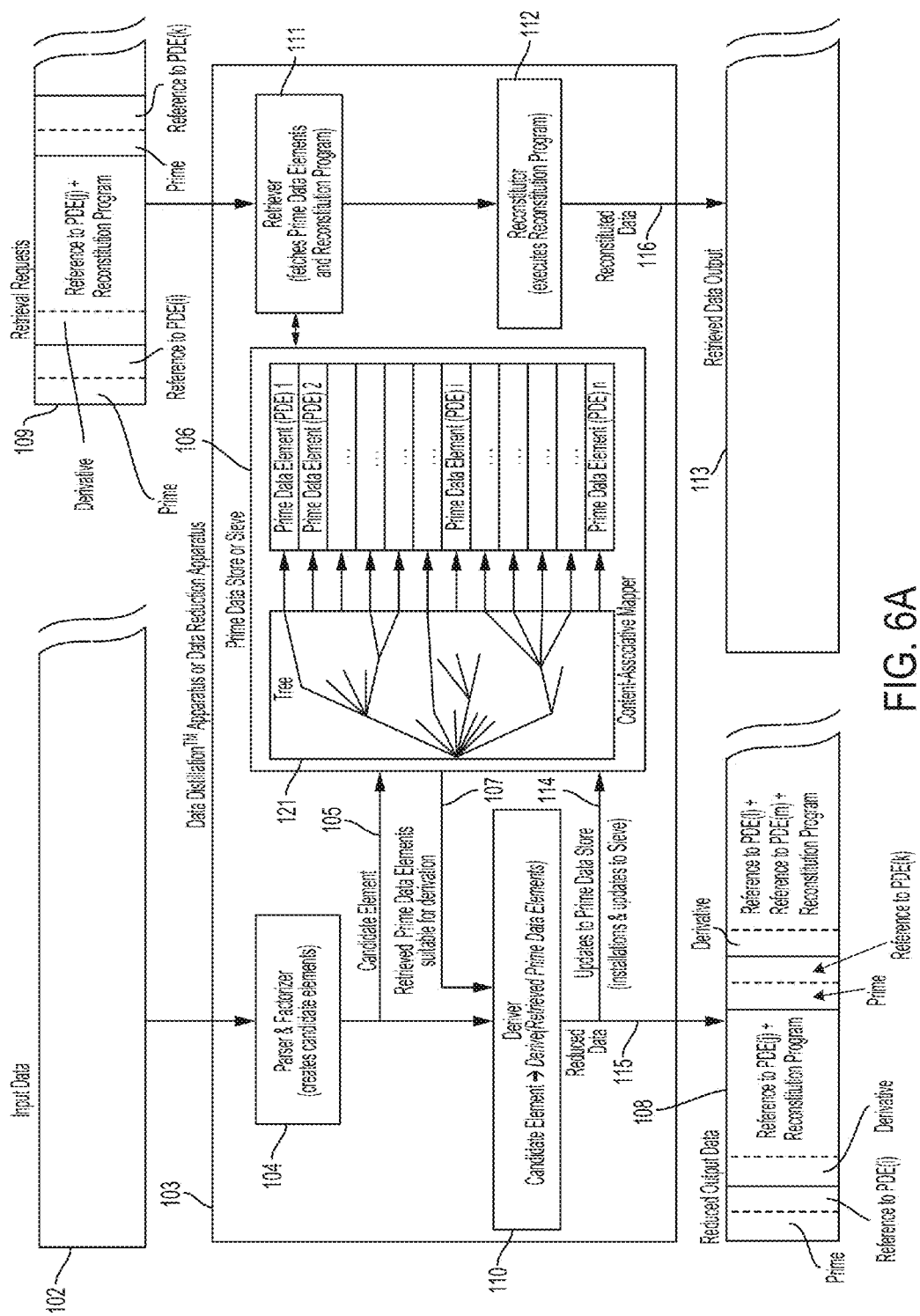
FIGS. 6A-6C show how tree data structures can be used for content-associative mappers described in reference to FIGS. 1A-1C, respectively, in accordance with some embodiments described herein.
Figure 6B:
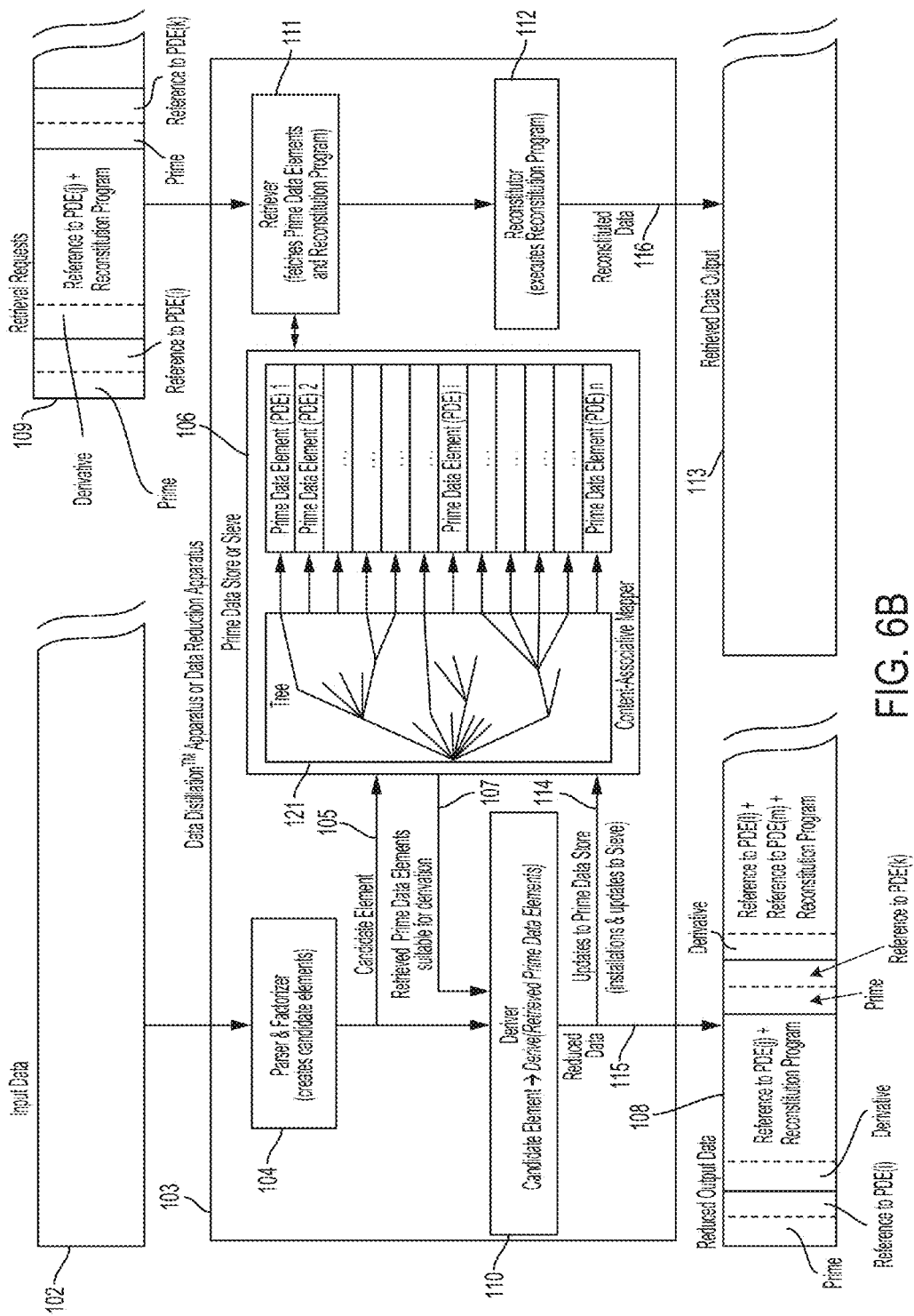
Figure 6C:
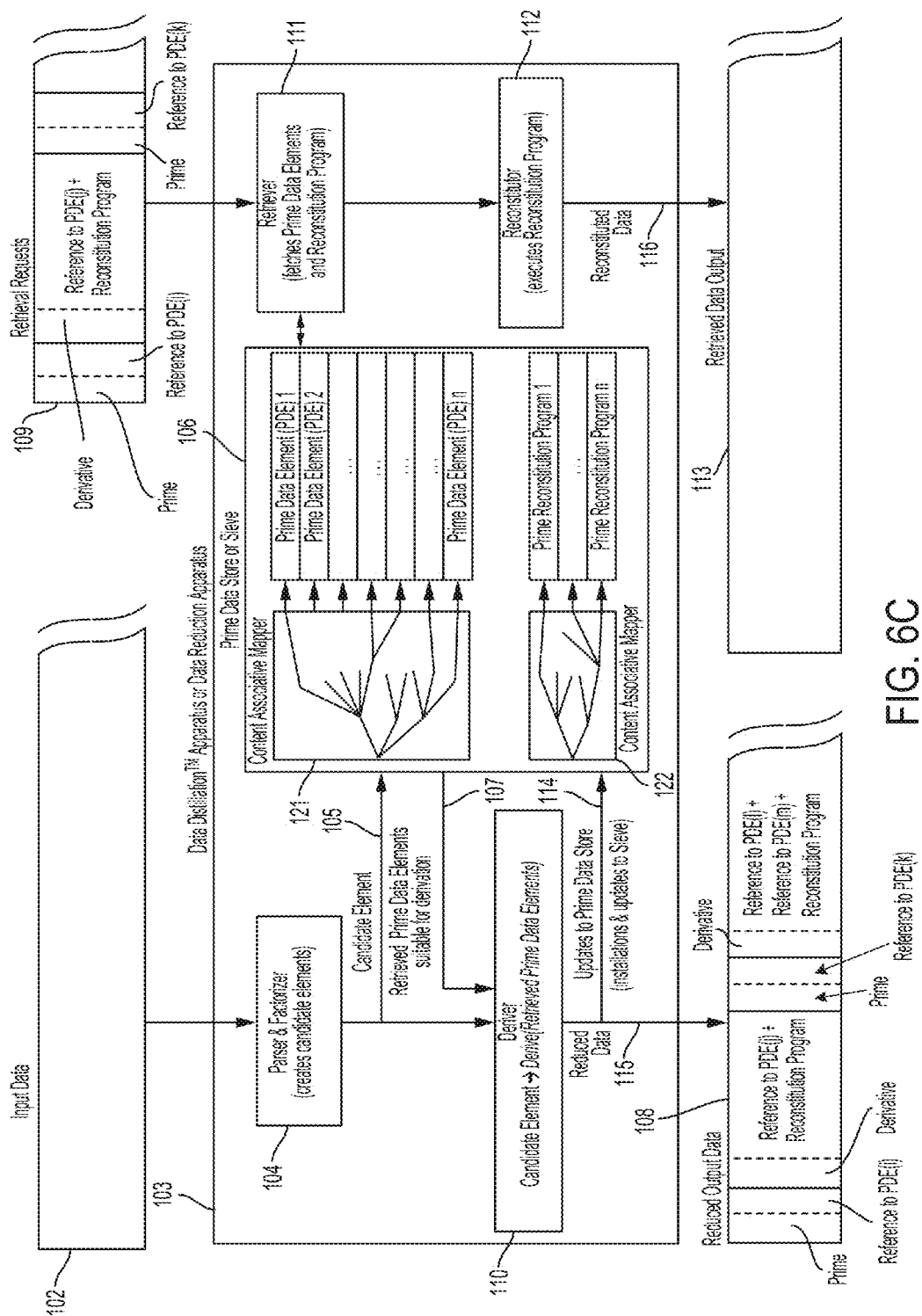

FIGS. 6A-6C show how tree data structures can be used for content-associative mappers 121 and 122 described in reference to FIGS. 1A-1C, respectively, in accordance with some embodiments described herein.

Once the difficult problem of finding suitable Prime Data Elements (from which to attempt to derive the candidate element) has been solved, the problem is narrowed down to examining one or a small subset of Prime Data Elements and optimally deriving the candidate element from them with minimum storage needed to specify the derivation. Other objectives include keeping the number of accesses to the storage system to a minimum, and keeping the derivation time and the reconstitution time acceptable.

The Deriver must express the candidate element as the result of transformations performed on the one or more Prime Data Elements, and must specify these transformations as a Reconstitution Program which will be used to regenerate the derivative upon data retrieval. Each derivation may require its own unique program to be constructed. The function of the Deriver is to identify these transformations and create the Reconstitution Program with the smallest footprint. A variety of transformations could be employed, including arithmetic, algebraic, or logical operations performed upon the entire Prime Data Element or upon specific fields of it. Additionally, one could use byte manipulation transformations, such as the concatenation, insertion, replacement, and deletion of bytes in the Prime Data Element.

FIG. 7A provides an example of the transformations that could be specified in the Reconstitution Program in accordance with some embodiments described herein. The vocabulary of transformations specified in this example includes arithmetic operations on fields of specified length in the element, as well as insertions, deletions, appends, and replacements of a declared length of bytes at specified offsets in the Prime Data Element. A variety of techniques and operations could be employed by the Deriver to detect the similarities and the differences between the candidate element and the one or more Prime Data Elements, and to construct the Reconstitution Program. The Deriver could exploit the vocabulary available in the underlying hardware to perform its function. The end result of the work is to specify the transformations in the vocabulary specified for the Reconstitution Program, and to do so using a minimal amount of incremental storage and in a manner that also enables fast data retrieval.

The Deriver could avail of the processing power of the underlying machine and work within the processing budget allocated to it to provide the best analysis possible within the cost-performance constraints of the system. Given that microprocessor cores are more readily available than IO accesses to storage, the Data Distillation™ solution takes advantage of the processing power of contemporary microprocessors to efficiently perform local analysis and derivation of the content of the candidate element off a few Prime Data Elements. It is expected that the performance of the Data Distillation™ solution (on very large data) will be rate-limited not by the computational processing but by the IO bandwidth of a typical storage system. For example, it is expected that a couple of microprocessor cores will suffice to perform the required computation and analysis to support ingest rates of several hundred megabytes per second on a typical flash-based storage system supporting 250,000 IOs/sec. Note that two such microprocessor cores from a contemporary microprocessor such as the Intel Xeon Processor E5-2687W (10 cores, 3.1 GHz, 25 MB cache) is a fraction (two of ten) of the total computational power available from the processor.

Figure 7B:
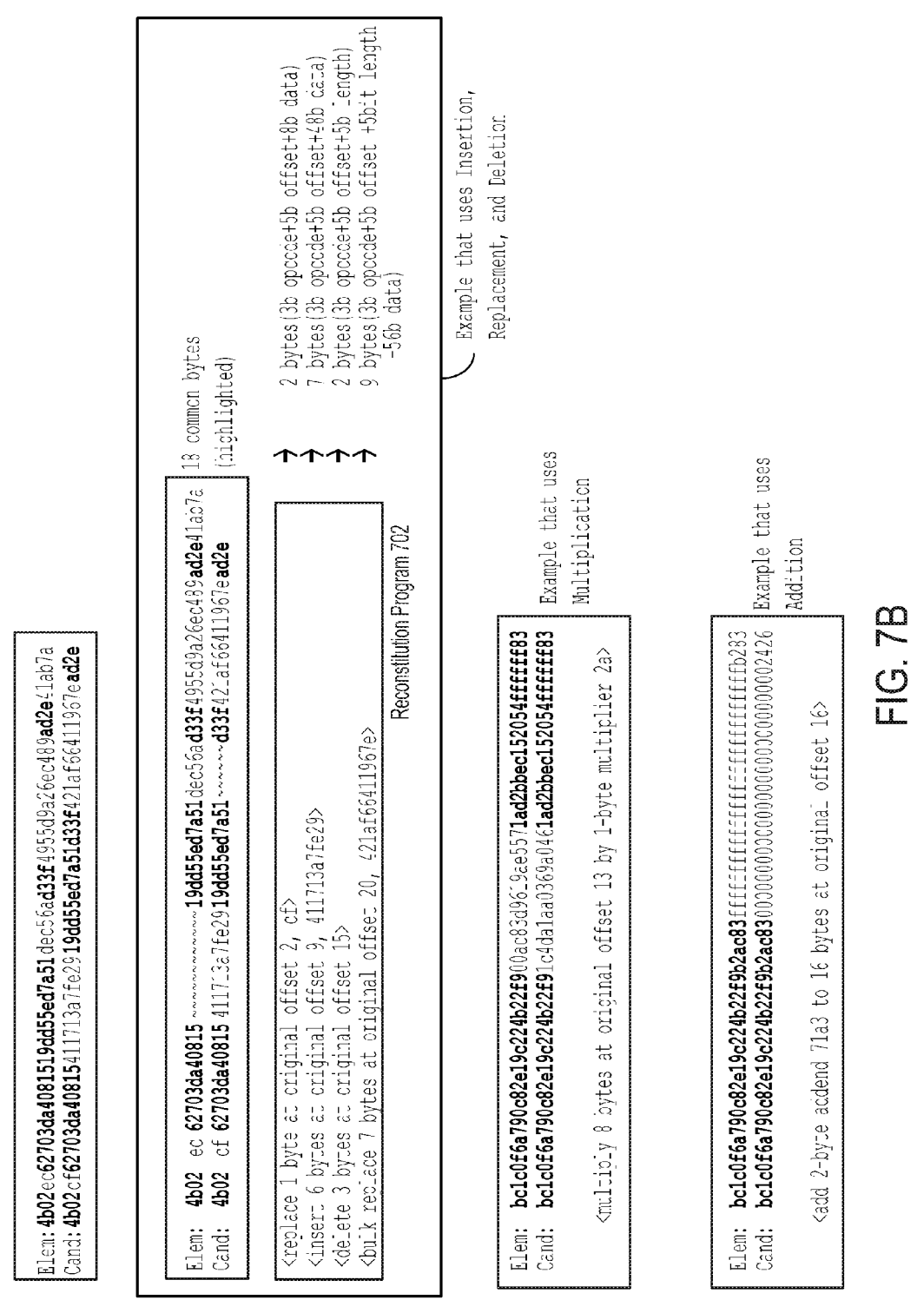

FIG. 7B shows examples of the results of candidate elements being derived from Prime Data Elements in accordance with some embodiments described herein. Specifically, the data pattern "Elem" is the Prime Data Element that is stored in the Prime Data Store, and the data pattern "Cand" is the candidate element that is to be derived from the Prime Data Element. The 18 common bytes between "Cand" and "Elem" have been highlighted. Reconstitution program 702 specifies how data pattern "Cand" can be derived from data pattern "Elem." As shown in FIG. 7B, Reconstitution program 702 illustrates how to derive "Cand" from "Elem" by using 1 byte Replace, 6 bytes Insert, 3 bytes Delete, 7 bytes bulk Replace. Cost to specify the derivative is 20 bytes+3 byte reference=23 bytes, which is 65.71% of the original size. Note that the Reconstitution Program 702 shown is a human-readable representation of the program and may not be how the program is actually stored by embodiments described herein. Likewise other Reconstitution Programs based on arithmetic operations such as multiplication and addition have also been shown in FIG. 7B. For example, if "Elem" is bc1c0f6a790c82e19c224b22f900ac83d9619ae5571ad2bbe c152054ffffff83 and "Cand" is bc1c0f6a790c82e19c224b22f91c4da1aa0369a0461ad2bbec 152054ffffff83, then the 8-byte difference can be derived as shown using multiply (00ac83d9619ae557)*2a=[00] 1c4da1aa0369a046. The cost to specify the derivative: 4 bytes+3 byte reference=7 bytes, which is 20.00% of the original size. Alternatively, if "Elem" is bc1c0f6a790c82e19c224b22f9b2ac83ffffffffffffffffffffffff ffb283, and "Cand" is bc1c0f6a790c82e19c224b22f9b2ac8300000000000000000 000000000002426, then the 16-byte difference can be derived as shown using addition, e.g., by adding 0x71a3 to the 16-byte region starting at offset 16, and discarding the carry. The cost to specify the derivative is 5 bytes+3 byte reference=8 bytes, which is 22.85% of the original size. Note that the sample encodings in FIG. 7A have been chosen for illustration purposes only. The examples in FIG. 7B have data sizes of 32 bytes, and so 5 bits suffice for the length and offset fields within the element. For large elements (e.g., a 4 KB element), the sizes of these fields would need be increased to 12 bits. Likewise, the sample encoding accommodates a reference size of 3 bytes or 24 bits. This should allow 16 million Prime Data Elements to be referenced. If the reference needs to be able to address any location in, say, 256 TB of data, the reference would need to be 6 bytes in size. When such a dataset is factorized into 4 KB elements, the 6 bytes needed to specify the reference will be a small fraction of the size of the 4 KB element.

The size of the information needed to specify the Derivative element (that is derived from the one or more Prime Data Elements) is the sum of the size of the Reconstitution Program and the size of the references needed to specify the required (one or more) Prime Data Elements. The size of the information needed to specify a candidate element as a Derivative element is referred to as the Distance of the candidate from the Prime Data Element. When the candidate can be feasibly derived from any one of multiple Prime Data Elements, the Prime Data Element with the shortest Distance is chosen as the target.

When the candidate element needs to be derived from more than one Prime Data Element (by assembling extracts derived from each of these), the Deriver needs to factorize the cost of the additional accesses to the storage system and weigh that against the benefit of a smaller Reconstitution Program and a smaller Distance. Once an optimal Reconstitution Program has been created for a candidate, its Distance is compared with the Distance Threshold; if it does not exceed the threshold, the derivation is accepted. Once a derivation is accepted, the candidate element is reformulated and replaced by the combination of the Prime Data Element and the Reconstitution Program. The entry in the reduced output created for the candidate element is replaced by the Reconstitution Program plus the one or more references to the relevant Prime Data Elements. If the Distance for the best derivation exceeds the Distance Threshold, the derivative will not be accepted.

In order to yield data reduction, the Distance Threshold must always be less than the size of the candidate element. For example, the Distance Threshold may be set to 50% of the size of the candidate element, so that a derivative will only be accepted if its footprint is less than or equal to half the footprint of the candidate element, thereby ensuring a reduction of 2× or greater for each candidate element for which a suitable derivation exists. The Distance Threshold can be a predetermined percentage or fraction, either based on user-specified input or chosen by the system. The Distance Threshold may be determined by the system based on static or dynamic parameters of the system.

FIGS. 8A-8E illustrate how data reduction can be performed by factorizing input data into fixed-sized elements and organizing the elements in a tree data structure that was described in reference to FIGS. 3D and 3E in accordance with some embodiments described herein. FIG. 8A shows how the input data can be simply factorized into 32-byte chunks. Specifically, FIG. 8A shows the first 10 chunks, and then few more chunks which appear say 42 million chunks later. FIG. 8B shows the organization of the Prime Data Elements in the Sieve using Names constructed such that the leading bytes of the Name are comprised of content from 3 dimensions in the content of the element (corresponding to locations of an anchor fingerprint, a secondary fingerprint, and a tertiary fingerprint). Specifically, in FIG. 8B, each 32 byte chunk becomes a candidate element of 32 bytes (Fixed-Sized Blocks). A method of fingerprinting is applied to the content of the element. Each element has a Name, which is constructed as follows: bytes of data from three dimensions or fields (located by an anchor fingerprint, a secondary fingerprint, and a tertiary fingerprint respectively) of the element are concatenated to form the leading bytes of the Name, followed by the rest of the bytes of the element. The Name is used to organize elements in the Sieve. As shown in FIG. 8B, the first 10 chunks contain no duplicates or derivatives, and are successively installed as elements in the Sieve. FIG. 8B shows the Sieve after the 10$^{th}$ chunk is consumed. FIG. 8C shows the contents of the Sieve at a subsequent point in time after consuming an additional several million elements of data input, e.g., after the next 42 million chunks are presented. The Sieve is examined for duplicates or derivatives. Chunks that cannot be derived from elements get installed in the Sieve. FIG. 8C shows the Sieve after the 42 million chunks are consumed, containing say 16,000,010 elements (logically addressable with 3 bytes of reference address), with the remaining 26,000,000 chunks becoming derivatives. FIG. 8D shows an example of fresh input that is subsequently presented to the Sieve and identified as a duplicate of an entry (shown as element number 24,789) in the Sieve. In this example, the Sieve identifies element 24,789 (chunk 9) as the most suitable element for chunk 42,000,011. The derive function determines that the new chunk is an exact duplicate and replaces it with a reference to element 24,789. The cost to represent the derivative is 3 byte reference vs 35B original, which is 8.57% of the original size. FIG. 8D shows a second example of an input (Chunk 42,000,012) that is converted into a derivative of an entry (shown as element number 187,126) in the Sieve. In this example, the Sieve determines that there are no exact matches. It identifies elements 187,125 and 187,126 (chunks 8 & 1) as the most suitable elements. The new element is derived from the most suitable element. Derivation vs element 187,125 and derivation vs element 187,126 are illustrated in FIG. 8D. The cost to represent the derivative vs element 187,125 is 39 bytes+3 byte reference=42 bytes, which is 120.00% of the original size. The cost to represent the derivative vs element 187,126 is 12 bytes+3 byte reference=15 bytes, which is 42.85% of the original size. The best derivation (vs element 187,126) is chosen. The reconstitution size is compared to a threshold. For example if the threshold is 50%, this derivative (42.85%) is accepted. FIG. 8E provides two additional examples of data chunks that are derived from Prime Data Elements, including one example where the derivative is actually created by deriving from two Prime Data Elements. In the first example, chunk 42,000,013 is presented. The Sieve identifies element 9,299,998 (chunk 10) as the most suitable element. Derivation vs element 9,299,998 is shown in FIG. 8E. The cost to represent the derivative is 4 bytes+3 byte reference=7 bytes, which is 20.00% of the original size. The reconstitution size is compared to a threshold. For example if the threshold is 50%, this derivative (20.00%) is accepted. In the second example, chunk 42,000,014 is presented. In this example, chunk 42,000,014 is such that one half of the chunk can be best derived from element 9,299,997 while the other half of the chunk can be best derived from element 9,299,998. Hence, a multi-element derivative is created to yield further data reduction. The multi-element derivation is shown in FIG. 8E. Cost to represent this multi-element derivative is 3 byte reference+3 bytes+3 byte reference=9 bytes, which is 25.71% of the original size. The reconstitution size is compared to a threshold, e.g., if threshold is 50%, this derivative (25.71%) is accepted. Note that the best outcome from a single element derivative would have been 45.71%.

FIGS. 8A-E illustrate an important advantage of the Data Distillation™ system: that it can be effective in performing data reduction while consuming and producing fixed-sized blocks. Note that fixed-sized blocks are highly desired in a high-performance storage system. Using the Data Distillation™ apparatus, a large incoming input file comprised of numerous blocks of fixed size can be factorized into numerous elements of fixed size, so that all the Prime Data Elements are of fixed size. The potentially variable-sized Reconstitution Programs for each derivative element can be packed together and kept in-line in the Reduced Output file, which can subsequently be chunked into fixed-sized blocks. Thus, for all practical purposes, powerful data reduction can be performed while consuming and producing fixed-sized blocks in the storage system.

FIGS. 9A-C illustrate an example of the Data Distillation™ scheme that was first shown in FIG. 1C: this scheme employs a separate Prime Reconstitution Program Store that can be accessed in a content-associative manner. Such a structure enables the detection of a derivative that constructs a Reconstitution Program that is already present in the Prime Reconstitution Program Store. Such a derivative can be reformulated to reference the existing Reconstitution Program. This enables the detection of redundancy among Reconstitution Programs. In FIG. 9A, input data is ingested. A method of fingerprinting is applied to the data, and chunk boundaries are set at the fingerprint positions. The input is factorized into 8 candidate elements as shown (alternating chunks shown in bold and regular font in FIG. 9A). In FIG. 9B, the 8 candidate elements are shown as organized in the Sieve. Each element has a distinct Name, constructed from the entire content of the element. In this example, the element Name is constructed as follows: bytes of data from two dimensions or fields (located by an anchor fingerprint and a secondary fingerprint, respectively) are concatenated to form the leading bytes of the Name, followed by the rest of the bytes. The Name is used to order elements in the Sieve, and also provide content-associative access to it through a tree structure. FIG. 9B also shows a second content-associative structure that contains Prime Reconstitution Programs. FIG. 9C illustrates duplicate reconstitutions. Suppose a 55-byte candidate element (shown in FIG. 9C) that is not a duplicate of any Prime Data Element arrives. Element 3 is selected as the most suitable element—the first 2 dimensions are the same for PDEs 2 and 3, but the rest of the bytes starting with 88a7 match Element 3. The new input is derived from Element 3 with a 12-byte Reconstitution Program (RP). Encodings are as shown in FIG. 7A. Note that, for this example, max element size is 64 bits and all offsets and lengths are encoded as 6-bit values, as opposed to the 5-bit lengths and offsets shown in FIG. 7A. The RP store is searched and this new RP is not found. This RP is inserted into the Prime RP store, ordered based on its value. The new element is reformulated as a reference to Prime Data Element 3 and a reference to the newly created Prime Reconstitution Program at reference 4 in the RP store. The total storage size for this derived element is: 3-byte PDE reference, 3-byte RP reference, 12-byte RP=18 bytes, which is 31.0% of the size vs. storing it as a PDE. Later, suppose a copy of the 55-byte candidate element arrives. As before, a 12-byte RP is created based on Element 3. The RP store is searched and the RP with Prime RP ID=3, RP reference=4, is found. This candidate element is represented in the system as a reference to Prime Data Element 3 and a reference to Reconstitution Program 4. The total storage size added for this derived element is now: 3-byte PDE reference, 3-byte RP reference=6 bytes, which is 10.3% of the size vs. storing it as a PDE.

Figure 10C:
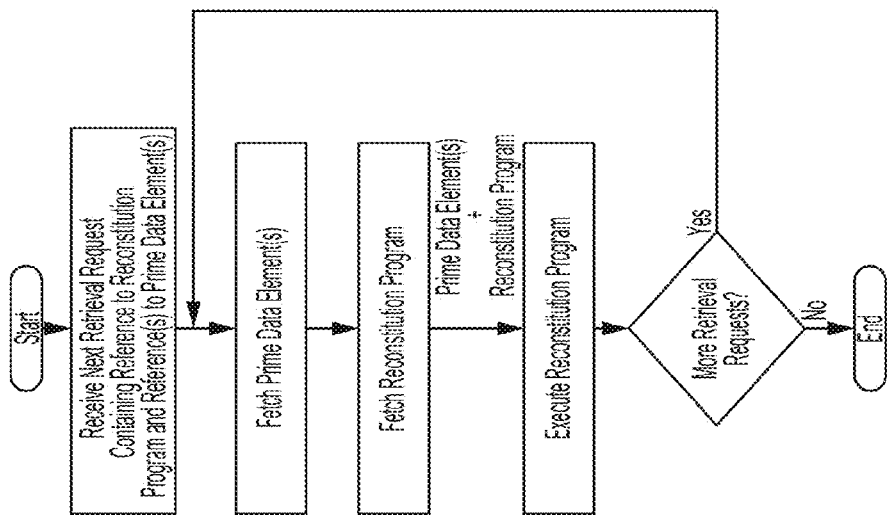
FIGS. 10B-10C illustrate data retrieval processes in accordance with some embodiments described herein.
Figure 10B:
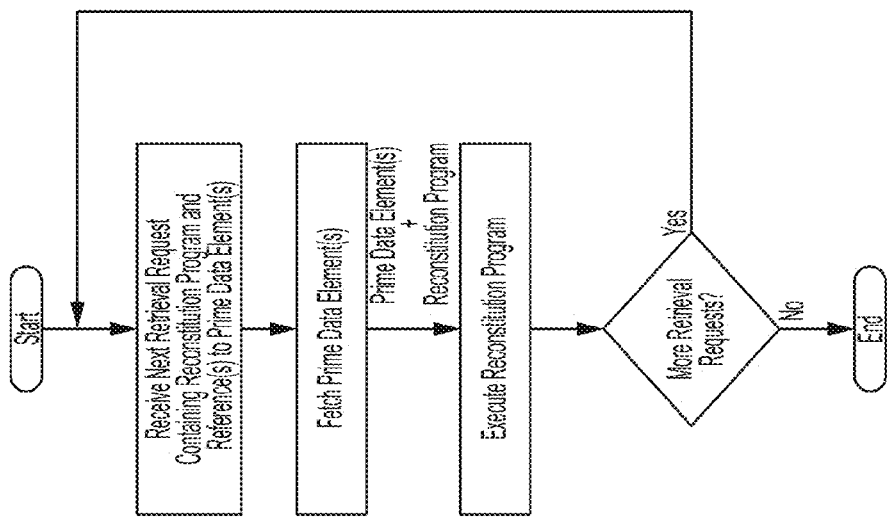

FIG. 10A provides an example of how transformations specified in the Reconstitution Program are applied to a Prime Data Element to yield a Derivative Element in accordance with some embodiments described herein. The example shows a Derivative Element specified to be generated from Prime Data Element numbered 187,126 (this Prime Data Element is also shown in the Sieve in FIG. 8C) by applying to it four transformations (an insertion, replacement, deletion, and append) as specified by the Reconstitution Program shown. As shown in FIG. 10A, element 187,126 is loaded from the Sieve, and the Reconstitution Program is executed to derive chunk 42,000,012 from element 187,126. FIGS. 10B-10C illustrate data retrieval processes in accordance with some embodiments described herein. After the relevant Prime Data Elements and Reconstitution Program have been fetched, the effort required by the data retrieval process to execute the reconstitution is linear with respect to the size of the Reconstitution Program and the size of the Prime Data Elements. Hence, high data retrieval rates can be achieved by the system.

Figure 11G:
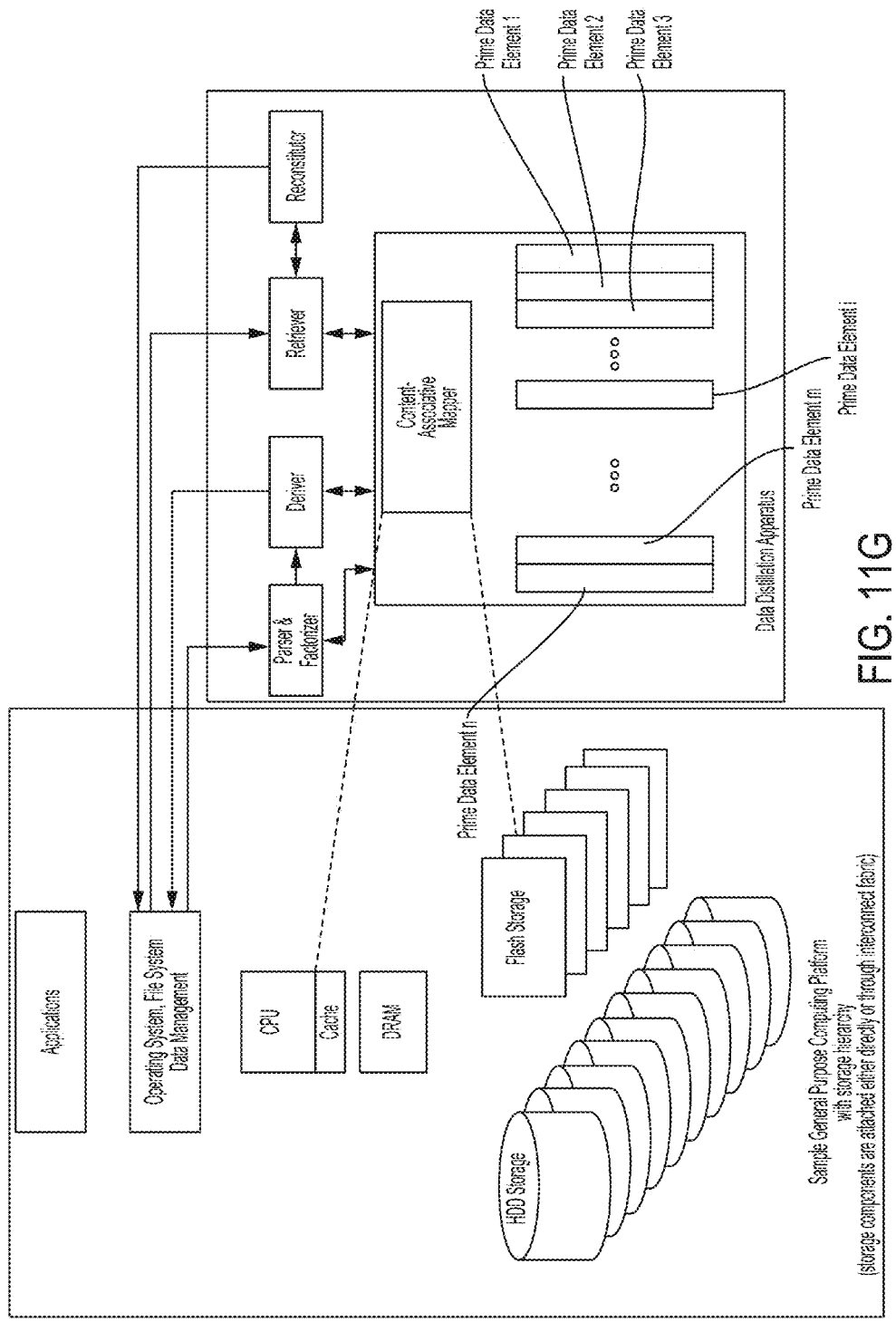

The Data Distillation™ apparatus can be integrated into computer systems in a variety of ways to organize and store data in a manner that efficiently uncovers and exploits redundancy globally across the entire data in the system. FIGS. 11A-11G illustrate systems that include a Data Distillation™ mechanism (which can be implemented using software, hardware, or a combination thereof) in accordance with some embodiments described herein. FIG. 11A presents a general purpose computing platform with software applications running on system software executing on a hardware platform comprised of processors, memory and data storage components. FIG. 11B shows the Data Distillation™ apparatus integrated into the application layer of the platform, with each specific application using the apparatus to exploit redundancy within the dataset for that application. FIG. 11C shows the Data Distillation™ apparatus employed to provide a data virtualization layer or service for all applications running above it. FIGS. 11D and 11E show two different forms of integration of the Data Distillation™ apparatus with the operating system, file system and data management services of the sample computing platform. Other methods of integration include (but are not limited to) integration with an embedded computing stack in the hardware platform such as that employed in a flash-based data storage subsystem as shown in FIG. 11F.

FIG. 11G presents additional details of the integration of the Data Distillation™ apparatus with the sample computing platform shown in FIG. 11D. FIG. 11G shows the components of the Data Distillation™ apparatus, with the Parser & Factorizer, Deriver, Retriever, and Reconstitutor executing as software on the general purpose processor, and the content-associative mapping structure residing across a few levels of the storage hierarchy. The Prime Data Store can reside in the storage media (such as flash-based storage drives).

Figure 11H:
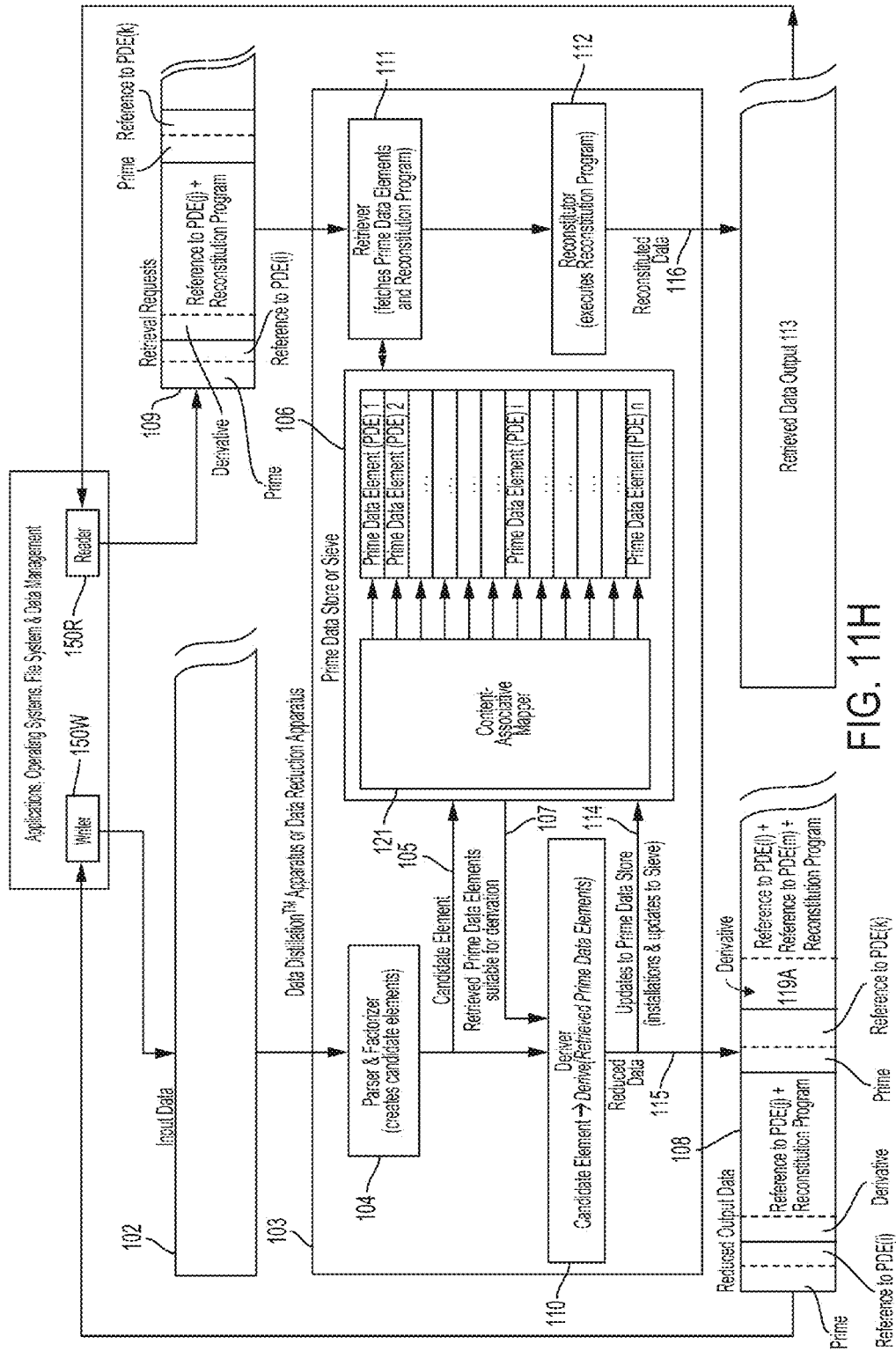
FIG. 11H shows how the Data Distillation™ apparatus may interface with a sample general purpose computing platform in accordance with some embodiments described herein.

FIG. 11H shows how the Data Distillation™ apparatus may interface with the sample general purpose computing platform.

A file system (or filesystem) associates a file (e.g., a text document, a spreadsheet, an executable, a multimedia file, etc.) with an identifier (e.g., a filename, a file handle, etc.), and enables operations (e.g., read, write, insert, append, delete, etc.) to be performed on the file by using the identifier associated with the file. The namespace implemented by a file system can be flat or hierarchical. Additionally, the namespace can be layered, e.g., a top-layer identifier may be resolved into one or more identifiers at successively lower layers until the top-layer identifier is completely resolved. In this manner, a file system provides an abstraction of the physical data storage device(s) and/or storage media (e.g., computer memories, flash drives, disk drives, network storage devices, CD-ROMs, DVDs, etc.) that physically store the contents of the file.

The physical storage devices and/or storage media that are used for storing information in a file system may use one or multiple storage technologies, and can be located at the same network location or can be distributed across different network locations. Given an identifier associated with a file and one or more operation(s) that are requested to be performed on the file, a file system can (1) identify one or more physical storage devices and/or storage media, and (2) cause the physical storage devices and/or storage media that were identified by the file system to effectuate the operation that was requested to be performed on the file associated with the identifier.

Whenever a read or a write operation is performed in the system, different software and/or hardware components may be involved. The term "Reader" can refer to a collection of software and/or hardware components in a system that are involved when a given read operation is performed in the system, and the term "Writer" can refer to a collection of software and/or hardware components in a system that are involved when a given write operation is performed in the system. Some embodiments of the methods and apparatuses for data reduction described herein can be utilized by or incorporated into one or more software and/or hardware components of a system that are involved when a given read or write operation is performed. Different Readers and Writers may utilize or incorporate different data reduction implementations. However, each Writer that utilizes or incorporates a particular data reduction implementation will correspond to a Reader that also utilizes or incorporates the same data reduction implementation. Note that some read and write operations that are performed in the system may not utilize or incorporate the data reduction apparatus. For example, when Data Distillation™ Apparatus or Data Reduction Apparatus 103 retrieves Prime Data Elements or adds new Prime Data Elements to the Prime Data Store, it can perform the read and write operations directly without data reduction.

Specifically, in FIG. 11H, Writer 150W can generally refer to a software and/or hardware component of a system that is involved when a given write operation is performed, and Reader 150R can generally refer to a software and/or hardware component of a system that is involved when a given read operation is performed. As shown in FIG. 11H, Writer 150W provides input data to the Data Distillation™ Apparatus or Data Reduction Apparatus 103, and receives Reduced Output Data 108 from Data Distillation™ Apparatus or Data Reduction Apparatus 103. Reader 150R provides retrieval requests 109 to Data Distillation™ Apparatus or Data Reduction Apparatus 103, and receives Retrieved Data Output 113 from Data Distillation™ Apparatus or Data Reduction Apparatus 103.

Implementation examples for FIG. 11H include, but are not limited to, incorporating or utilizing the Data Distillation™ Apparatus or Data Reduction Apparatus 103 in an application, operating system kernel, file system, data management module, device driver, or firmware of a flash or disk drive. This spans the variety of configurations and usages described in FIGS. 11B-F.

Figure 12A:
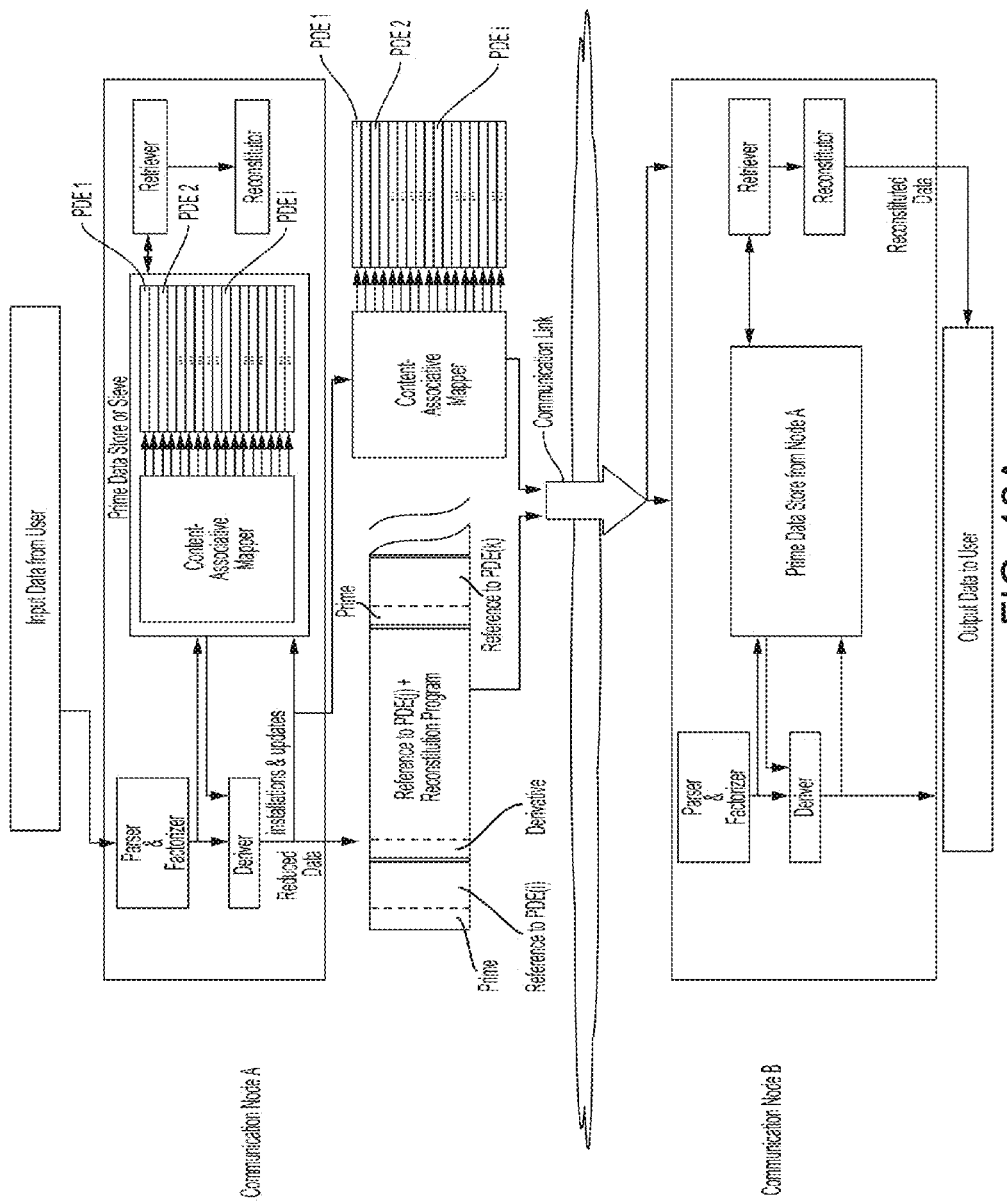
FIGS. 12A-12B show the use of the Data Distillation™ apparatus for the communication of data across a bandwidth constrained communication medium in accordance with some embodiments described herein.

FIG. 12A shows the use of the Data Distillation™ apparatus for the communication of data across a bandwidth-constrained communication medium in accordance with some embodiments described herein. In the setup shown, Communication Node A creates a set of files to be sent over to Communication Node B. Node A employs the Data Distillation™ apparatus to transform the input files into reduced files containing references to Prime Data Elements installed in a Prime Data Store, as well as Reconstitution Programs for derivative elements. Node A then sends the reduced files along with the Prime Data Store to Node B (the Prime Data Store can be sent prior to, concurrently, or after sending the reduced files; moreover, the Prime Data Store may be sent over the same communication channel or over a different communication channel than the communication channel that is used for sending the reduced files). Node B installs the Prime Data Store in a corresponding structure at its end, and subsequently feeds the reduced files through the Retriever and Reconstitutor that are resident in Node B's Data Distillation™ apparatus to yield the original set of files that were created by Node A. Thus, a more efficient use is made of the bandwidth-constrained communication medium, by employing the Data Distillation™ apparatus at both ends of the medium to send only the reduced data. Note that using Data Distillation™ enables exploiting redundancy across a larger scope (beyond what is viable using conventional techniques, such as Lempel-Ziv) so that even large files or groups of files can be transmitted efficiently.

Figure 12B:
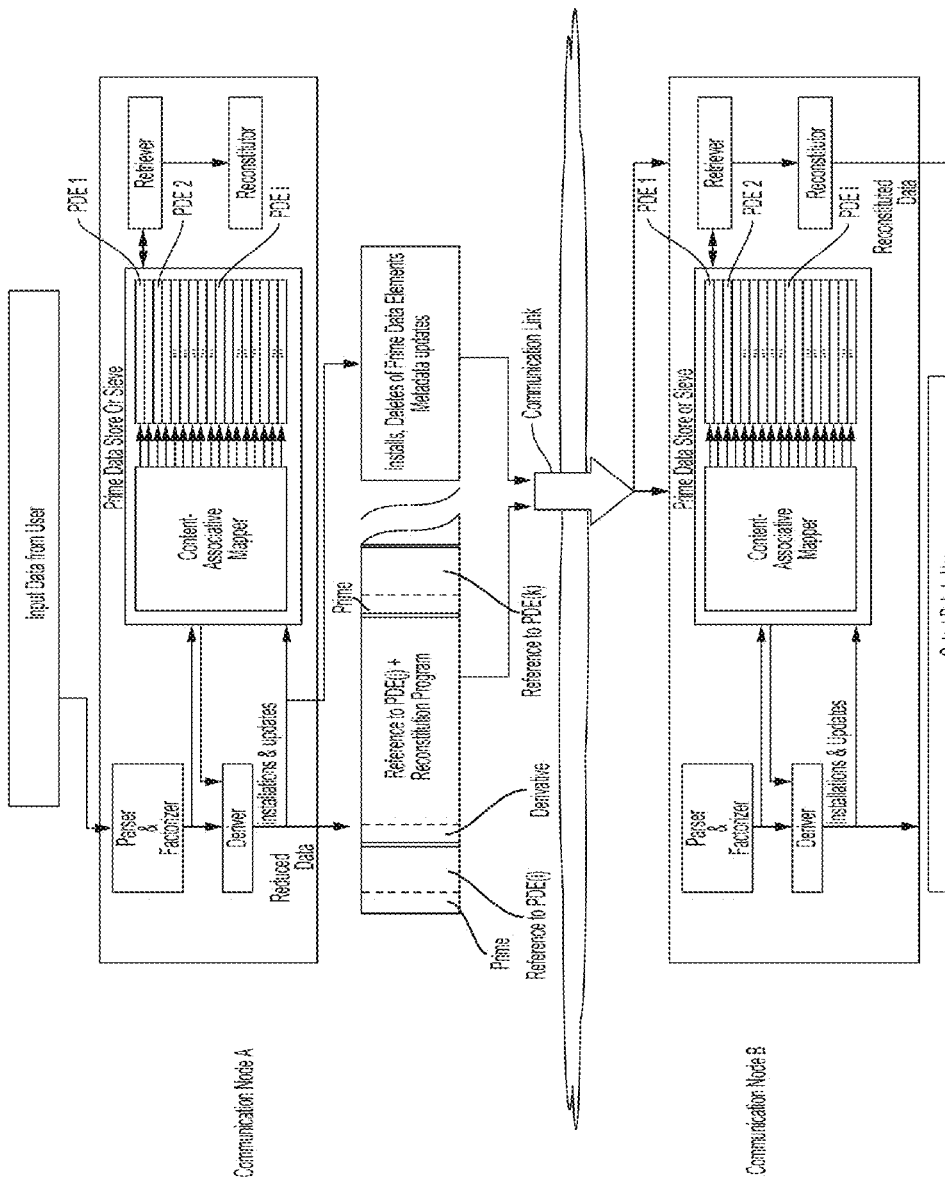

We now discuss the use of the Data Distillation™ apparatus in Wide Area Network installations where workgroups collaboratively share data that is spread across multiple nodes. When data is first created, it can be reduced and communicated as illustrated in FIG. 12A. Wide Area Networks maintain copies of the data at each site to enable fast local access to the data. Use of the Data Distillation™ apparatus can reduce the footprint at each site. In such an installation, any modifications to the data at any given site need to be communicated to all other sites, so that the Prime Data Store at each site is kept consistent. Hence, as shown in FIG. 12B, updates such as installations and deletions of Prime Data Elements, as well as metadata updates, can be communicated to the Prime Data Store at each site in accordance with some embodiments described herein. Furthermore, upon creation of fresh data, any redundancy between the fresh data and the contents of the pre-existing Prime Data Store can be exploited to reduce the fresh data. Thus, the Data Distillation™ apparatus can be used to reduce the footprint of data stored across the various sites of a Wide Area Network as well as make efficient use of the communication links of the network.

RESULTS AND CONCLUSION

Data reduction was performed on a variety of real world datasets using the embodiments described herein to determine the effectiveness of these embodiments. The real world datasets studied include the Enron Corpus of corporate email, various U.S. Government records and documents, U.S. Department of Transportation records entered into the MongoDB NOSQL database, and corporate PowerPoint presentations available to the public. Using the embodiments described herein, and factorizing the input data into variable-sized elements (with boundaries determined by fingerprinting) averaging 4 KB, an average data reduction of 3.23× was achieved across these datasets. A reduction of 3.23× implies that the size of the reduced data is equal to the size of the original data divided by 3.23×, leading to a reduced footprint with a compression ratio of 31%. Traditional data deduplication techniques were found to deliver a data reduction of 1.487× on these datasets using equivalent parameters. Using the embodiments described herein, and factorizing the input data into fixed-sized elements of 4 KB, an average data reduction of 1.86× was achieved across these datasets. Traditional data deduplication techniques were found to deliver a data reduction of 1.08× on these datasets using equivalent parameters. Hence, the Data Distillation™ solution was found to deliver significantly better data reduction than traditional data deduplication solutions.

The test runs also confirm that a small subset of the bytes of a Prime Data Element serve to order the majority of the elements in the Sieve, thus enabling a solution that requires minimal incremental storage for its operation.

The results confirm that the Data Distillation™ apparatus efficiently enables exploiting redundancy among data elements globally across the entire dataset, at a grain that is finer than the element itself. The lossless data reduction delivered by this method is achieved with an economy of IOs, employing data structures that themselves require minimal incremental storage, and using a fraction of the total computational processing power that is available on modern multicore microprocessors. Embodiments described in the preceding sections feature systems and techniques that perform lossless data reduction on large and extremely large datasets while providing high rates of data ingestion and data retrieval, and that do not suffer from the drawbacks and limitations of conventional techniques.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A non-transitory computer-readable storage medium storing instructions that, when executed by a first computer coupled to a network, cause the first computer to perform a method for communicating data, the method comprising:

identifying one or more prime data elements based on a data chunk, wherein said identifying comprises using contents of the data chunk to navigate through a data structure that organizes prime data elements based on their contents;

determining a reconstitution program based on the data chunk and the one or more prime data elements such that the data chunk can be reconstituted by applying the reconstitution program to the one or more prime data elements;

generating a losslessly reduced representation of the data chunk, wherein the losslessly reduced representation includes a reference to each prime data element in the one or more prime data elements and a description of the reconstitution program;

sending the losslessly reduced representation of the data chunk to a second computer coupled to the network; and sending the data structure that organizes the prime data elements based on their contents to the second computer, wherein the data structure is sent prior to, concurrently, or after sending the losslessly reduced representation of the data chunk.

2. The non-transitory computer-readable storage medium of claim 1, wherein the data structure organizes the prime data elements so that a content-associative search can be efficiently performed on the data structure by using the contents of the data chunk.

3. The non-transitory computer-readable storage medium of claim 1, wherein said using the contents of the data chunk to navigate through the data structure that organizes prime data elements comprises:

determining a name based on the contents of the data chunk; and navigating through the data structure by using successive portions of the name.

4. The non-transitory computer-readable storage medium of claim 1, wherein the data structure is a tree data structure, wherein navigating through the data structure comprises traversing a sequence of edges in the tree data structure, wherein each edge in the sequence of edges corresponds to a portion of a name that is determined based on the contents of the data chunk, and wherein each portion of the name that is used to navigate to a node in the tree data structure corresponds to content that is present in all prime data elements that are within a subtree rooted at the node.

5. The non-transitory computer-readable storage medium of claim 4, wherein the name is the same as the contents of the data chunk.

6. The non-transitory computer-readable storage medium of claim 4, wherein the name is a reordering of the contents of the data chunk.

7. The non-transitory computer-readable storage medium of claim 1, wherein said generating the losslessly reduced representation of the data chunk and said sending the losslessly reduced representation of the data chunk to the second computer coupled to the network is performed in response to determining that a sum of (i) sizes of references to the one or more prime data elements and (ii) a size of the description of the reconstitution program is less than a threshold fraction of a size of the data chunk; and wherein the method further comprises in response to determining that the sum of (i) the sizes of the references to the one or more prime data elements and (ii) the size of the description of the reconstitution program is greater than or equal to the threshold fraction of the size of the data chunk, adding the data chunk as a new prime data element in the data structure that organizes the prime data elements, generating a second losslessly reduced representation of the data chunk, wherein the second losslessly reduced representation includes a reference to the new prime data element, and sending the second losslessly reduced representation of the data chunk to a second computer coupled to the network.

8. The non-transitory computer-readable storage medium of claim 1, wherein the description of the reconstitution program specifies a sequence of transformations which, when applied to the one or more prime data elements, results in the data chunk.

9. The non-transitory computer-readable storage medium of claim 1, wherein the description of the reconstitution program includes a reference to a second reconstitution program stored in a reconstitution program store, wherein the second reconstitution program specifies a sequence of transformations which, when applied to the one or more prime data elements, results in the data chunk.

10. The non-transitory computer-readable storage medium of claim 1, wherein the description of the reconstitution program includes a reference to a second reconstitution program stored in a reconstitution program store and a description of a third reconstitution program which, when applied to the second reconstitution program, results in a sequence of transformations which, when applied to the one or more prime data elements, results in the data chunk.

11. The non-transitory computer-readable storage medium of claim 1, the method further comprising factorizing input data into fixed-sized data chunks.

12. The non-transitory computer-readable storage medium of claim 1, the method further comprising factorizing input data into variable-sized data chunks.

13. The non-transitory computer-readable storage medium of claim 12, wherein boundaries of the variable-sized data chunks are determined by applying a fingerprinting process to the input data.

14. The non-transitory computer-readable storage medium of claim 1, wherein the method further comprises:

performing a modification to the data structure that organizes prime data elements based on their contents; and sending a description of the modification to the second computer, thereby enabling the second computer to perform a corresponding modification to a copy of the data structure that organizes prime data elements based on their contents that is stored locally at the second computer.

15. A method for communicating data, comprising:

a first computer identifying one or more prime data elements based on a data chunk, wherein said identifying comprises using contents of the data chunk to navigate through a data structure that organizes prime data elements based on their contents;

the first computer determining a reconstitution program based on the data chunk and the one or more prime data elements such that the data chunk can be reconstituted by applying the reconstitution program to the one or more prime data elements;

the first computer generating a losslessly reduced representation of the data chunk, wherein the losslessly reduced representation includes a reference to each prime data element in the one or more prime data elements and a description of the reconstitution program;

the first computer sending the losslessly reduced representation of the data chunk to a second computer; and the first computer sending the data structure that organizes prime data elements based on their contents to the second computer, wherein the data structure is sent prior to, concurrently, or after sending the losslessly reduced representation of the data chunk.

16. The method of claim 15, wherein the data structure is a tree data structure, wherein navigating through the data structure comprises traversing a sequence of edges in the tree data structure, wherein each edge in the sequence of edges corresponds to a portion of a name that is determined based on the contents of the data chunk, and wherein each portion of the name that is used to navigate to a node in the tree data structure corresponds to content that is present in all prime data elements that are within a subtree rooted at the node.

17. The method of claim 16, wherein the name is the same as the contents of the data chunk.

18. The method of claim 16, wherein the name is a reordering of the contents of the data chunk.

19. The method of claim 15, further comprising:
the second computer locally installing the data structure that organizes prime data elements based on their contents;
the second computer receiving the losslessly reduced representation of the data chunk from the first computer, wherein the losslessly reduced representation includes references to the one or more prime data elements and the description of the reconstitution program;
the second computer retrieving the one or more prime data elements from the data structure based on the references to the one or more prime data elements; and
the second computer generating the data chunk by applying the reconstitution program to the one or more prime data elements.

20. A system, comprising:
a set of computing nodes coupled to a network, wherein each computing node maintains a local copy of a data structure that organizes prime data elements based on their contents; and
wherein each computing node in the set of computing nodes includes a processor and a non-transitory computer-readable storage medium storing instructions that, when executed by the processor, cause the computing node to:
receive a request to send input data to another computing node;
factorize the input data into a set of data chunks; and
for at least one data chunk in the set of data chunks:
identify one or more prime data elements based on the data chunk, wherein said identifying comprises using contents of the data chunk to navigate through the local copy of the data structure that organizes prime data elements based on their contents;
determine a reconstitution program based on the data chunk and the one or more prime data elements such that the data chunk can be reconstituted by applying the reconstitution program to the one or more prime data elements;
generate a losslessly reduced representation of the data chunk, wherein the losslessly reduced representation includes a reference to each prime data element in the one or more prime data elements and a description of the reconstitution program; and
send the losslessly reduced representation of the data chunk to the other computing node.

21. The method of claim 15, wherein said generating the losslessly reduced representation of the data chunk and said sending the losslessly reduced representation of the data chunk to the second computer coupled to the network is performed in response to determining that a sum of (i) sizes of references to the one or more prime data elements and (ii) a size of the description of the reconstitution program is less than a threshold fraction of a size of the data chunk; and
wherein the method further comprises in response to determining that the sum of (i) the sizes of the references to the one or more prime data elements and (ii) the size of the description of the reconstitution program is greater than or equal to the threshold fraction of the size of the data chunk,
adding the data chunk as a new prime data element in the data structure that organizes the prime data elements,
generating a second losslessly reduced representation of the data chunk, wherein the second losslessly reduced representation includes a reference to the new prime data element, and
sending the second losslessly reduced representation of the data chunk to a second computer coupled to the network.

22. The method of claim 15, wherein the description of the reconstitution program includes one of:
a sequence of transformations which, when applied to the one or more prime data elements, results in the data chunk,
a reference to a second reconstitution program stored in a reconstitution program store, wherein the second reconstitution program specifies a sequence of transformations which, when applied to the one or more prime data elements, results in the data chunk, or
a reference to a second reconstitution program stored in a reconstitution program store and a description of a third reconstitution program which, when applied to the second reconstitution program, results in a sequence of transformations which, when applied to the one or more prime data elements, results in the data chunk.

23. The system of claim 20, wherein the local copy of the data structure is a tree data structure, wherein navigating through the local copy of the data structure comprises traversing a sequence of edges in the tree data structure, wherein each edge in the sequence of edges corresponds to a portion of a name that is determined based on the contents of the data chunk, and wherein each portion of the name that is used to navigate to a node in the tree data structure corresponds to content that is present in all prime data elements that are within a subtree rooted at the node.

24. The system of claim 20, wherein said generating the losslessly reduced representation of the data chunk and said sending the losslessly reduced representation of the data chunk to the second computer coupled to the network is performed in response to determining that a sum of (i) sizes of references to the one or more prime data elements and (ii) a size of the description of the reconstitution program is less than a threshold fraction of a size of the data chunk; and
wherein the method further comprises in response to determining that the sum of (i) the sizes of the references to the one or more prime data elements and (ii) the size of the description of the reconstitution program is greater than or equal to the threshold fraction of the size of the data chunk,
adding the data chunk as a new prime data element in the data structure that organizes the prime data elements,
generating a second losslessly reduced representation of the data chunk, wherein the second losslessly reduced representation includes a reference to the new prime data element, and sending the second losslessly reduced representation of the data chunk to a second computer coupled to the network.

25. The system of claim 20, wherein the description of the reconstitution program includes one of:
- a sequence of transformations which, when applied to the one or more prime data elements, results in the data chunk,
- a reference to a second reconstitution program stored in a reconstitution program store, wherein the second reconstitution program specifies a sequence of transformations which, when applied to the one or more prime data elements, results in the data chunk, or
- a reference to a second reconstitution program stored in a reconstitution program store and a description of a third reconstitution program which, when applied to the second reconstitution program, results in a sequence of transformations which, when applied to the one or more prime data elements, results in the data chunk.

* * * * *